United States Patent
Isobe

(10) Patent No.: US 9,865,588 B2
(45) Date of Patent: Jan. 9, 2018

(54) SEMICONDUCTOR DEVICE AND ELECTRONIC DEVICE

(71) Applicant: Semiconductor Energy Laboratory Co., Ltd., Kanagawa-ken (JP)

(72) Inventor: Atsuo Isobe, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 138 days.

(21) Appl. No.: 14/724,398

(22) Filed: May 28, 2015

(65) Prior Publication Data

US 2015/0348961 A1   Dec. 3, 2015

(30) Foreign Application Priority Data

May 30, 2014 (JP) .................................. 2014-113036

(51) Int. Cl.
*H01L 27/02* (2006.01)
*H01L 27/12* (2006.01)
*H01L 23/60* (2006.01)

(52) U.S. Cl.
CPC .......... *H01L 27/0266* (2013.01); *H01L 23/60* (2013.01); *H01L 27/0288* (2013.01);
(Continued)

(58) Field of Classification Search
CPC ............. H01L 27/0266; H01L 27/0255; H01L 27/0288
See application file for complete search history.

(56) References Cited

U.S. PATENT DOCUMENTS 5,034,629 A * 7/1991 Kinugasa ......... H03K 19/00361
                                                    326/121
5,731,856 A    3/1998 Kim et al.
(Continued)

FOREIGN PATENT DOCUMENTS

EP   1737044 A   12/2006
EP   2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Scott Bauer
(74) *Attorney, Agent, or Firm* — Husch Blackwell LLP

(57) ABSTRACT

A semiconductor device that is hardly broken is provided. Alternatively, a semiconductor device having high reliability is provided. The semiconductor device includes a first circuit, a second circuit, a first wiring, a second wiring, and a third wiring. The second circuit has a function of protecting the first circuit. The second circuit includes a first transistor including an oxide semiconductor film. The first wiring is electrically connected to the first circuit through the second circuit. The first wiring is electrically connected to the first circuit through the second circuit. The first wiring has a function of inputting a signal. The second wiring is electrically connected to the first circuit. The second wiring is electrically connected to one of a source electrode and a drain electrode of the first transistor. The third wiring is electrically connected to a gate electrode of the first transistor included in the second circuit.

16 Claims, 36 Drawing Sheets

(52) U.S. Cl.
CPC ...... *H01L 27/1207* (2013.01); *H01L 27/1225* (2013.01); *H01L 2924/0002* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,426,665 B2 | 7/2002 | Morishita | |
| 6,563,174 B2 | 5/2003 | Kawasaki et al. | |
| 6,670,678 B2 | 12/2003 | Kojima | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,941,958 B2 | 1/2015 | Tomatsu | |
| 8,995,174 B2 | 3/2015 | Koyama | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0091870 A1* | 4/2009 | Huang ............... H02H 9/046 361/56 |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0049189 A1* | 3/2012 | Sasaki ............... H01L 29/78603 257/52 |
| 2013/0314074 A1 | 11/2013 | Takahashi et al. | |
| 2014/0025978 A1 | 1/2014 | Tokunaga | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-050698 | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-258200 | 9/2003 |
| JP | 2004-103957 A | 4/2004 |
| JP | 2004-273614 A | 9/2004 |
| JP | 2004-273732 A | 9/2004 |
| JP | 2012-256859 | 12/2012 |
| JP | 2012-257187 | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IWD '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

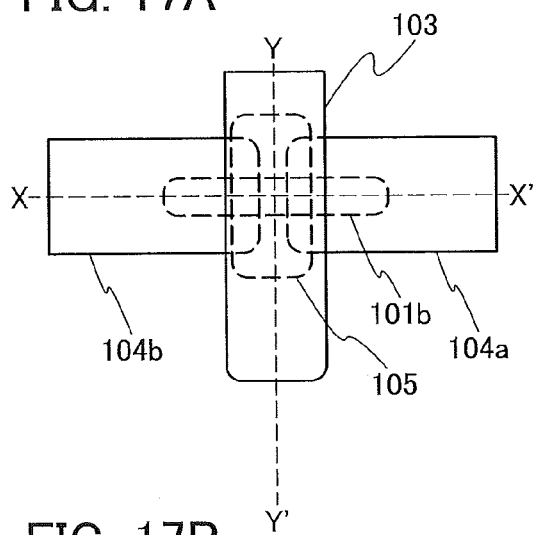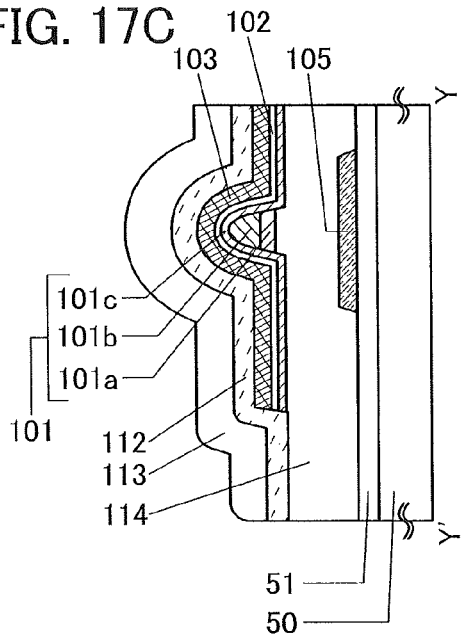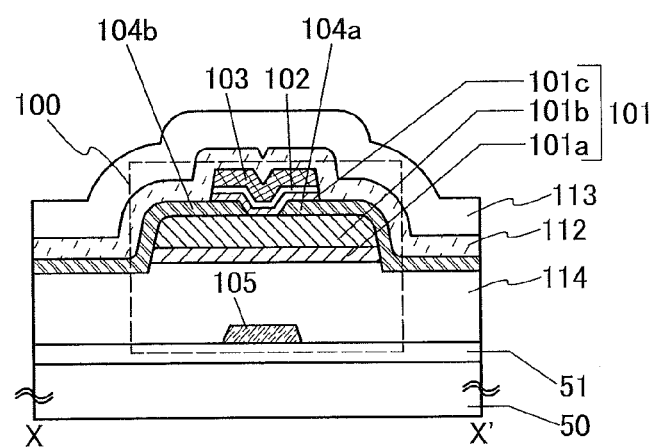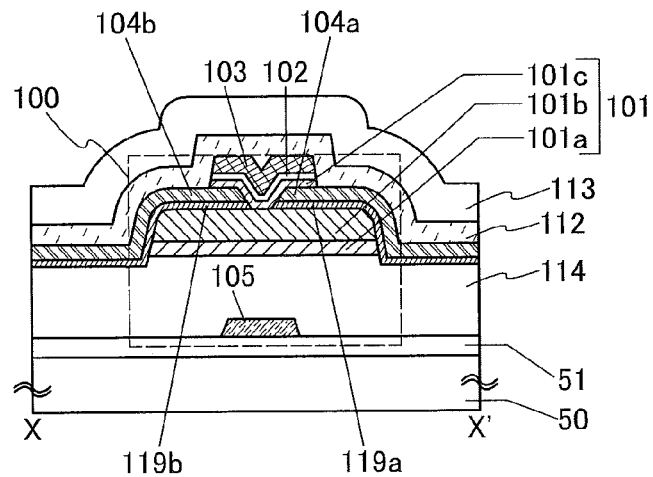

SEMICONDUCTOR DEVICE AND ELECTRONIC DEVICE

BACKGROUND OF THE INVENTION

1. Field of the Invention

The present invention relates to an object, a method, or a manufacturing method. In addition, the present invention relates to a process, a machine, a manufacture, or a composition of matter. Another embodiment of the present invention relates to a semiconductor device, a display device, a lighting device, a power storage device, a memory device, or a driving method or manufacturing method thereof. Specifically, one embodiment of the present invention relates to a semiconductor device provided with a means of preventing a circuit from being damaged by unexpected high-voltage application such as electrostatic discharge.

In this specification and the like, a semiconductor device generally means a device that can function by utilizing semiconductor characteristics. A transistor and a semiconductor circuit are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

2. Description of the Related Art

In a semiconductor circuit used in a semiconductor device, a semiconductor element, an electrode, or the like could be damaged by electrostatic discharge (hereinafter referred to as "ESD"). As a measure to prevent damage of a semiconductor circuit due to ESD, a protection circuit is connected to a semiconductor circuit in many cases. A protection circuit refers to a circuit for preventing overvoltage applied to a terminal, a wiring, or the like from being supplied to a semiconductor circuit. A resistor, a diode, a transistor, and a capacitor are typically used in the protection circuit.

Patent Document 1 discloses an example of a protection circuit including an oxide semiconductor film. The protection circuit including an oxide semiconductor film is known to have an extremely low leakage current in an off state. Therefore, leakage current of the protection circuit can be reduced.

Patent Document 2 discloses an example in which a so-called grounded gate (GG)-type NMOS transistor is used for a protection circuit. The GG-type NMOS transistor is characterized in that a snapback phenomenon occurs when a parasitic bipolar transistor conducts electricity. In addition, Patent Document 2 discloses that a region where a snapback phenomenon is observed in the current-voltage characteristics of the transistor has a negative resistance.

Patent Document 3 discloses an example of a protection circuit utilizing a snapback phenomenon of a transistor. Patent Document 3 discloses that current flows in both directions of a transistor by utilizing snapback phenomenon.

Patent Document 4 discloses, for example, a CPU with low power consumption, which is achieved by an extremely low leakage current of a transistor including an oxide semiconductor film in an off state.

Patent Document

[Patent Document 1] Japanese Published Patent Application No. 2012-256859

[Patent Document 2] Japanese Published Patent Application No. 2003-258200

[Patent Document 3] Japanese Published Patent Application No. 2002-50698

[Patent Document 4] Japanese Published Patent Application No. 2012-257187

SUMMARY OF THE INVENTION

With the progress of miniaturization and integration of a semiconductor device, it is desired to reduce the area of a protection circuit. However, miniaturization of an element used in the protection circuit may lower the surge immunity and thereby the protection circuit itself may break in some cases.

An element (a diode, a transistor, etc.) using silicon, which is a typical semiconductor material, has a relatively large leak current in an off state. Therefore, in the case where a protection circuit including such an element is connected between a wiring (e.g., a signal line) connected to a semiconductor circuit and a power supply line, a leak current may flow between the wirings to change the potentials of the wirings or the power supply potential, causing unstable operation of the semiconductor device.

Thus, an object of one embodiment of the present invention is to provide a semiconductor device that is hardly broken. Another object of one embodiment of the present invention is to provide a semiconductor device that occupies a small area. Another object is to provide a semiconductor device with low power consumption. Further, another object is to provide a semiconductor device with small leak current.

Another object is to provide a highly reliable semiconductor device. Another object is to provide a semiconductor device which can operate at high speed. Another object is to provide a semiconductor device with excellent characteristics. Another object is to provide a novel semiconductor device. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first circuit, a second circuit, a first wiring, a second wiring, and a third wiring. The first circuit includes a plurality of transistors. The second circuit has a function of protecting the first circuit. The second circuit includes a first transistor. The first wiring is electrically connected to the first circuit through the second circuit. The first wiring has a function of inputting a signal. The second wiring is electrically connected to the first circuit. The second wiring is electrically connected to one of a source electrode and a drain electrode of the first transistor. The third wiring is electrically connected to a gate electrode of the first transistor. The first transistor includes an oxide semiconductor film. Here, the expression "a first wiring is electrically connected to a first circuit through a second circuit" indicates that "a first wiring is connected to a first element included in a second circuit, and the first element is connected to the first circuit", for example. In addition, the expression indicates that the first circuit is operated by a signal input from the first wiring, for example. Here, the expression "the first circuit is protected" indicates that the first circuit is protected from high voltage. Alternatively, the expression indicates that the first circuit is protected from ESD, or the like.

One embodiment of the present invention is a semiconductor device including a first circuit, a second circuit, a first wiring, a second wiring, a third wiring, and a fourth wiring. The first circuit includes a plurality of transistors. The second circuit has a function of protecting the first circuit. The second circuit includes a first transistor, a first diode, a second diode, and a first resistor. The first wiring is electrically connected to the first circuit through the second circuit. The first wiring has a function of inputting a signal. The second wiring is electrically connected to the first circuit. The second wiring is electrically connected to one of a source electrode and a drain electrode of the first transistor. The third wiring is electrically connected to a gate electrode of the first transistor. The fourth wiring is electrically connected to the other of the source electrode and the drain electrode of the first transistor. The first transistor includes an oxide semiconductor film.

One embodiment of the present invention is a semiconductor device including a first circuit, a second circuit, a first wiring, a second wiring, a third wiring, and a fourth wiring. The first circuit includes a plurality of transistors. The second circuit has a function of protecting the first circuit. The second circuit includes a first transistor, a second transistor, a third transistor, and a fourth transistor. The first wiring is electrically connected to the first circuit through the second circuit. The first wiring has a function of inputting a signal. The second wiring is electrically connected to the first circuit. The third wiring is electrically connected to a gate electrode of a first transistor included in the second circuit. One of a source electrode and a drain electrode of the first transistor is electrically connected to the second wiring. The other of the source electrode and the drain electrode of the first transistor is electrically connected to the fourth wiring. One of a source electrode and a drain electrode of the second transistor is electrically connected to the second wiring. The other of the source electrode and the drain electrode of the second transistor is electrically connected to the first wiring. One of the source electrode and the drain electrode of the third transistor is electrically connected to the first wiring. The other of the source electrode and the drain electrode of the third transistor is electrically connected to the fourth wiring. One of a source electrode and a drain electrode of the fourth transistor is electrically connected to the first wiring. The other of the source electrode and the drain electrode of the fourth transistor is electrically connected to the first circuit. The first to fourth transistors include oxide semiconductor films. In the above structure, the fourth transistor preferably have a high resistance as compared with the first to the third transistors in the case where a signal is not input to each of gate electrodes of the first to fourth transistors.

In the above structure, the first wiring is preferably a signal line for inputting a signal to a semiconductor circuit, the second wiring is preferably a high potential power supply line, and the fourth wiring is preferably a low potential power supply line or a ground potential power supply line.

In the above structure, the first to third transistors each include a plurality of island-shaped oxide semiconductor layers, a first gate insulating film, and a first gate electrode. Side surfaces and top surfaces of the plurality of island-shaped oxide semiconductor layers included in the first to the third transistors are covered with the first gate insulating film. The first gate electrode faces each of the side surfaces and top surfaces of the plurality of island-shaped oxide semiconductor layers included in the first to third transistors with the first gate insulating film provided therebetween. In the above structure, island-shaped semiconductor layers preferably include a first oxide layer, a second oxide layer in contact with at least part of a top surface of the first oxide layer, and a third oxide layer in contact with at least part of a top surface of the second oxide layer. The electron affinity of the second oxide layer is preferably larger than the electron affinity of the first oxide layer and the third oxide layer.

One embodiment of the present invention is an electronic device including the semiconductor device according to any one of the above embodiments, a housing, a microphone, a speaker, an operation key, or a lens.

In one embodiment of the present invention, a semiconductor device that is hardly broken can be provided. Furthermore, a semiconductor device that occupies a small area can be provided. Furthermore, a semiconductor device with low power consumption can be provided. Furthermore, a semiconductor device with a low leakage current can be provided.

A semiconductor device having high reliability can be provided. Furthermore, a semiconductor device which can operate at high speed can be provided. Furthermore, a semiconductor device with excellent characteristics can be provided. Furthermore, a novel semiconductor device can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 17A to 17D each illustrate a transistor of one embodiment of the present invention.

DETAILED DESCRIPTION OF THE INVENTION

Figure 1:
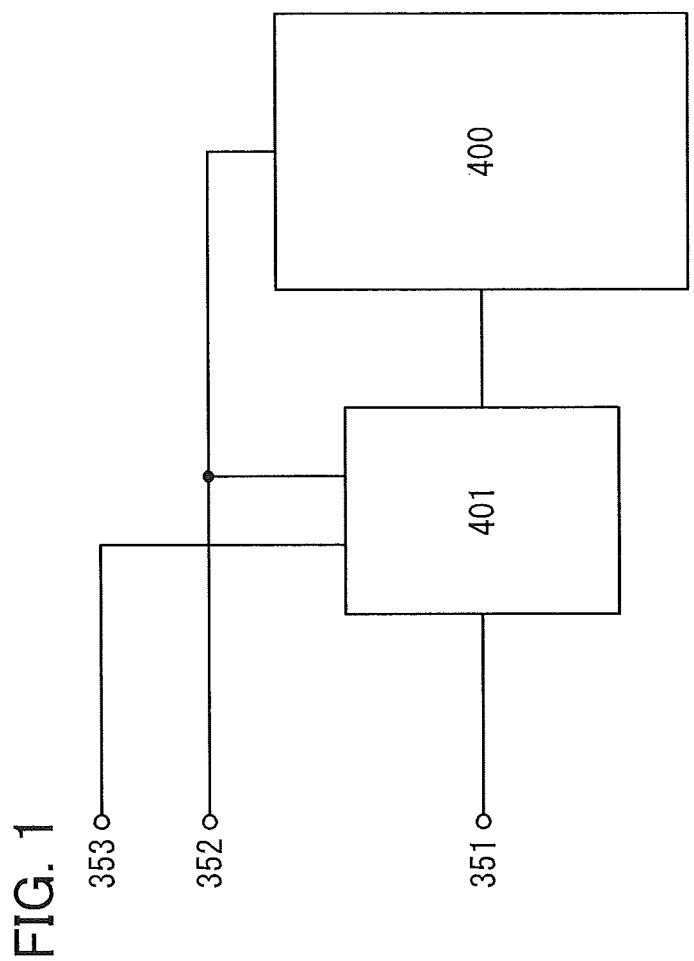
FIG. 1 is a circuit diagram of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a semiconductor element which can be used in a protection circuit of one embodiment of the present invention.

[Semiconductor Element]

To prevent a large amount of current due to ESD from flowing in an integrated circuit, a protection circuit is preferably provided between an input portion of the integrated circuit (i.e., an external terminal) and the integrated circuit, and a path for discharging a large current is preferably provided in the protection circuit. In some cases, a large current flows in a short time due to ESD. In that case, for example, when the discharge path has high resistance, current flows in another path such as an integrated circuit portion, which might result in breakdown of elements in a circuit. Thus, the path for discharging current due to ESD preferably has lower resistance than that of a path connected from an external terminal to an inside of the integrated circuit.

Here, the external terminal is an input portion to a wiring through which an input signal from the outside is transmitted to the integrated circuit, for example. Alternatively, the external terminal is an input portion through which a signal from an adjacent circuit is transmitted.

Resistance of the semiconductor element of one embodiment of the present invention preferably varies according to a voltage between terminals. For example, when no voltage or low voltage is applied between terminals, the semiconductor element has preferably high resistance; when a voltage equal to higher than a certain voltage is applied between terminals, e.g., in the case where ESD is applied between terminals, the semiconductor element preferably has lower resistance. That is, the semiconductor element of one embodiment of the present invention is an element which has low resistance when a voltage equal to higher than a certain voltage is applied, i.e., an element with variable resistance. Alternatively, the semiconductor element of one embodiment of the present invention has high resistance when voltage is not applied, and has low voltage when voltage is applied. Alternatively, the semiconductor element of one embodiment of the present invention is preferably an element which has lower resistance as applied voltage is higher. Here, the description "high voltage is applied" means that, for example, a voltage higher than or equal to 100V, a voltage higher than or equal to 1 kV, or a voltage higher than or equal to 10 kV is instantaneously applied. Alternatively, the description means that a voltage higher than or equal to 0.5V, a voltage or higher than or equal to 1V, a voltage higher than or equal to 3V, or a voltage higher than or equal to 5V is constantly applied.

Here, FIG. 1 illustrates an integrated circuit 400 and a protection circuit 401 which is connected to the integrated circuit 400 and protects the integrated circuit 400 from ESD. The protection circuit 401 includes a semiconductor element of one embodiment of the present invention. In addition, a wiring 351 is connected to the integrated circuit 400 through the protection circuit 401. The wiring 351 can be a signal line having a function of supplying a signal to the integrated circuit 400, for example. Furthermore, a wiring 352 is connected to the integrated circuit 400 and the protection circuit 401. For simplicity, the wiring 352 illustrated here is one wiring, but there may be a plurality of wirings which are connected to the integrated circuit 400 and the protection circuit 401 as the wiring 352 is. In addition, a wiring 353 is connected to the protection circuit 401. There may be also a plurality of wirings which are connected to the protection circuit 401 as the wiring 353 is. The wiring 352 and the wiring 353 can each be a wiring having a function of supplying a power supply potential or a wiring having a function of supplying a signal, for example.

For example, in this specification and the like, an explicit description "X and Y are connected" means that X and Y are electrically connected, X and Y are functionally connected, or X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. Note that, for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes an electrical path through the transistor, a drain (or a second terminal or the like) of the transistor is electrically connected to Y through at least Z2 on a third connection path, and the third electrical path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

[Transistor]

The protection circuit 401 includes the semiconductor element of one embodiment of the present invention. An example where a transistor, more specifically a field-effect transistor is used as the semiconductor element of one embodiment of the present invention is described below.

First the case is considered in which, to neither the integrated circuit 400 nor the protection circuit 401, a signal from an external terminal (including a power supply or the like) is input or ESD is applied. Here, the integrated circuit 400 is not operated, i.e., the integrated circuit 400 is in a standby state. At this time, current preferably does not flow through the transistor included in the protection circuit 401, for example. That is, the transistor included in the protection circuit 401 has preferably high resistance. By the high resistance of the transistor, a leakage current into the protection circuit 401 is reduced when the integrated circuit 400 is in a standby state. For example, when a leakage current into the protection circuit 401 is reduced, loss of charges stored in a capacitor or the like included in the integrated circuit 400 can be suppressed in some cases.

Next, the case is considered in which a high voltage caused by ESD is applied between a drain and a source of the transistor in the protection circuit 401. Here, the transistor is a path for discharging a large current due to ESD. When no voltage or a low voltage is applied between the drain and the source, the transistor has preferably high resistance; when a voltage equal to higher than a certain voltage is applied between the drain and the source, e.g., when a high voltage caused by ESD is applied between the drain and the source, the resistance of the transistor is preferably lowered.

Resistance between the drain and the source depends on the channel length of the transistor and intensity of a gate electric field with respect to the semiconductor layer. For example, reduction in the channel length of the transistor reduces resistance.

When the channel length of the transistor is short, punch-through occurs. Punch-through remarkably occurs as the drain-source voltage gets higher.

As is known in the field of a general transistor including silicon, punch-through can be suppressed by intensifying a gate electric field, for example. For example, as a method for intensifying the gate electric field, thinning a gate insulating film, increasing a gate voltage, using a three-dimensional structured transistor, or the like can be given. Using a three-dimensional structured transistor is described in Embodiment 2.

Here, for example, punch-through is utilized by weakening a gate electric field of the transistor, so that resistance between the drain and the source of the transistor can be decreased. Thus, a large current can flow between the drain and the source for a short time. Therefore, this structure is preferable because a current generated when a voltage due to ESD is applied between the drain and the source can be discharged to the transistor, for example. In addition, since punch-through remarkably occurs as the drain-source voltage is higher, the discharging is facilitated as the applied voltage increases. That is, the transistor in which a large current flows by using punch-through can serve as an excellent discharge path for application of a high voltage caused by ESD or the like.

The transistor of the protection circuit in one embodiment of the present invention which is used in the path for discharging a large current due to ESD preferably has a weaker gate electric field with respect to the semiconductor layer than that of the transistor used for the integrated circuit or the like. In addition, when no voltage is applied to the gate electrode, the transistor used in the path for discharging a large current preferably has lower resistance than that of the transistor used in the integrated circuit.

The protection circuit 401 preferably protects the integrated circuit 400 from ESD when the entire circuit is in a standby state. That is, it is preferred that a large current due to ESD can be discharged to the discharge path in the protection circuit 401 when a signal from the outside is not input thereto. Here, the entire circuit refers to a circuit including the integrated circuit 400 and the protection circuit 401. Furthermore, the entire circuit may include a circuit adjacent to the integrated circuit 400 and the protection circuit 401.

In the protection circuit 401, the transistor used in a path for discharging a large current due to ESD preferably discharges a large current in the state where a gate voltage is not input from the outside. For example, in the protection circuit 401, it is preferable that the transistor used in the path for discharging a large current due to ESD preferably discharges a large current to the discharge path illustrated in FIG. 4, FIG. 5, FIG. 7, and FIG. 8 described later without a signal input from the outside.

Note that the transistor is affected by the gate electric field even when the gate voltage is not input from the outside. For example, an electric field due to a difference in work functions between the semiconductor layer and the gate electrode, and the electric field due to charge in the gate insulating film are generated in some cases.

Here, a conventional diode which is used in a protection circuit is described. A diode has a rectifying property. Little current flows when a reverse bias voltage, derived from a high voltage caused by ESD, is applied to the diode. Thus, when a reverse bias voltage is applied, the diode does not serve as discharge path of ESD. Thus, it is necessary to provide a discharge path in another path. A discharge path when the diode is used in the protection circuit is described in FIG. 4 and FIG. 5 that are described later. In contrast, when voltage is not applied to the gate, the transistor in one embodiment of the present invention can discharge current in each of the case where a positive voltage is applied between the drain and the source and the case where a negative voltage is. Thus, current can flow in both directions. Therefore, the transistor in one embodiment of the present invention can serve as a discharge path even when a high voltage caused by ESD is applied in either direction.

Furthermore, as the semiconductor element included in the protection circuit, the transistor in one embodiment of the present invention can be used instead of a conventional GG-type NMOS transistor in some cases. A parasitic bipolar transistor formed on the substrate side is brought into conduction state, whereby the GG-type NMOS transistor is operated. For example, the parasitic bipolar is unlikely to be formed in a silicon on insulator (SOI) device; thus, it is difficult to use GG-type NMOS transistor effectively in some cases. The protection circuit of one embodiment of the present invention can be used for the SOI device. Furthermore, the protection circuit of one embodiment of the present invention can be stacked over an integrated circuit when the integrated circuit is formed using a silicon substrate or the like, for example. Stacking the protection circuit and the integrated circuit makes it possible to reduce the circuit area.

Next, a state were the integrated circuit 400 is operated, that is, a state where a signal from the external terminal is input to the integrated circuit 400 and the protection circuit 401 is considered. If current flows to the discharge path in the protection circuit 401 during operation of the integrated circuit 400, power consumption of the entire circuit will be increased. Therefore, the resistance of the discharge path in the protection circuit against the input from the external terminal is preferably high when the integrated circuit 400 is operated. For example, in the case where an n-channel transistor is used in the discharge path in the protection circuit, a negative voltage is preferably applied between the gate and the source to turn off the n-channel transistor so that the amount of current flowing between the drain and the source is reduced. For example, it is preferable that the wiring 353 be electrically connected to the gate electrode of the transistor, and input a potential that turns off the transistor.

Here, in the case of an n-channel transistor, for example, an off state of a transistor refers to a state where the gate voltage is sufficiently lower than the threshold voltage. Specifically, the gate voltage is preferably lower than the threshold voltage, more preferably lower than the threshold voltage by 1V or more, 2V or more, or 3V or more.

The semiconductor element of one embodiment of the present invention preferably includes any of the following: semiconductor materials such as silicon, germanium, gallium, and arsenic; compound semiconductor materials containing silicon, germanium, gallium, arsenic, or aluminum; organic semiconductor materials; and oxide semiconductor materials. It is more preferable that an oxide semiconductor material be used.

When the transistor includes an oxide semiconductor film, the transistor can have extremely low off-state current.

Furthermore, a transistor including an oxide semiconductor film is an accumulation-type transistor in which electrons are majority carriers. Therefore, drain-induced barrier lowering (DIBL) as a short-channel effect is less likely to occur than in an inversion-type transistor having a pn junction.

The transistor including an oxide semiconductor film can have a thicker gate insulating film than a conventional transistor including silicon or the like. For example, a minute transistor having channel length of 50 nm or less can have a gate insulating film with a thickness of approximately 10 nm. Here, breakdown of the gate insulating film can be suppressed by thickening the gate insulating film even in the case where high voltage caused by ESD is applied between the gate and the source of the transistor.

Furthermore, when the gate insulating film is thick, parasitic capacitance can be small.

Since the transistor including an oxide semiconductor film has high resistance to short-channel effects, favorable on-off characteristics can be obtained even when the gate insulating with a thickness of approximately 10 nm is used. Thus, the gate insulating film with a uniform thickness can be used for the integrated circuit which is required to operate at high speed and that of the protection circuit portion which requires high withstand voltage. When the gate insulating film has the same thickness both in the integrated circuit and the protection circuit portion, the process for manufacturing the gate insulating film can be simplified. Alternatively, the gate insulating film of the protection circuit portion that requires high withstand voltage may be formed to be thicker than that of the integrated circuit.

The reliability of the conventional transistor including silicon or the like is decreased by generation of hot carrier when the drain voltage is increased. Generation of hot carriers leads to avalanche breakdown, which causes reduction in reliability of the transistor. In contrast, avalanche breakdown or the like is less likely to occur in some cases of transistors including an oxide semiconductor film than in cases of conventional transistors including silicon or the like, because, for example, an oxide semiconductor has a wide bandgap (e.g., an oxide semiconductor containing indium, gallium, and zinc has a bandgap of 2.5 eV or more) and thus electrons are less likely to be excited, and the effective mass of a hole is large. Therefore, it may be possible to inhibit degradation due to avalanche breakdown, for example.

Since avalanche breakdown is less likely to occur, the transistor including an oxide semiconductor can be driven at a higher drain voltage than a conventional transistor formed using silicon or the like, for example. That is, the withstand voltage between the drain and the source is high. Thus, the reliability of the transistor in a circuit supplied with high voltage can be increased, and the channel length can be reduced, so that the integration degree of the circuit can be increased.

Furthermore, since the withstand voltage between the drain and the source is high, the transistor including an oxide semiconductor can withstand a voltage applied by ESD even when the transistor has short channel length, for example.

Next, an example of a circuit including the transistor of one embodiment of the present invention is shown below.

Example of Circuit: 1

Figure 2:
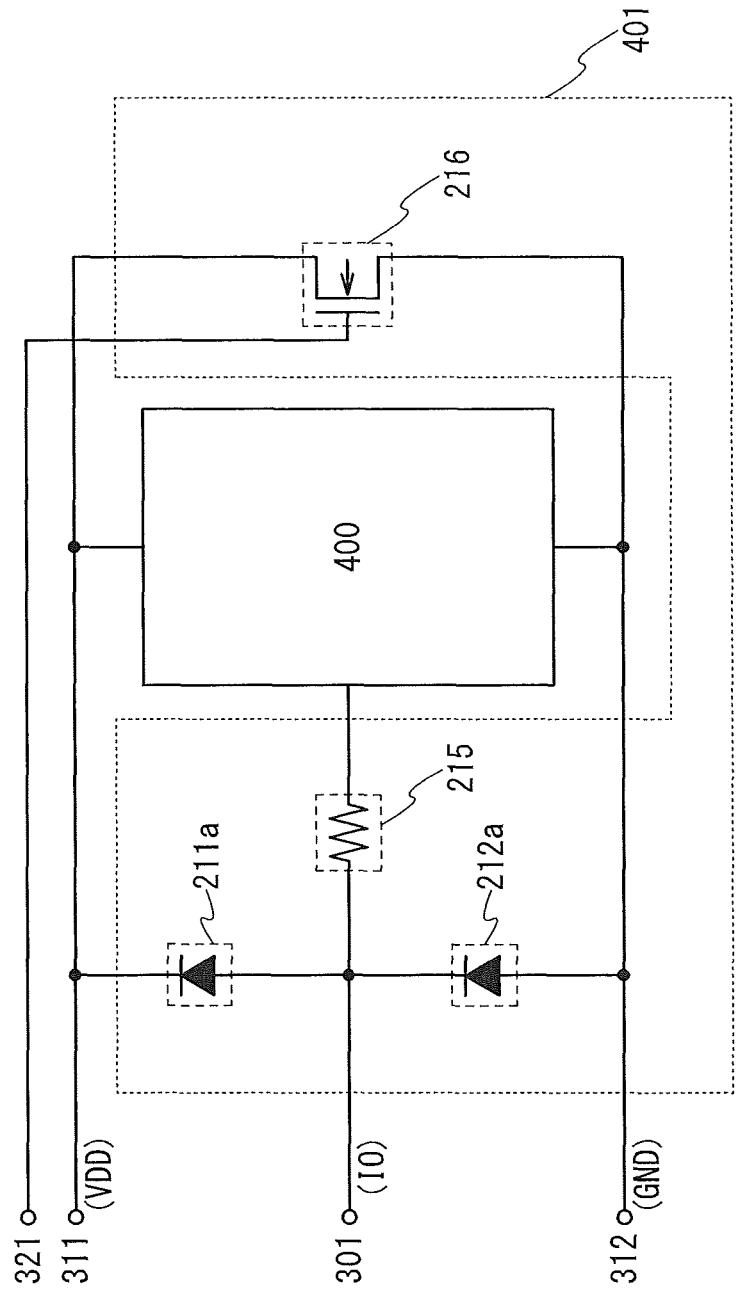
FIG. 2 is a circuit diagram of one embodiment of the present invention.

FIG. 2 illustrates a circuit diagram of one embodiment of the present invention. The circuit shown in FIG. 2 includes the protection circuit 401 and the integrated circuit 400. The protection circuit 401 includes semiconductor elements 211a, 212a, 215, and 216. A first wiring 301 is electrically connected to the integrated circuit 400 via the semiconductor element 215. The first wiring 301 is electrically connected to one terminal of the semiconductor element 211a and to one terminal of the semiconductor element 212a. A second wiring 311 is electrically connected to the integrated circuit 400, the semiconductor elements 211a and 216. A third wiring 312 is electrically connected to the integrated circuit 400, the semiconductor element 212a, and the semiconductor element 216. In addition, a fourth wiring 321 is electrically connected to the semiconductor element 216.

The first wiring 301 can serve as a signal line through which a signal is input to the integrated circuit 400 via the semiconductor element 215, the second wiring 311 can serve as a high-potential power supply line (VDD), and the third wiring 312 can serve as a low-potential power supply line (VSS) or a ground potential line (GND).

The semiconductor element 215 is a resistor. The semiconductor elements 211a and 212a are diodes.

For the semiconductor element 216, the transistor of one embodiment of the present invention can be used. Here, the fourth wiring 321 is electrically connected to a gate electrode of the semiconductor element 216. The semiconductor element 216 preferably has low resistance in the case where high voltage is applied between the drain and the source when voltage is not applied to the gate electrode, that is, when a signal is not input to the wiring 321. Here, because the semiconductor element 216 might serve as a path for discharging a large current when a high voltage caused by ESD is applied between the power supply lines, the semiconductor 216 is referred to a voltage clamp element in some cases.

Figure 3:
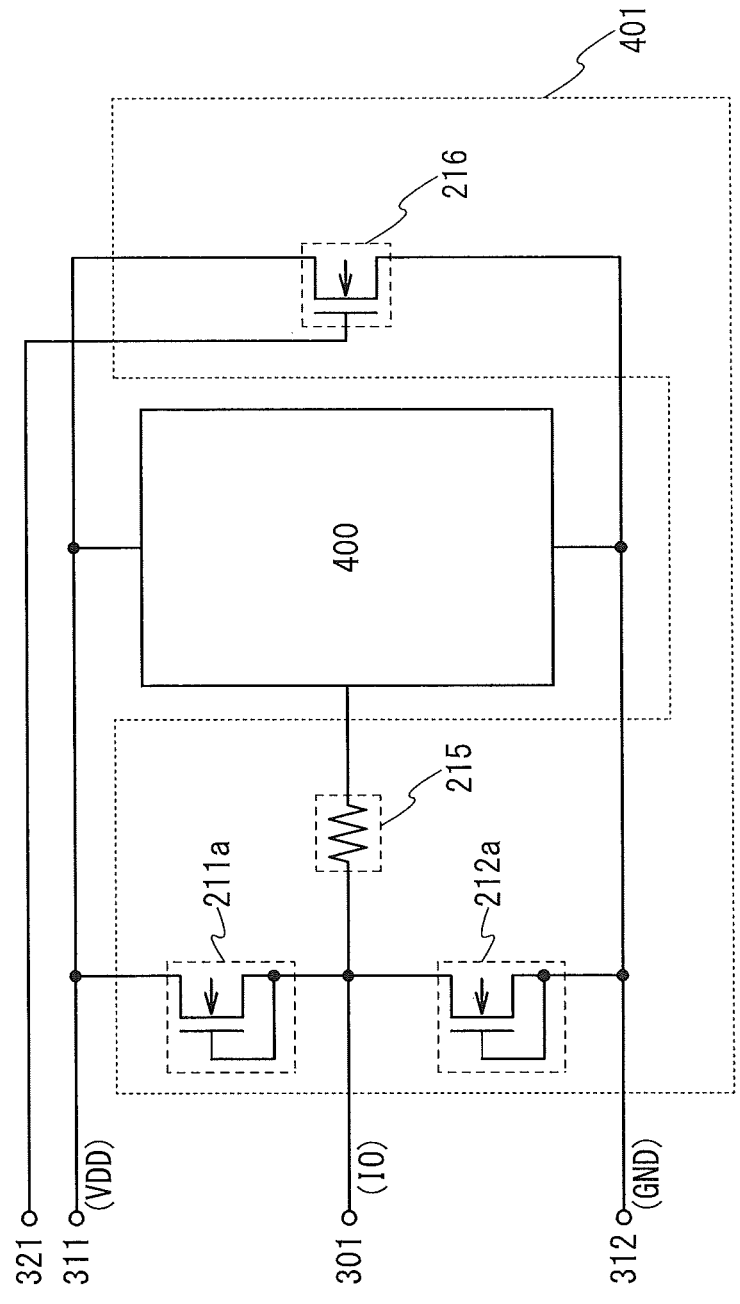
FIG. 3 is a circuit diagram of one embodiment of the present invention.

In addition, FIG. 3 illustrates the case where the semiconductor elements 211a and 212a are diode-connected transistors in each of which a gate electrode and one of the source electrode and the drain electrode are short-circuited.

Figure 4:
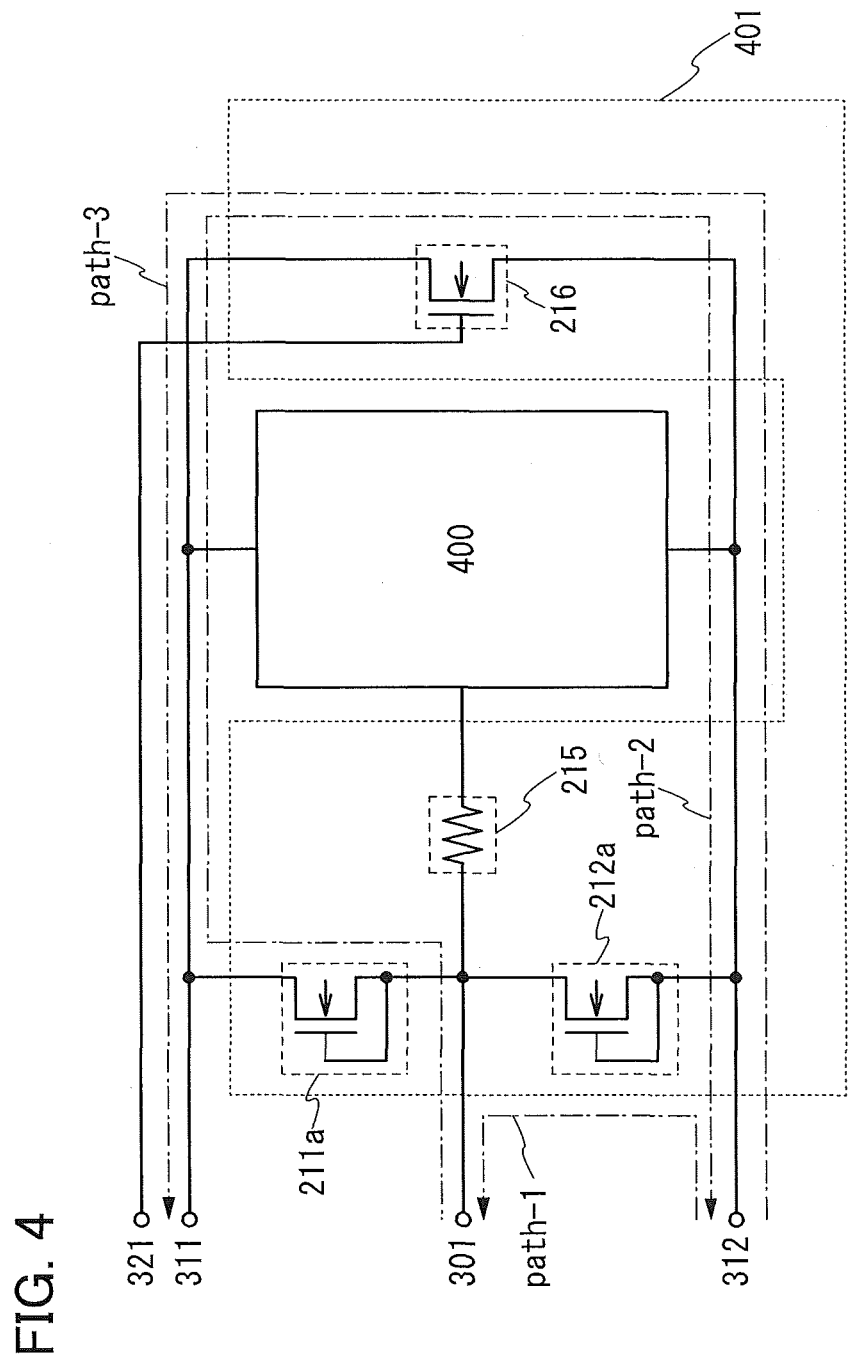
FIG. 4 shows a current path in a circuit diagram of one embodiment of the present invention.
Figure 5:
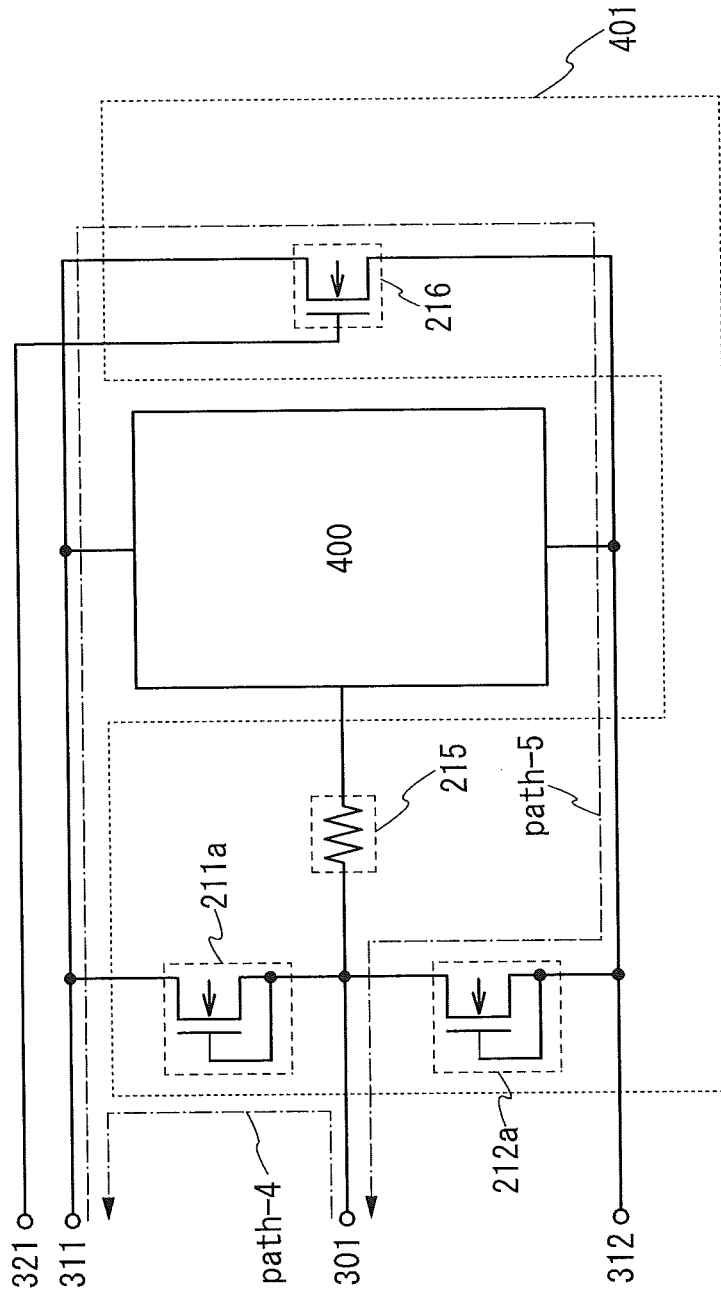
FIG. 5 shows a current path of a circuit diagram of one embodiment of the present invention.

Here, first, operation when a signal is not input to the integrated circuit 400, i.e., when the integrated circuit 400 is not operated, is described with reference to FIG. 4 and FIG. 5. At this time, a signal from the outside for operating the circuit is not input to the first wiring 301, the second wiring 311, the third wiring 312, and the fourth wiring 321.

The case where a voltage due to ESD is applied between the third wiring 312 and the first wiring 301 is considered. Here, in the case where a potential of the third wiring 312 gets higher than a potential of the first wiring 301 by voltage application, a path-1 illustrated in FIG. 4 functions as a discharge path, so that current can be prevented from flowing into the integrated circuit 400.

Next, the case where the potential of the third wiring 312 is lower than that of the first wiring 301 is considered. Since the semiconductor element 212a is a diode and has high resistance in a reverse biased state, the opposite direction of the path-1 cannot serve as a discharge path. Thus, in the case where the potential of the third wiring 312 is lower than that of the first wiring 301, a path-2 illustrated in FIG. 4 serves as a discharge path, which prevents a surge current form flowing in the integrated circuit 400. Here, in the case where a signal is not input to the gate electrode of the semiconductor element 216, i.e., in the case where a signal is not input to the fourth wiring 321, current can flow in both directions between the source and the drain. Here, the surge current refers to a current which flows due to application of ESD, for example.

Next, the case where a voltage due to ESD is applied between the second wiring 311 and the third wiring 312 is considered. Since the semiconductor element 216 can make current flow in both directions, a path-3 illustrated in FIG. 4 serves as a discharge-path when a potential of the third wiring 312 is higher than that of the second wiring 311; a reverse path to the path-3 serves as a discharge-path when a potential of the third wiring 312 is lower than the second wiring 311.

Next, the case where a voltage due to ESD is applied between the first wiring 301 and the second wiring 311 is considered. In the case where a potential of the first wiring 301 is higher than a potential of the second wiring 311, a path-4 illustrated in FIG. 5 serves as a discharge path. In the case where the potential of the first wiring 301 is lower than the potential of the second wiring 311, a path-5 illustrated in FIG. 5 serves as a discharge path.

Next, operation of the integrated circuit 400 will be described. In the case where the second wiring 311 is a high potential power supply line (VDD), and the third wiring 312 is a low potential power supply line (VSS), the semiconductor elements 211a and 212a are in reverse biased state, so that the semiconductor elements 211a and 212a have high resistance. In addition, a potential for turning off the semiconductor element 216 is input from the fourth wiring 321. For example, in the case where the semiconductor element 216 is an n-channel transistor, potential is input to the fourth wiring 321 so that a voltage between the gate and the source is lower than the threshold voltage, e.g., the voltage is lower than the threshold voltage by 1 V or more, 2 V or more, or 3 V or more.

Here, the semiconductor element 216 is a transistor with an oxide semiconductor film, thereby having extremely low off-state current. Therefore, when the integrated circuit 400 operates, a leakage current flowing through the semiconductor element 216 can be extremely low, so that power consumption of the entire circuit can be reduced.

Example of Circuit: 2

Figure 6:
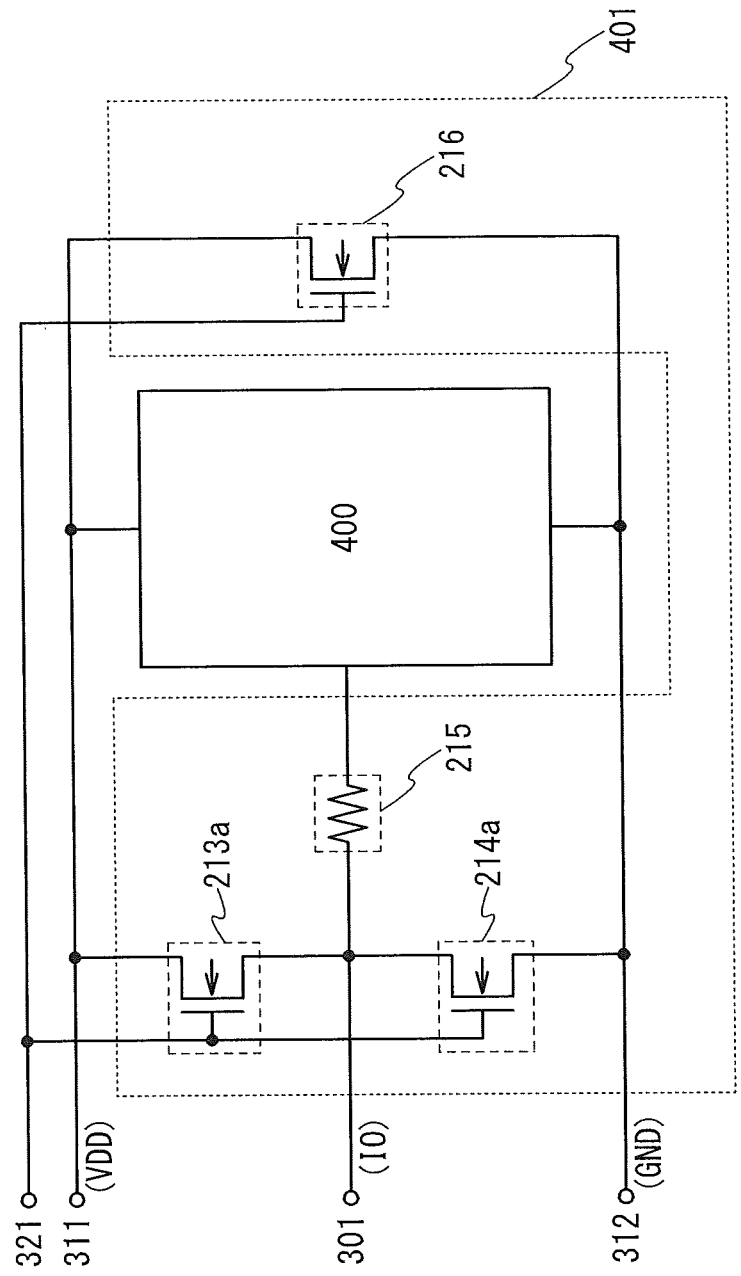
FIG. 6 is a circuit diagram of one embodiment of the present invention.

FIG. 6 illustrates a circuit diagram of one embodiment of the present invention. In FIG. 6, the diodes used as the semiconductor elements 211a and 212a in FIG. 2 are replaced with transistors.

A circuit illustrated in FIG. 6 includes the protection circuit 401 and the integrated circuit 400. The protection circuit 401 includes a semiconductor element 213a, a semiconductor element 214a, a semiconductor element 215, and a semiconductor element 216. The first wiring 301 is electrically connected to the integrated circuit via the semiconductor element 215. The first wiring 301 is electrically connected to one terminal of the semiconductor element 213a and one terminal of the semiconductor element 214a. The second wiring 311 is electrically connected to the integrated circuit 400, the semiconductor element 213a, and the semiconductor element 216. The third wiring 312 is electrically connected to the integrated circuit 400, the semiconductor element 214a, and the semiconductor element 216. The fourth wiring 321 is electrically connected to the semiconductor elements 213a, 214a, and 216.

The first wiring 301 can serve as a signal line through which a signal is input to the integrated circuit 400 via the semiconductor element 215, the second wiring 311 can serve as a high-potential power supply line (VDD), and the third wiring 312 can serve as a low-potential power supply line (VSS) or a ground potential line (GND).

The transistor of one embodiment of the present invention can be used for the semiconductor elements 213a, 214a, and 216. The fourth wiring 321 is electrically connected to gate electrodes of the semiconductor elements 213a, 214a, and 216. The semiconductor elements 213a, 214a, and 216 preferably have a low resistance when a high voltage is applied between the drain and the source during a period when voltage is not applied to the gate electrodes, i.e., in the case where a signal is not input to the wiring 321.

Figure 7:
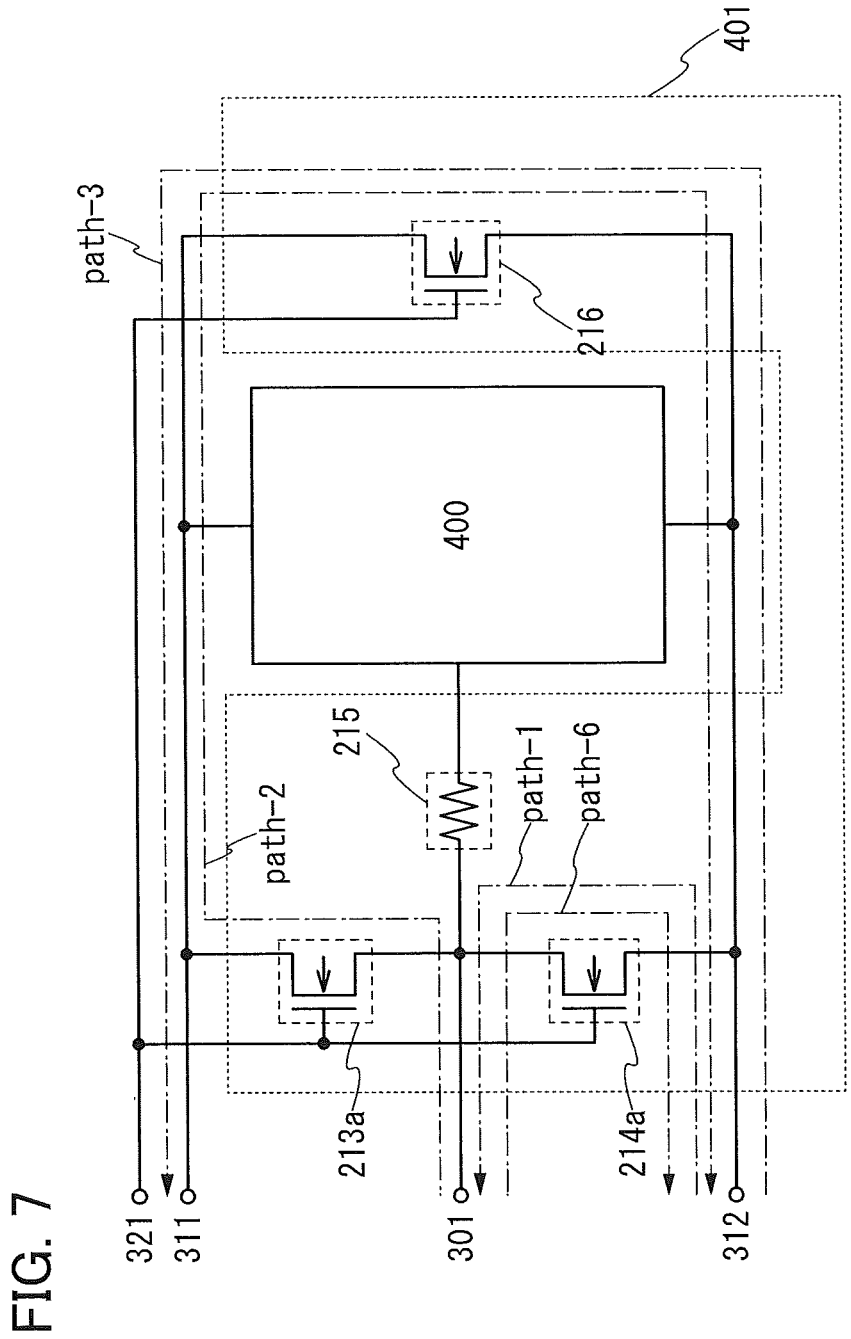
FIG. 7 shows a current path in a circuit diagram of one embodiment of the present invention.
Figure 8:
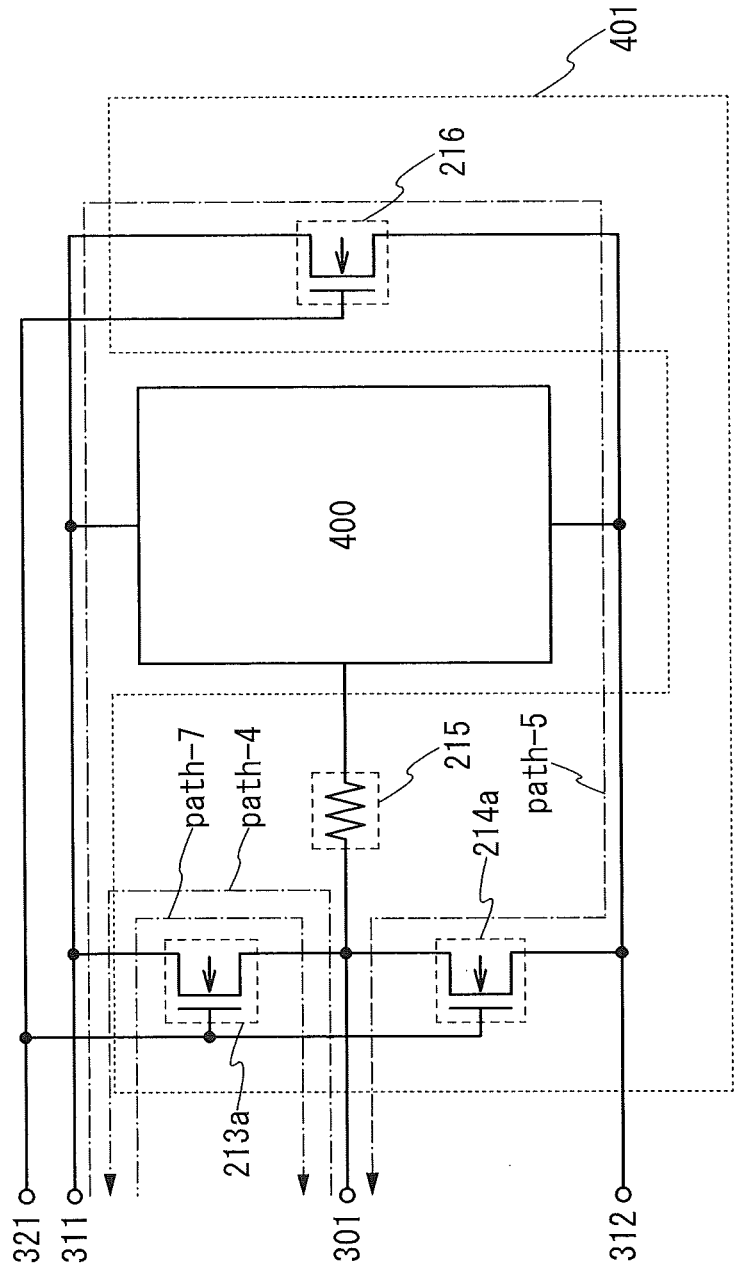
FIG. 8 shows a current path in a circuit diagram of one embodiment of the present invention.
Figure 9:
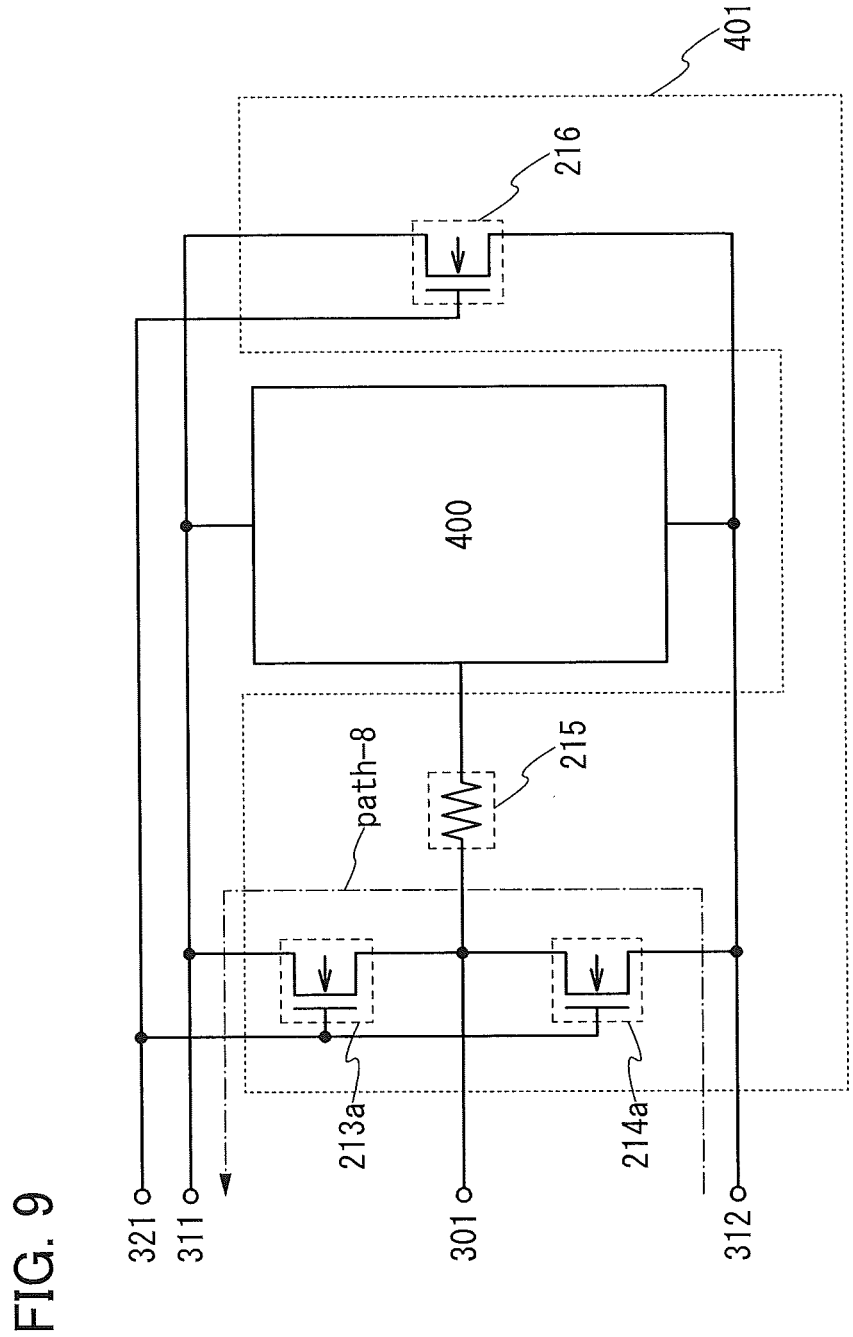
FIG. 9 shows a current path in a circuit diagram of one embodiment of the present invention.

Here, first, operation when a signal is not input to the integrated circuit 400, i.e., when the integrated circuit 400 is not operated, is described with reference to FIGS. 7 to 9. At this time, a signal from the outside for operating the circuit is not input to the first wiring 301, the second wiring 311, the third wiring 312, and the fourth wiring 321.

The case where a high voltage due to ESD is applied between the third wiring 312 and the first wiring 301 is considered. Here, in the case where a potential of the third wiring 312 is higher than the potential of the first wiring 301 when voltage is applied, the path-1 illustrated in FIG. 7 serves as a discharge path. In addition, in the case where a potential of the third wiring 312 is lower than that of the first wiring 301, a path-6 illustrated in FIG. 7, i.e., a reverse path to the path-1, can serve as a discharge path; current may also flow to the path-2.

Next, the case where a high voltage due to ESD is applied between the first wiring 301 and the second wiring 311 is considered. In the case where the potential of the first wiring 301 is higher than that of the second wiring 311, a path-4 illustrated in FIG. 8 serves as a discharge path. Furthermore, in the case where the potential of the first wiring 301 is lower than that of the second wiring 311, a path-7 illustrated in FIG. 8, i.e., a reverse path to the path-4, can serve as a discharge path; current may also flow to the path-5 illustrated in FIG. 8.

Next, the case where a voltage due to ESD is applied between the second wiring 311 and the third wiring 312 is considered. A path-3 illustrated in FIG. 7 serves as a discharge-path when a potential of the third wiring 312 is higher than that of the second wiring 311; a reverse path to the path-3 serves as a discharge-path when a potential of the third wiring 312 is lower than the second wiring 311.

Next, operation of the integrated circuit 400 will be described. In addition, a potential for turning off the semiconductor elements 213a, 214a, and 216 is input from the fourth wiring 321. For example, in the case where the semiconductor elements 213a, 214a and 216 are n-channel transistors, potential is input to the fourth wiring 321 so that a voltage between the gate and the source is lower than the threshold voltage for each of the transistors, e.g., the voltage is lower than the threshold voltage by 1 V or more, 2 V or more, or 3V or more.

Here, an oxide semiconductor film is used for the semiconductor elements 213a, 214a and 216, whereby the transistors can have extremely low off-state current. Thus, when the integrated circuit 400 is operated, a leakage current flowing through the transistors 213a, 214a, and 216 can be extremely low, so that power consumption of the entire circuit can be reduced.

Furthermore, a structure without the semiconductor element 216 may be employed in the circuit illustrated in FIG. 6. In that case, when a high voltage caused by ESD is applied between the second wiring 311 and the third wiring 312, a path-8 illustrated in FIG. 9 or a reverse path to the path-8 serves as a discharge-path depending on the direction of voltage in some cases.

Example of Circuit: 3

Figure 10:
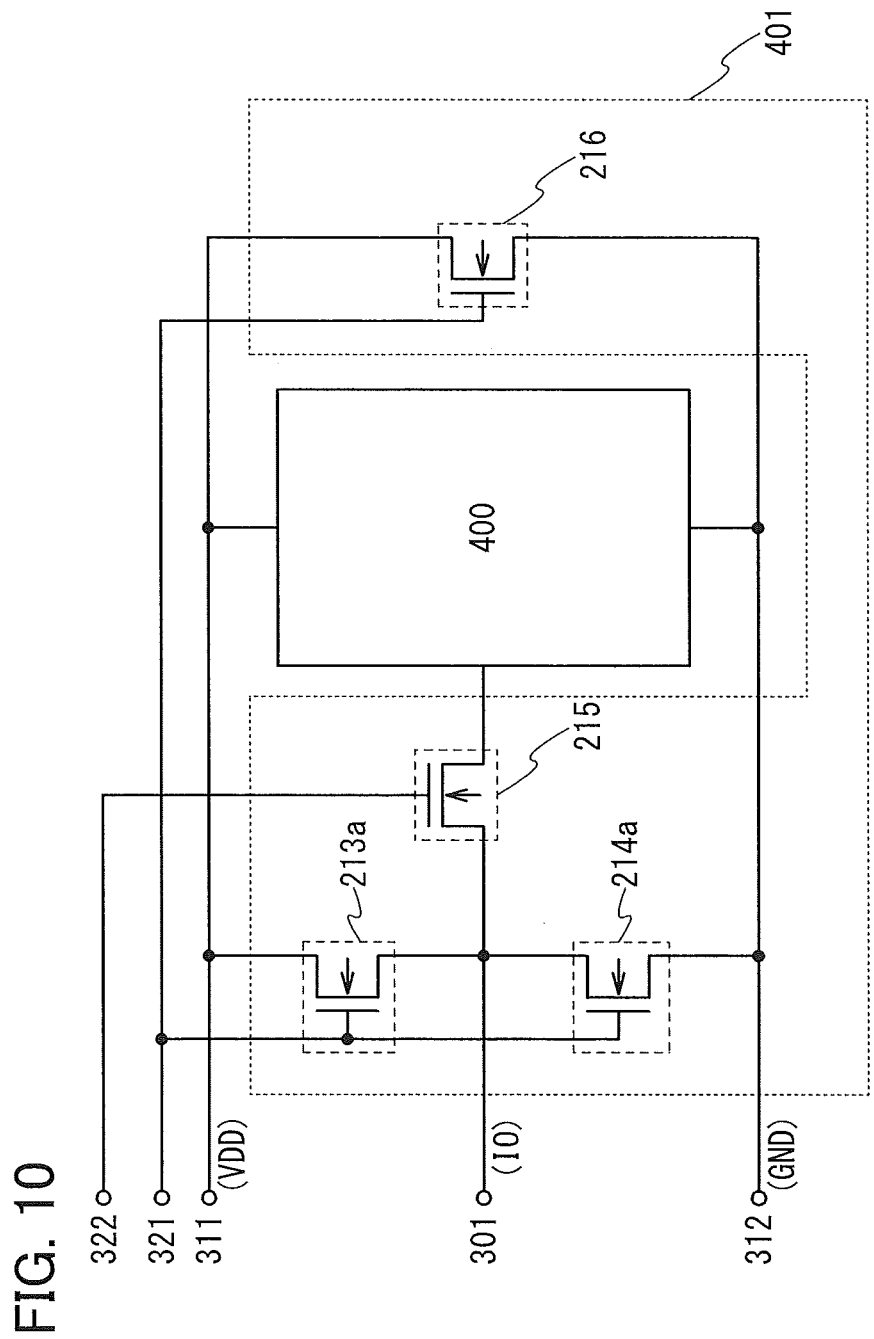
FIG. 10 is a circuit diagram of one embodiment of the present invention.

Though a resistor is used for the semiconductor element 215 in the circuits illustrated in FIG. 3 and FIG. 6, instead, a transistor can be used for the semiconductor element 215 as illustrated in FIG. 10.

The semiconductor element 215 preferably reduces current flowing into the integrated circuit 400 when a high voltage caused by ESD is applied. Thus, the semiconductor element 215 preferably has a high resistance when ESD is applied. In addition, the semiconductor element 215 is preferably less likely to be broken when a high voltage is applied.

In contrast, when the integrated circuit 400 is operated, i.e., in the case where a signal is input from the first wiring 301 to the integrated circuit 400, the resistance of the semiconductor element 215 is preferably low. When the resistance of semiconductor element 215 is decreased, power consumption of the entire circuit is reduced. In addition, reduction in operation speed is suppressed, whereby an integrated circuit with excellent characteristics can be realized.

In view of the above, a transistor is preferably used as the semiconductor element 215. When a transistor is used for the semiconductor element 215 and a potential of the gate is changed depending on the operating state of the integrated circuit, the resistance of the semiconductor element 215 can be increased when the integrated circuit 400 is not in operation, and can be decreased when the integrated circuit 400 is in operation. When the integrated circuit 400 is operated, a signal is input from a fifth wiring 322 to a gate electrode of the semiconductor element 215 so that the transistor is turned on. For example, in the case where the semiconductor element 215 is an n-channel transistor, potential is input to the fifth wiring 322 so that a voltage between the gate and the source is higher than the threshold voltage, e.g., the voltage is higher than the threshold voltage by 1V or more, 2V or more, or 3V or more.

FIG. 10 illustrates an example where the semiconductor element 215 in FIG. 6 is replaced with a transistor, and a gate electrode of the transistor is electrically connected to the fifth wiring 322. For current paths in FIG. 10, reference can be made to FIGS. 7 to 9 in which the semiconductor element 215 is replaced with the transistor whose gate electrode is connected to the fifth wiring 322.

In addition, the semiconductor element 215 preferably includes an oxide semiconductor film. When the transistor including the oxide semiconductor film is used as the semiconductor element 215, whereby withstand voltage between the drain and the source can be increased. Thus, breakdown of the transistor can be suppressed when a high voltage caused by ESD is applied.

As described above, the transistor is affected by a gate electric field even when a gate voltage is not input from the outside. For example, an electric field due to a difference in work functions between the semiconductor layer and the gate electrode and an electric field due to a charge in the gate insulating film are generated in some cases.

In addition, as described above, the circuit in one embodiment of the present invention can discharge a large current due to ESD to the discharge path in the protection circuit 401 included in the circuit when a signal from the outside is not input thereto.

Here, a transistor used as the semiconductor element 215 preferably reduces current flowing into the integrated circuit 400 in the case where a high voltage accompanied with ESD is applied. Therefore, the resistance of the semiconductor element 215 is preferably high when the integrated circuit 400 is not operated. That is, in the case where a high voltage is applied between the drain and source during a period when a potential is not input to a gate electrode, the resistance of the transistor used as the semiconductor element 215 is preferably high as compared with that of the transistor used for the semiconductor elements 213a, 214a, and 216. The decrease in resistance of the transistor used for the semiconductor element 215 is preferably small even when a voltage between the drain and the source is increased. The resistance of each of transistors used for semiconductor elements 213a, 214a, and 216 is preferably lowered by application of a high voltage between the drain and the source when a potential is not input to the gate electrode.

That is, in FIG. 10, the strength of the gate electric field of the semiconductor element 215 is preferably different from those of the semiconductor elements 213a, 214a and 216. Thus, the thickness of the semiconductor element 215 may be different from those of the semiconductor elements 213a, 214a, and 216. In addition, the three-dimensional shape of semiconductor element 215 may be changed from those of the semiconductor elements 213a, 214a, and 216 in order to change the gate electric field strength. The description of the three dimensional shape is described in Embodiment 2.

Figure 11:
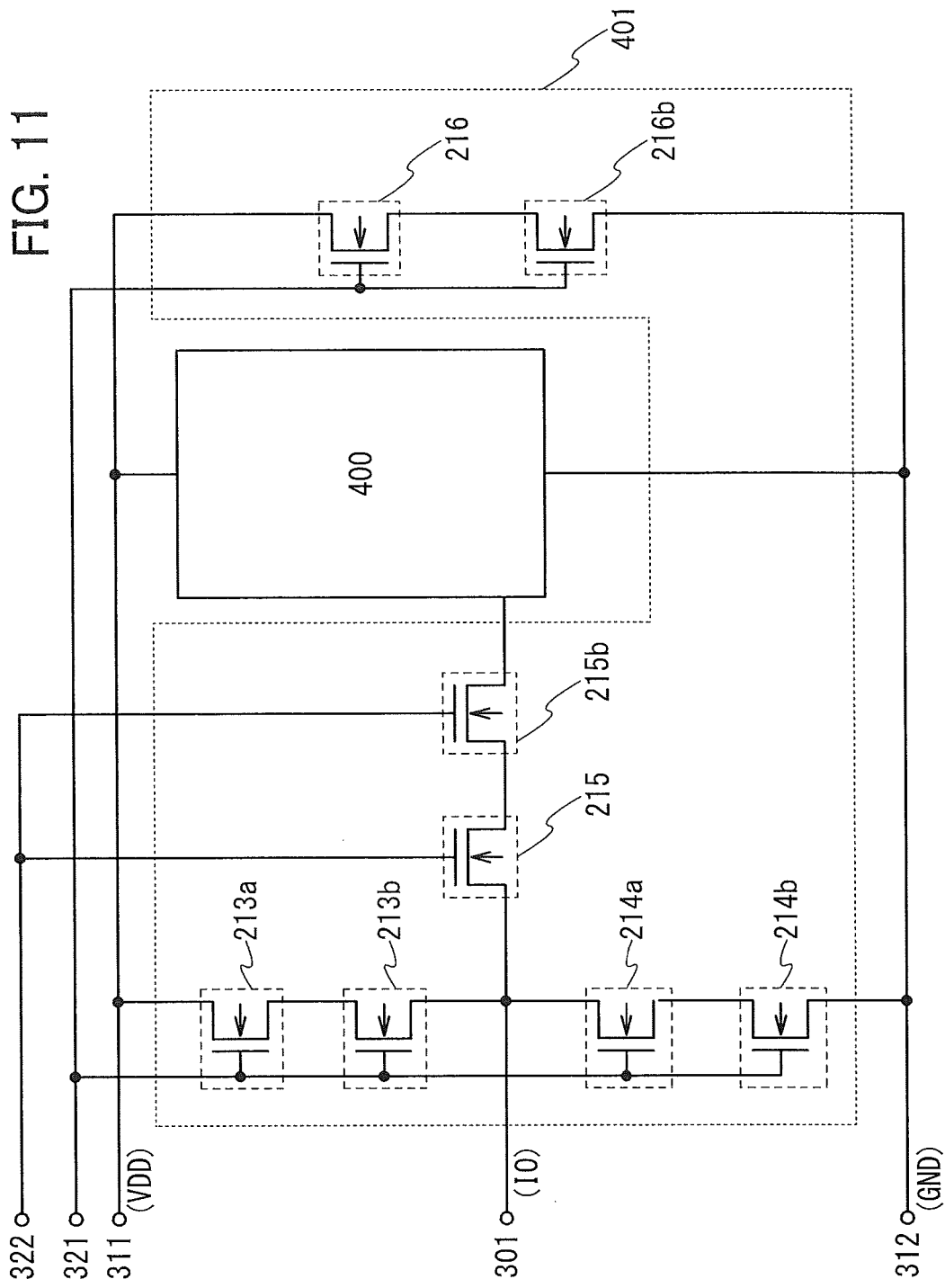
FIG. 11 is a circuit diagram of one embodiment of the present invention.

As illustrated in FIG. 11, the protection circuit 401 may include two or more semiconductor elements between the wiring 311 and the wiring 301, for example. Although FIG. 11 illustrates an example where two transistors connected in series (i.e., semiconductor elements 213a and 213b) are provided between the wiring 311 and the wiring 301, three or more semiconductor elements may be connected in series, for example. Furthermore, the protection circuit 401 may include a semiconductor element other than a transistor between the wiring 311 and the wiring 301. For example, a plurality of transistors and a plurality of wirings may be included.

Similarly, the protection circuit 401 may include two or more semiconductor elements between the wiring 312 and the wiring 301. Although FIG. 11 illustrates an example where two transistors connected in series (i.e., semiconductor elements 214a and 214b) are provided between the wiring 312 and the wiring 301, three or more semiconductor elements may be connected in series, for example. In addition, the protection circuit 401 may include a semiconductor element other than a transistor between the wiring 312 and the wiring 301. For example, a plurality of transistors and a plurality of wirings may be provided.

In addition, the protection circuit 401 may include two or more semiconductor elements between the wiring 311 and the wiring 312. FIG. 11 shows the case where semiconductor elements 216 and 216b are included. Three or more semiconductor elements may be connected in series between the wiring 311 and the wiring 312, and a semiconductor element other than a transistor may be provided between the wirings 311 and 312.

In addition, the protection circuit 401 may include a plurality of semiconductor elements for an input portion of the integrated circuit 400. FIG. 11 illustrates an example where the semiconductor elements 215 and 215b are electrically connected in series to the input portion of the integrated circuit 400.

Figure 12:
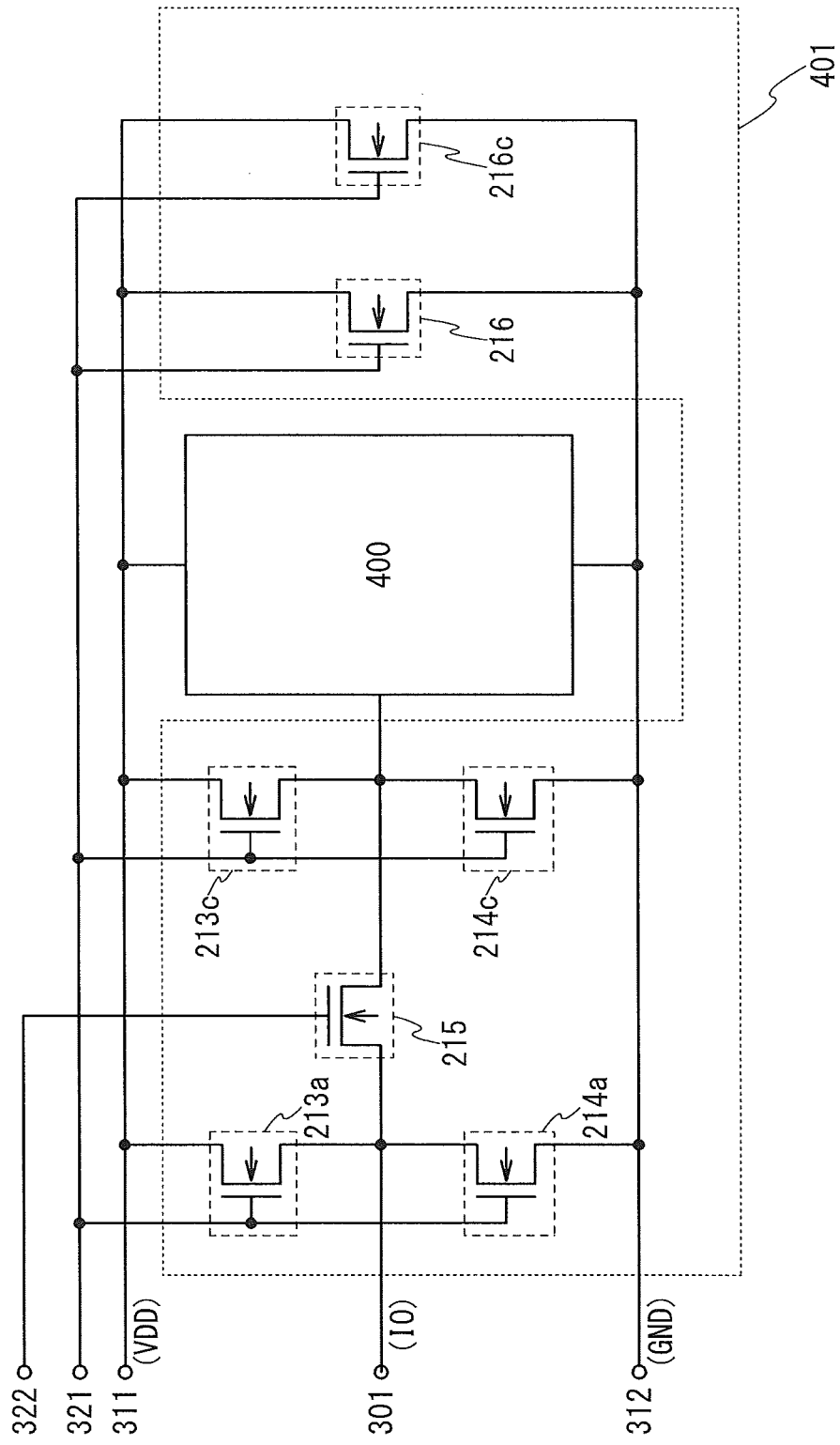
FIG. 12 is a circuit diagram of one embodiment of the present invention.

As illustrated in FIG. 12, the protection circuit 401 may include two or more semiconductor elements connected in parallel between the wiring 311 and the wiring 301. Although FIG. 12 illustrates an example where two transistors connected in parallel (i.e., semiconductor elements 213a and 213c) are provided between the wiring 311 and the wiring 301, three or more transistors may be connected in parallel. Similarly, an example where semiconductor elements 214a and 214c connected in parallel are provided between the wiring 312 and the wiring 301 is illustrated. Similarly, an example where semiconductor elements 216 and 216c connected in parallel are provided between the wiring 311 and the wiring 312 is illustrated.

Semiconductor elements are connected in parallel as illustrated in FIG. 12, whereby the protection circuit 401 can protect the integrated circuit 400 from ESD even if the first semiconductor element is broken by ESD because the second semiconductor element remains.

Figure 13:
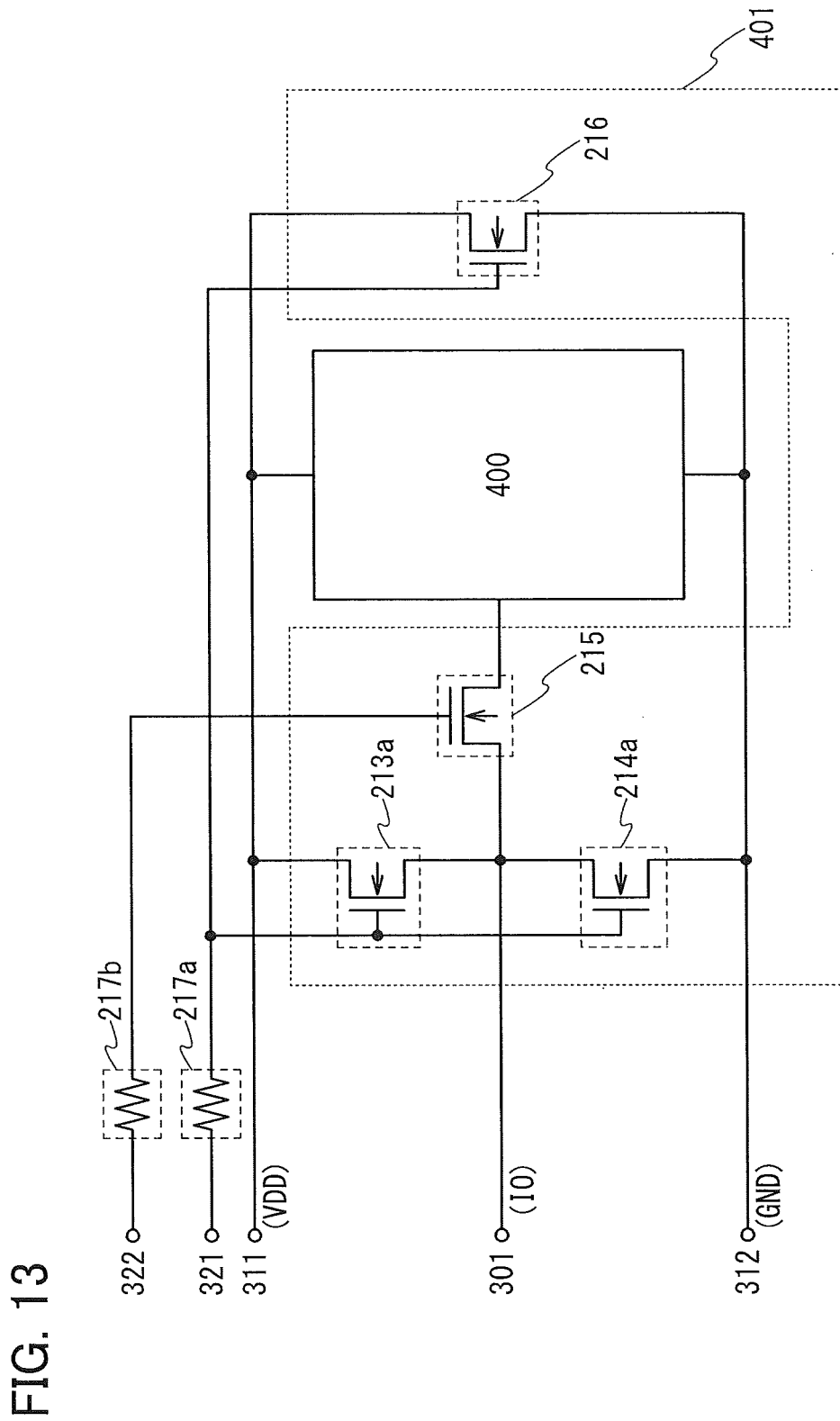
FIG. 13 is a circuit diagram of one embodiment of the present invention.

In addition, as illustrated in FIG. 13, the wirings 321 and 322 may include resistors 217a and 217b in the input portions of signals to the wirings. Provision of resistors 217a and 217b can suppress breakdown of gate insulating films in the semiconductor elements 215 and 216 which are transistors when ESD is applied to the wrings 321 and 322.

Figure 14:
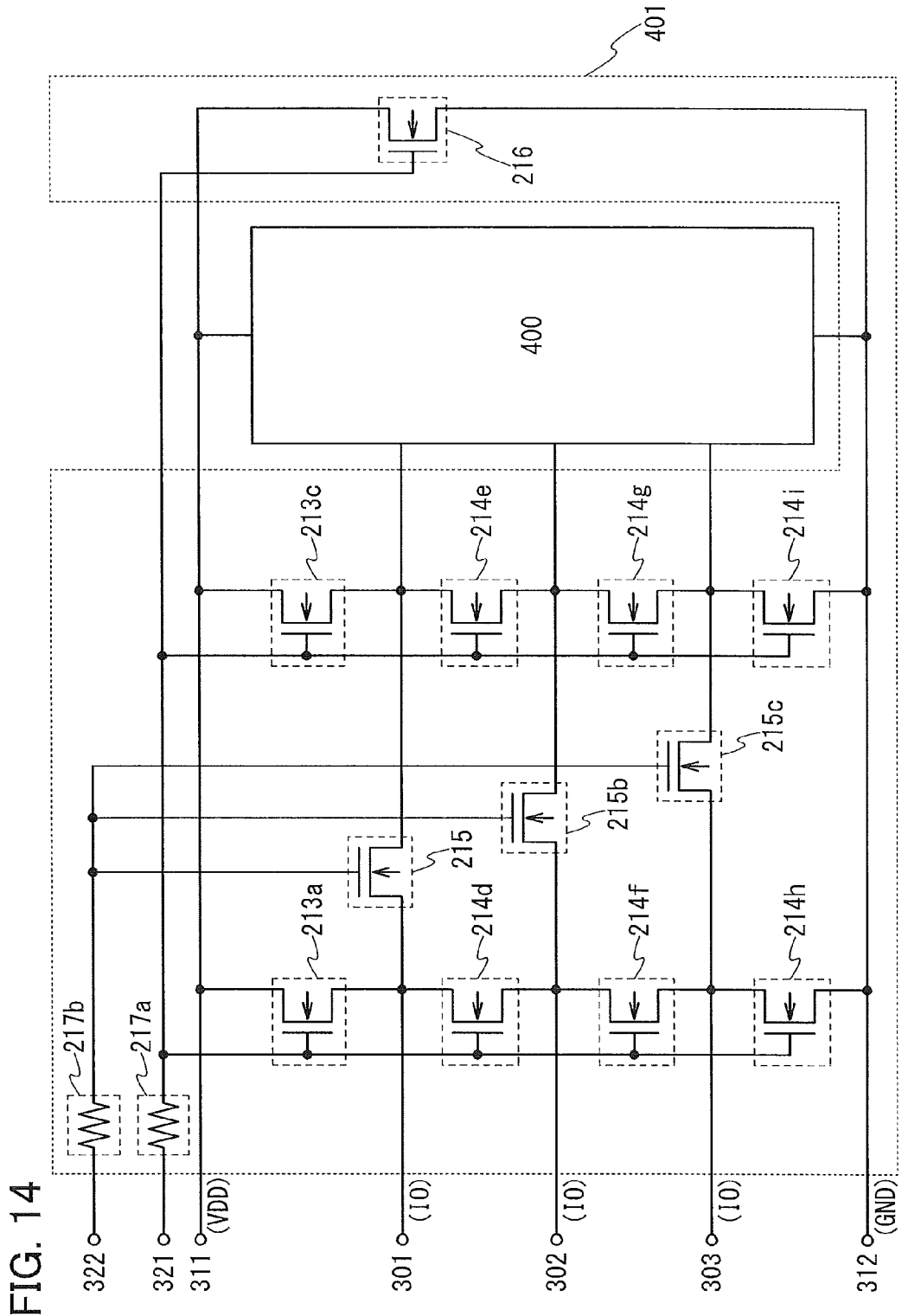
FIG. 14 is a circuit diagram of one embodiment of the present invention.

In addition, a circuit illustrated in FIG. 14 includes the wirings 301 to 303, the wirings 311, 312, 321, and 322. The wiring 301, the wiring 302, and the wiring 303 can be signal lines for inputting signals into the integrated circuit 400 via the semiconductor element 215, the semiconductor element 215b, and the semiconductor element 215c, respectively. That is, the circuit can include a plurality of signal lines. In addition, two semiconductor elements which serve as discharge circuits for discharging ESD are positioned in parallel in each region between the wirings 311 and 301, between the wirings 301 and 302, between the wirings 302 and 303, between the wirings 303 and 312. The semiconductor elements 213a and 213c, semiconductor elements 214d and 214e, semiconductor elements 214f and 214g, and semiconductor elements 214h and 214i are provided between the wirings 311 and 301, between the wirings 301 and 302, between the wirings 302 and 303, between the wirings 303 and 312, respectively.

Figure 15:
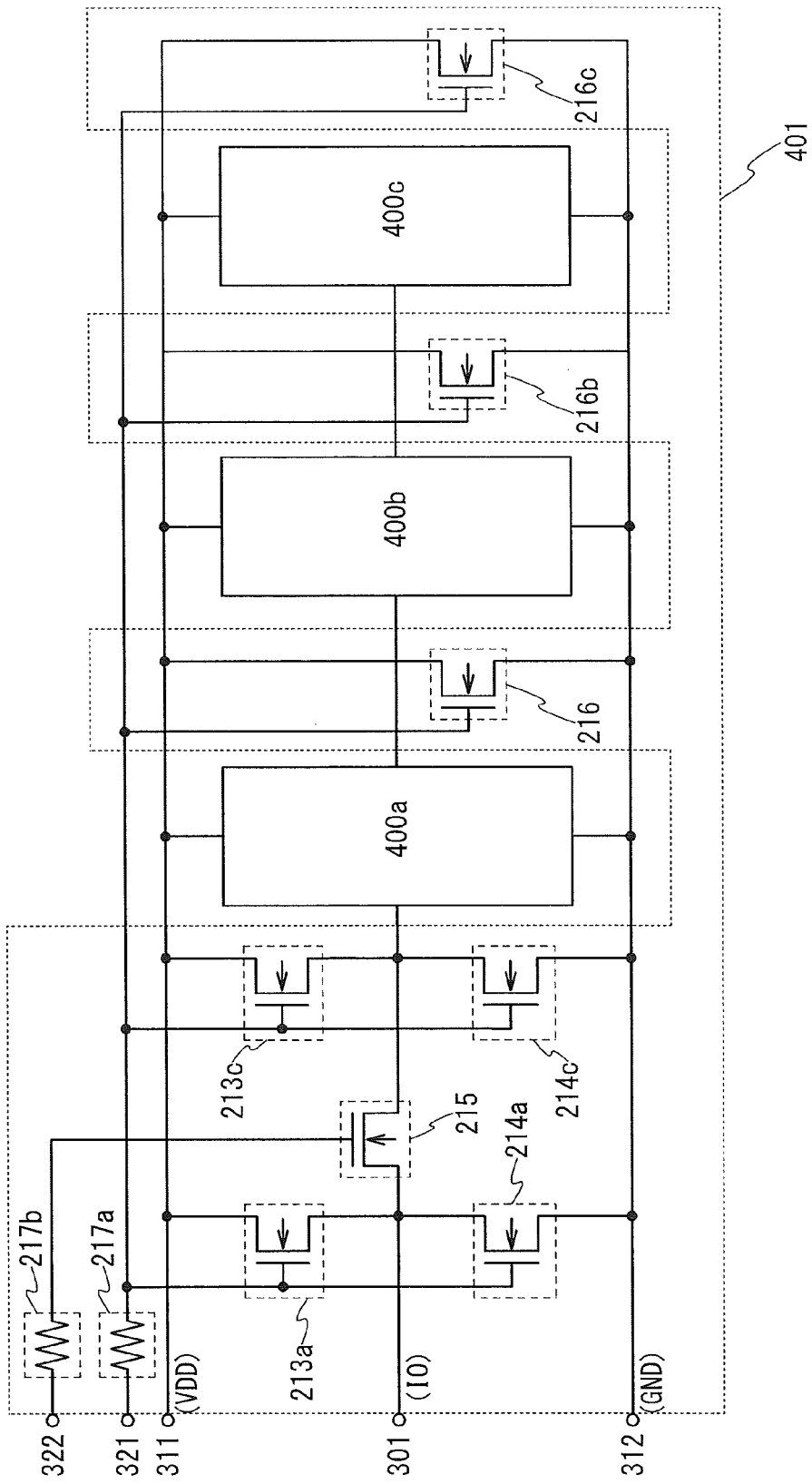
FIG. 15 is a circuit diagram of one embodiment of the present invention.

FIG. 15 illustrates an example where the integrated circuit 400 is divided into blocks 400a to 400c, and semiconductor elements 216, 216b, and 216c are provided as voltage clamp elements for the block 400a, the block 400b, and the block 400c, respectively. Although an example where the integrated circuit 400 is divided into three blocks is illustrated here, the integrated circuit 400 may be divided into four or more blocks.

This embodiment can be combined with any of the other embodiments disclosed in this specification as appropriate.

Embodiment 2

Figure 16A:
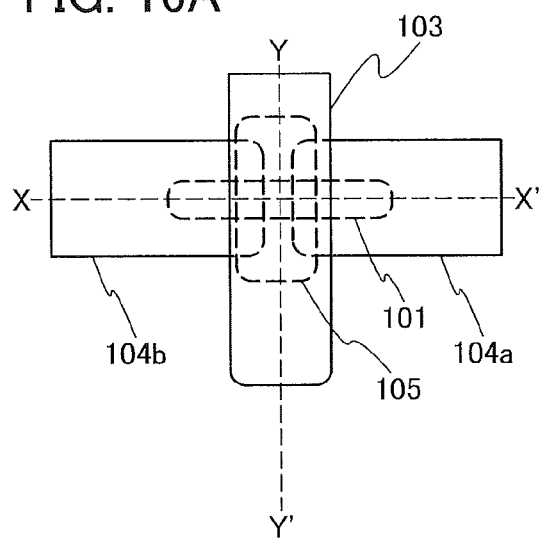
FIGS. 16A to 16E each illustrate a transistor of one embodiment of the present invention.
Figure 16D:
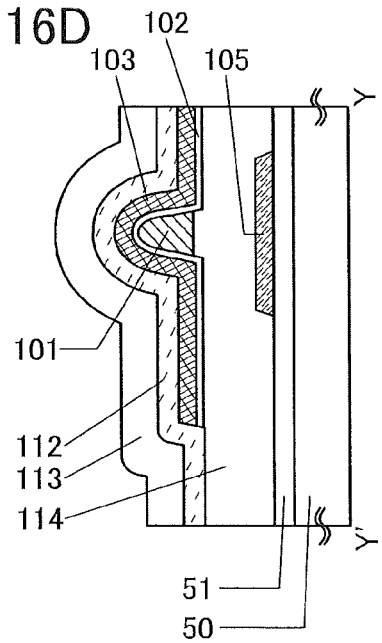
Figure 16B:
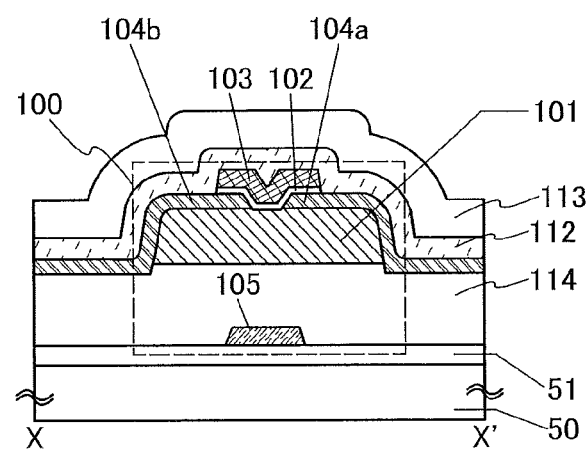

In this embodiment, an example of a transistor which can be used for the circuits shown in Embodiment 1 is described.
[Structure of Transistor]
FIGS. 16A to 16E illustrate an example of a field effect transistor using one embodiment of the present invention. FIG. 16A is a top view of the transistor 100. FIG. 16B shows a cross section taken along dashed dotted line X-X' in FIG. 16A, and FIG. 16D is a cross section taken along dashed dotted line Y-Y' in FIG. 16D. The transistor 100 in FIGS. 16A to 16E includes a substrate 50, an insulating film 51 in contact with a top surface of the substrate 50, an insulating film 114 in contact with a top surface of the insulating film 51, a semiconductor layer 101 in contact with a top surface of the insulating film 114, conductive layers 104a and 104b, a gate insulating film 102 over the semiconductor layer 101, and a gate electrode 103 overlapping the semiconductor layer 101 with the gate insulating film 102 positioned therebetween. The transistor 100 is covered with an insulating film 112 and an insulating film 113. Furthermore, the transistor 100 may include a conductive layer 105.

As the semiconductor layer 101, an oxide semiconductor layer is preferably used, for example.

Figure 16E:
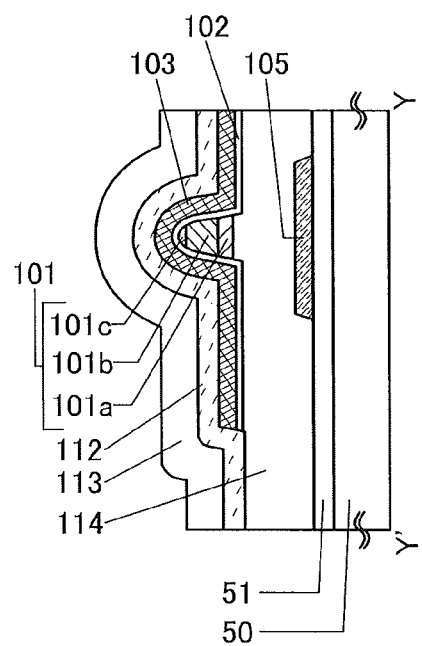
Figure 16C:
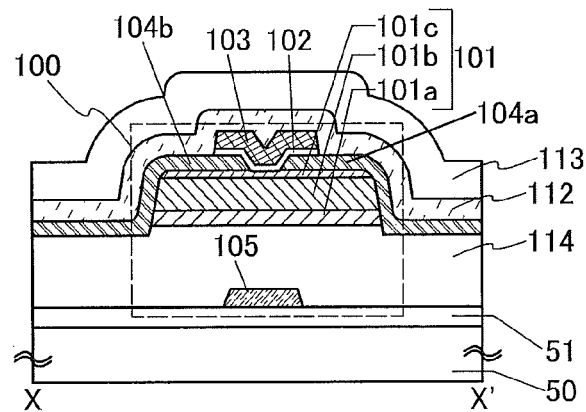

The semiconductor layer 101 included in the transistor 100 may have a single-layer structure or a stacked structure including a plurality of layers. FIG. 16C and FIG. 16E shows an example where three layers, i.e., a semiconductor layer 101a, a semiconductor layer 101b, and a semiconductor layer 101c, are stacked. FIG. 16C shows a cross section taken along dashed dotted line X-X' in FIG. 16A, and FIG. 16E shows a cross section taken along dashed dotted line Y-Y' in FIG. 16E. In FIG. 16C and FIG. 16E, the semiconductor layer 101b is in contact with a top surface of the semiconductor layer 101a, and the semiconductor layer 101c is in contact with a top surface of the semiconductor layer 101b.

Alternatively, a structure illustrated in FIGS. 17A to 17D may be used for the transistor 100. FIG. 17A is a top view of the transistor 100. FIG. 17B shows a cross section taken along dashed dotted line X-X' in FIG. 17A, and FIG. 17C is a cross section taken along dashed dotted line Y-Y' in FIG. 17A. The transistor 100 in FIGS. 17A to 17D includes the semiconductor layer 101a, the semiconductor layer 101b in contact with the top surface of the semiconductor layer 101a, the conductive layers 104a and 104b that are in contact with the top surface of the semiconductor layer 101b and are apart from each other in a region overlapping the semiconductor layer 101b, the semiconductor layer 101c in contact with the top surface of the semiconductor layer 101b, the insulating film 102 over the semiconductor layer 101c, and the gate electrode 103 overlapping the semiconductor layer 101b with the gate insulating film 102 and the semiconductor layer 101c positioned therebetween. Furthermore, the transistor 100 illustrated in FIGS. 17A to 17D may include a conductive layer 105. The semiconductor layer 101a is provided between the insulating film 114 and the semiconductor layer 101b. The semiconductor layer 101c is provided between the semiconductor layer 101b and the gate insulating film 102. The conductive layer 104a and the conductive layer 104b are in contact with the top surface of the semiconductor layer 101b and the bottom surface of the semiconductor layer 101c.

Figure 18A:
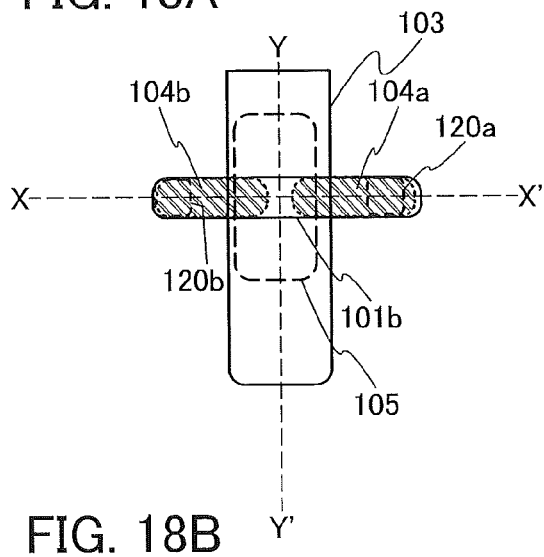
FIGS. 18A to 18D each illustrate a transistor of one embodiment of the present invention.
Figure 18C:
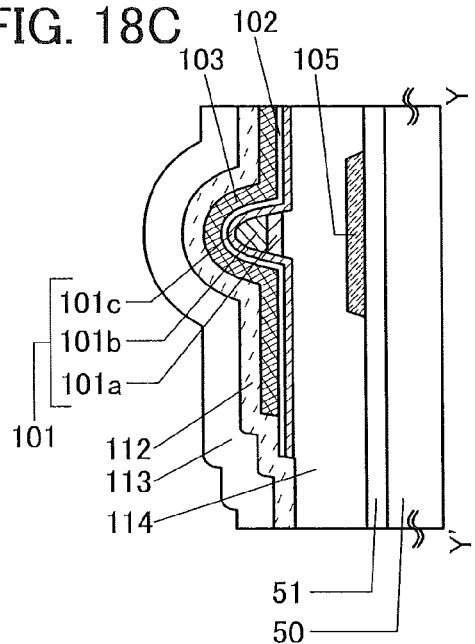
Figure 18B:
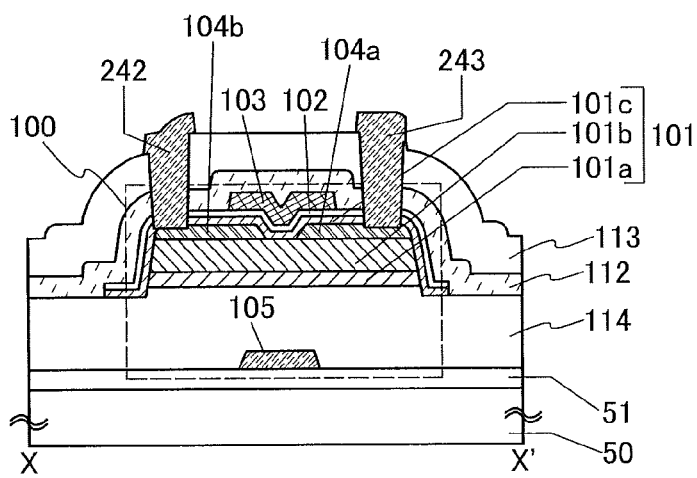

Alternatively, the transistor 100 may have a structure illustrated in FIGS. 18A to 18D. FIG. 18A shows a top view of the transistor 100. FIG. 18B shows a cross section taken along dashed dotted line X-X' in FIG. 18A, and FIG. 18C shows a cross section taken along dashed dotted line Y-Y' in FIG. 18A. Here, a difference between FIGS. 18A to 18D and FIGS. 17A to 17D is described. In FIG. 18B, the conductive layers 104a and 104b are in contact with the top surface of the semiconductor layer 101b. In contrast, in FIG. 17B, the conductive layers 104a and 104b are in contact with the top surface and a side surface of the semiconductor layer 101b and a side surface of the semiconductor layer 101a. In FIGS. 17A to 17D, end portions of the semiconductor layer 101c and the gate insulating film 102 are substantially aligned with end portions of the gate electrode 103. In contrast, in FIGS. 18A to 18D, end portions of the semiconductor layer 101c and the gate insulating film 102 extend beyond the end portions of the gate electrode 103.

The transistor 100 illustrated in FIGS. 18A to 18D may include opening portions 120a and 120b in the semiconductor layer 101c, the gate insulating film 102, and the insulating films 112 and 113. In addition, in an example illustrated in FIGS. 18A to 18D, plugs 242 and 243 which are provided to be embedded in the opening portions are included. For the plugs 242 and 243, a material similar to that used for the conductive layer 104a and the gate electrode 103 may be used, for example.

Figure 18D:
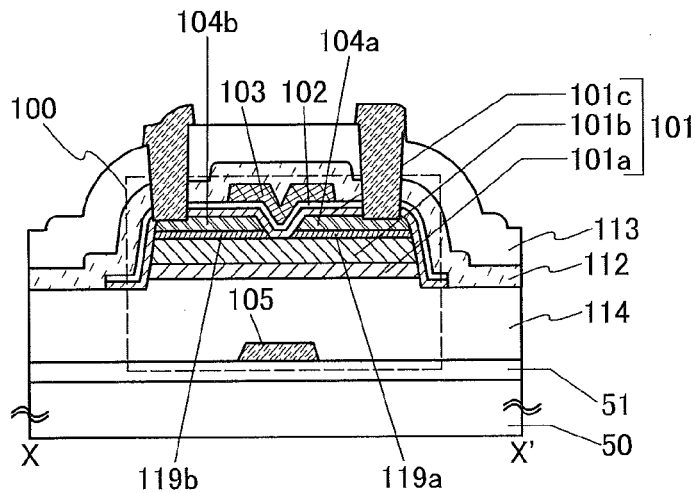
Figure 19A:
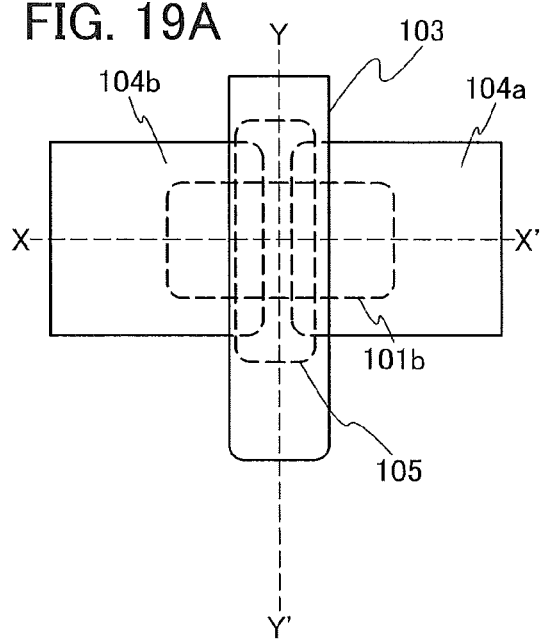
FIGS. 19A to 19C each illustrate a transistor of one embodiment of the present invention.
Figure 19C:
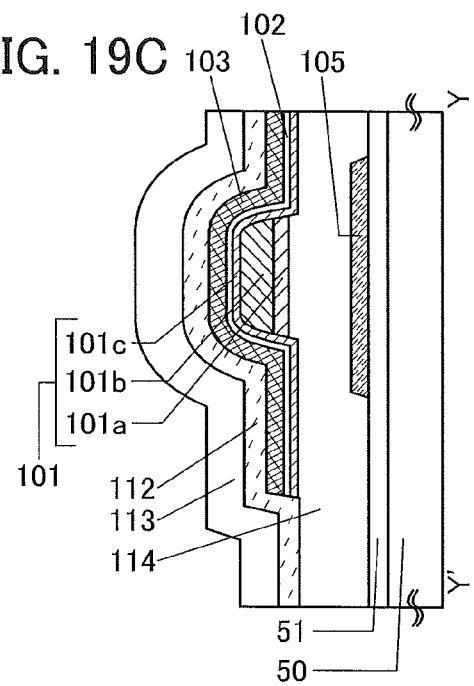
Figure 19B:
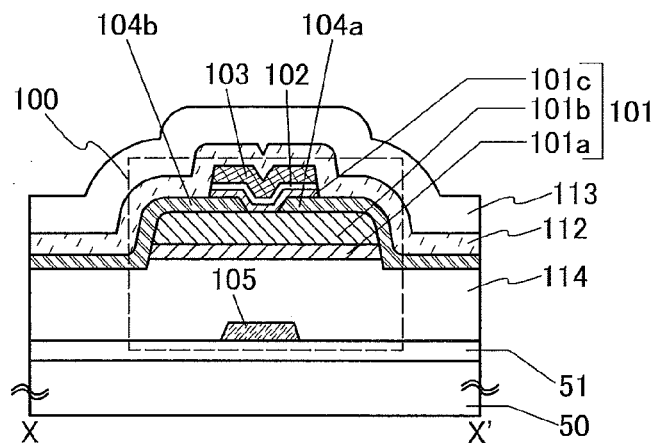

Furthermore, FIGS. 19A to 19C illustrate an example where the transistor in FIGS. 18A to 18D has an increased channel width. FIG. 19A shows a top view of the transistor 100. FIG. 19B shows a cross section taken along dashed dotted line X-X' in FIG. 19A, and FIG. 19C shows a cross section taken along dashed dotted line Y-Y' in FIG. 19A.

In the case where the semiconductor layer 101 is formed by stacking three layers, i.e., the semiconductor layers 101a to 101c as illustrated in FIGS. 16A to 16D, FIGS. 17A to 17D, FIGS. 18A to 18D, and FIGS. 19A to 19C, an oxide having an electron affinity higher than those of the semiconductor layer 101a and the semiconductor layer 101c is preferably used. For example, for the semiconductor layer 101b, an oxide having an electron affinity higher than that of each of the semiconductor layer 101a and the semiconductor layer 101c by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

An oxide which has higher electron affinity than the semiconductor layers 101a and 101c is used for the semiconductor layer 101b, whereby when an electric field is applied to the gate electrode, a channel is formed in the semiconductor layer 101b that has the highest electron affinity among the semiconductor layers 101a, 101b, and 101c. Here, when the channel is formed in the semiconductor layer 101b, for example, the channel formation region is apart from the interface with the gate insulating film 102; as a result, influence of scattering at the interface with the gate insulating film can be reduced. Thus, the field effect mobility of the transistor can be increased. Here, as described later, the semiconductor layer 101b and the semiconductor layer 101c have the common constituent element and thus interface scattering hardly occurs therebetween.

Furthermore, in the case where a silicon oxide film, a silicon oxynitride film, a silicon nitride oxide film, a silicon nitride film, or the like is used as the gate insulating film, silicon contained in the gate insulating film enters the oxide semiconductor film in some cases. When silicon is included in the oxide semiconductor film, a decrease in crystallinity of the oxide semiconductor film, a decrease in carrier mobility, or the like might occur. Therefore, to reduce the impurity concentration, for example, the silicon concentration, of the semiconductor layer 101b where the channel is formed, it is preferable that the semiconductor layer 101c be provided between the semiconductor layer 101b and the gate insulating film. For a similar reason, to reduce influence of an impurity diffused from the insulating film 114, it is preferable that the semiconductor layer 101a be provided between the semiconductor layer 101b and the insulating film 114.

The semiconductor layer 101b is, for example, an oxide semiconductor containing indium. The semiconductor layer 101b can have high carrier mobility (electron mobility) by containing indium, for example. The semiconductor layer 101b preferably contains an element M The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. Further, the semiconductor layer 101b preferably contains zinc. When the oxide semiconductor contains zinc, the oxide semiconductor is easily to be crystallized, for example.

For the semiconductor layer 101b, an oxide with a wide energy gap is used. The energy gap of the semiconductor layer 101b is, for example, larger than or equal to 2.5 eV and smaller than or equal to 4.2 eV, preferably larger than or equal to 2.7 eV and smaller than or equal to 3.7 eV, further preferably larger than or equal to 2.8 eV and smaller than or equal to 3.3 eV.

Next, the semiconductor layer 101a and the semiconductor layer 101c are described. For example, the semiconductor layer 101a and the semiconductor layer 101c are each an oxide semiconductor which includes one or more kinds of elements other than oxygen that are included in the semiconductor layer 101b. Since the semiconductor layer 101a and the semiconductor layer 101c are each formed using one or more kinds of elements other than oxygen that are included in the semiconductor layer 101b, interface states are less likely to be formed at the interface between the semiconductor layer 101a and the semiconductor layer 101b and the interface between the semiconductor layer 101b and the semiconductor layer 101c.

It is preferable that the semiconductor layer 101a, the semiconductor layer 101b, and the semiconductor layer 101c each preferably contain indium. In the case of using an In-M-Zn oxide as the semiconductor layer 101a, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor layer 101b, when a summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor layer 101c, when a summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor layer 101c may be an oxide that is a type the same as that of the semiconductor layer 101a.

An indium gallium oxide has a small electron affinity and a high oxygen-blocking property. Therefore, for example, the semiconductor layer 101c may include indium gallium oxide. The gallium atomic ratio [In/(In+Ga)] is, for example, higher than or equal to 70%, preferably higher than or equal to 80%, more preferably higher than or equal to 90%.

Figure 22A:
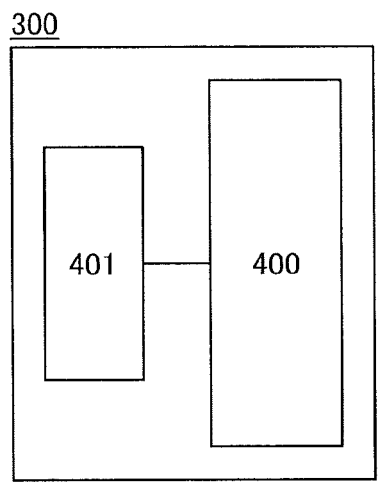
FIG. 22A illustrates a semiconductor device of one embodiment of the present invention.
Figure 22B:
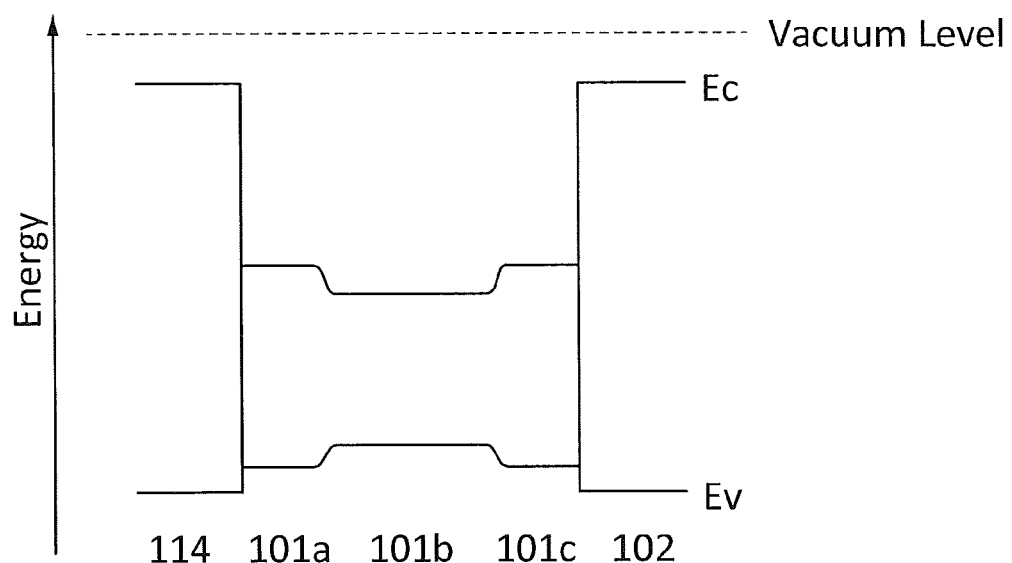
FIG. 22B illustrates a band.

FIG. 22B illustrates a band structure. FIG. 22B shows a vacuum level (denoted by vacuum level), and an energy of the bottom of the conduction band (denoted by Ec) and an energy of the top of the valence band (denoted by Ey) of each of the layers.

Here, a mixed region of the semiconductor layer 101a and the semiconductor layer 101b might exist between the semiconductor layer 101a and the semiconductor layer 101b. Furthermore, a mixed region of the semiconductor layer 101b and the semiconductor layer 101c might exist between the semiconductor layer 101b and the semiconductor layer 101c. The mixed region has a low density of interface states. For that reason, the stack including the semiconductor layers 101a, 101b, and 101c has a band structure where energy at each interface and in the vicinity of the interface is changed continuously (continuous junction).

Note that FIG. 22B illustrates the case where the Ec of the semiconductor layer 101a and the Ec of the semiconductor layer 101c are equal to each other; however, they may be different from each other. For example, Ec of the semiconductor layer 101c may be higher than Ec of the semiconductor layer 101a.

At this time, electrons mainly move not in the semiconductor layer 101a and the semiconductor layer 101c but in the semiconductor layer 101b. As described above, when the interface state density at the interface between the semiconductor layer 101a and the semiconductor layer 101b and the interface state density at the interface between the semiconductor layer 101b and the semiconductor layer 101c are lowered, the on-state current of the transistor can be increased without interruption of the movement of electrons in the semiconductor layer 101b.

As illustrated in examples of FIG. 16D, FIG. 16E, FIG. 17C, FIG. 18C, and FIG. 19C, the gate electrode 103 covers the top surface and the side surface of the semiconductor layer 101b with the gate insulating film 102 provided therebetween, or with the gate insulating film 102 and the semiconductor layer 101c provided therebetween. Furthermore, the semiconductor layer 101b can be electrically surrounded by an electric field of the gate electrode 103 (a structure in which a semiconductor is electrically surrounded by an electric field of a conductor is referred to as a surrounded channel (s-channel) structure). Therefore, a channel is formed in the entire semiconductor layer 101b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the transistor includes a region where a channel length is preferably less than or equal to 40 nm, more preferably less than or equal to 30 nm, and still more preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

A semiconductor to be the semiconductor layer 101a, a semiconductor to be the semiconductor layer 101b, and a semiconductor to be the semiconductor layer 101c are formed by a sputtering method, a CVD method, an MBE method, a PLD method, an ALD method, or the like.

Note that in the case where In—Ga—Zn oxide layers formed by an MOCVD method are used as the semiconductor to be the semiconductor layer 101a, the semiconductor to be the semiconductor layer 101b, and the semiconductor to be the semiconductor layer 101c, trimethylindium, trimethylgallium, dimethylzinc, and the like may be used as source gases. The source gas is not limited to the combination of these gases, triethylindium or the like may be used instead of trimethylindium. Triethylgallium or the like may be used instead of trimethylgallium. Diethylzinc or the like may be used instead of dimethylzinc.

<Insulating Film 114 and Conductive Layer 104>

One of the conductive layer 104a and the conductive layer 104b serves as a source electrode and the other serves as a drain electrode.

The conductive layer 104a and the conductive layer 104b are each formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The conductive layer 104a and the conductive layer 104b can be formed by, for example, a sputtering method, a CVD method (including a thermal CVD method, an MOCVD method, a PECVD method, and the like), an MBE method, an ALD method, or a PLD method.

The gate electrode 103 can be formed using, for example, a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used for the gate electrode 103. Further, the gate electrode 103 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The gate electrode 103 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 103 and the gate insulating film 102. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 101, specifically an In—Ga—Zn-based oxynitride semiconductor film having a nitrogen concentration higher than or equal to 7 at. %, is used.

The gate electrode 103 can be formed by a sputtering method, a CVD method (including a thermal CVD method, an MOCVD method, a PECVD method, and the like), an MBE method, an ALD method, a PLD method, or the like.

For the conductive layer 105, a material similar to that used for the gate electrode 103 may be used. A voltage lower or higher than that of the source electrode may be applied to the conductive layer 105 so that the threshold voltage of the transistor may be shifted in the positive or negative direction. By shifting the threshold voltage of the transistor in the positive direction, a normally-off transistor in which the transistor is in a non-conduction state (off state) even when the gate voltage is 0 V can be achieved in some cases. Note that the voltage applied to the conductive layer 105 may be variable or fixed. In the case where a variable voltage is applied to the conductive layer 105, a circuit for controlling the voltage may be connected to the conductive layer 105. Furthermore, the conductive layer 105 may be connected to the gate electrode 103.

The insulating film 113 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 113 can be formed by a sputtering method, a CVD method (including a thermal CVD method, an MOCVD method, a PECVD method, and the like), an MBE method, an ALD method, a PLD method, or the like, for example.

Here, the transistor may include a layer 119a and a layer 119b, as illustrated in FIGS. 17D and 18D.

In FIG. 17D, the layers 119a and 119b are in contact with the top surface of the insulating film 114, the side surface of the semiconductor layer 101a, and the side surface and the top surface of the semiconductor layer 101b. The conductive layer 104a is in contact with a top surface of the layer 119a, and the conductive layer 104b is in contact with the top surface of the layer 119b.

In FIG. 18D, the layers 119a and 119b are in contact with the top surface of the semiconductor layer 101b. The conductive layer 104a is in contact with the top surface of the layer 119a, and the conductive layer 104b is in contact with the top surface of the layer 119b.

The layers 119a and 119b may be formed using a transparent conductor, an oxide semiconductor, a nitride semiconductor, or an oxynitride semiconductor, for example. The layers 119a and 119b may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon.

The layers 119a and 119b may have a property of transmitting visible light. Alternatively, the layers 119a and 119b may have a property of not transmitting visible light, ultraviolet light, infrared light, or X-rays by reflecting or absorbing it. In some cases, such a property can suppress a change in electrical characteristics of the transistor due to stray light.

The layers 119a and 119b may preferably be formed using a layer which does not form a Schottky barrier with the semiconductor layer 101b or the like. Accordingly, on-state characteristics of the transistor can be improved.

Note that the layers 119a and 119b preferably have higher resistance than the conductive layers 104a and 104b, depending on circumstances. The layers 119a and 119b may preferably be formed using a layer having a resistance lower than that of the channel of the transistor. For example, the layers 119a and 119b may have a resistivity higher than or equal to 0.1 $\Omega \cdot cm$ and lower than or equal to 100 $\Omega \cdot cm$, higher than or equal to 0.5 $\Omega \cdot cm$ and lower than or equal to 50 $\Omega \cdot cm$, or higher than or equal to 1 $\Omega \cdot cm$ and lower than or equal to 10 $\Omega \cdot cm$. The layers 119a and 119b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 119a and 119b (e.g., the layer on the drain side) may preferably be provided.

The protection circuit 401 includes a first transistor and a second transistor.

In the first transistor, resistance between a drain and a source is preferably decreased as a voltage between the drain and the source increases. In addition, in the first transistor, voltage and current between the drain and the source is denoted by $V_{ds}$ and $I_{ds}$, respectively, a voltage between a gate and the source is denoted by $V_{gs}$. Here, the channel width is denoted by W, the channel length is denoted by L, and the resistance of the transistor is denoted by R. When $V_{gs}$ is 0V and $V_{ds}$ is 3V, R×W of the first transistor is preferably less than or equal to $10^6 [\Omega \cdot m]$, further preferably less than or equal to $10^5 [\Omega \cdot m]$, still further preferably less than or equal to $10^4$[Ω·m], yet still further preferably less than or equal to $10^2$[Ω·m], even further preferably less than or equal to 1[Ω·m].

In contrast, in the second transistor, decrease in resistance between a drain and a source due to increase in a voltage between the drain and the source is preferably small. Thus, in the second transistor, when $V_{gs}$ is 0V and $V_{ds}$ is 3V, R×W is preferably greater than or equal to $10^6$[Ω·m], for example.

In addition, in the case where a gate voltage is not applied, response to application of a voltage between the drain and the source of the first transistor, i.e., the rise of current is preferably quick as compared with the second transistor.

Here, the semiconductor layer 101b receives an electric field of the gate electrode 103 not only from the top surface but also from the side surface. In addition, the semiconductor layer 101b is strongly influenced by an electric field from the side surface as the width of the semiconductor layer 101b, i.e., an apparent channel width is small. Therefore, the width of the semiconductor layer 101b is decreased, whereby the effect of the gate electric field from the side surface can be increased. Accordingly, the effect of the gate electric field from the side surface can be decreased by increasing the width of the semiconductor layer 101. That is, in the s-channel structure, the gate electric field can be effectively strengthened by using the three-dimensional shape.

For example, the strength of the gate electric field is reduced appropriately, whereby current generated in the case where the high voltage caused by ESD is applied between the drain and the source can be easily discharged when no voltage is applied to the gate. In the first transistor, it is preferable that the gate electric field be reduced appropriately. The first transistor can be used for a discharge path in the case where the high voltage accompanied with ESD is applied. For example, the first transistor can be used as the semiconductor elements 213a, 214a, and 216 shown in Embodiment 1.

In contrast, in the second transistor, a gate electric field is preferably strengthened. The second transistor can be used as an element which has high resistance in the case where the high voltage caused by ESD is applied so that it prevents current from flowing into the integrated circuit 400. For example, the second transistor can be used for the semiconductor element 215 shown in the Embodiment 1.

Here, the channel width of the transistor of one embodiment of the present invention is adjusted, whereby the strength of the gate electric field in the channel region in the lateral direction can be adjusted. Here, the gate electric field of the first transistor for discharging current due to ESD is preferably weaker than that of the second transistor for preventing current from flowing to the integrated circuit 400. Furthermore, in the first transistor and the second transistor, the gate insulating films may be formed with the same thicknesses.

The first transistor includes a region where, for example, an apparent channel width, i.e., the width of the semiconductor layer 101b is preferably greater than or equal to 100 nm, more preferably greater than or equal to 200 nm, and still more preferably greater than or equal to 500 mm. In addition, the first transistor includes a region where the channel length is less than or equal to 1 pin, more preferably less than or equal to 500 nm, and still more preferably less than or equal to 100 nm. For example, the thickness of the gate insulating film is preferably greater than or equal to 1 nm and less than or equal to 40 nm, and more preferably greater than or equal to 3 nm and less than or equal to 20 nm.

Figure 20A:
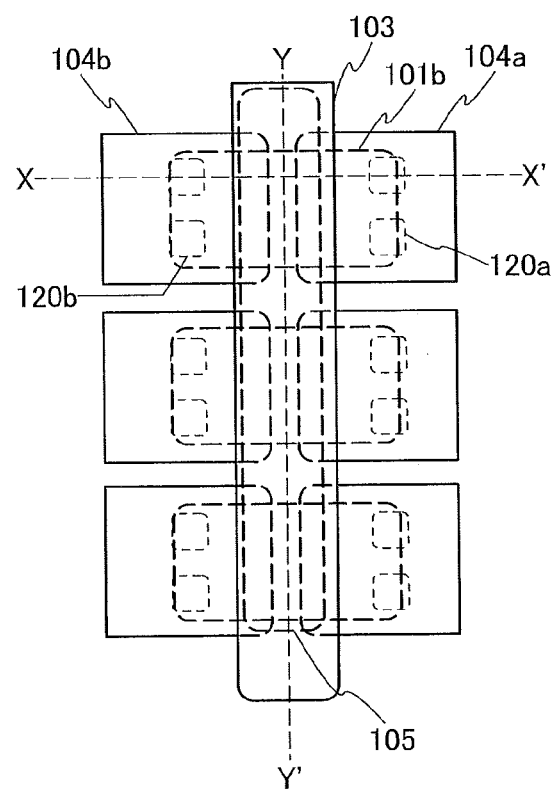
FIGS. 20A to 20C each illustrate a transistor of one embodiment of the present invention.
Figure 20C:
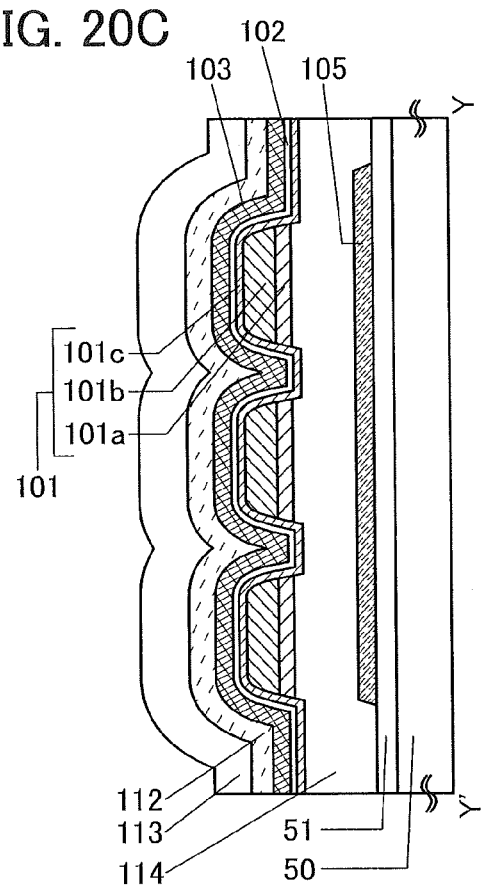
Figure 20B:
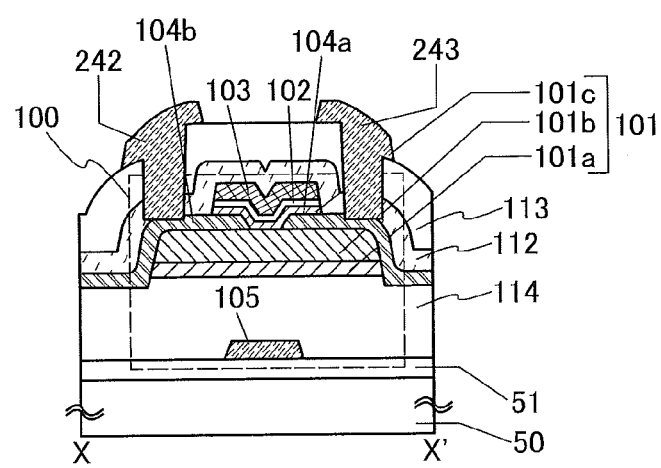

Here, a large current can preferably flow in the first transistor; thus, the resistance is preferably lower. Therefore, for example, the channel width of the first transistor is preferably large. As the first transistor, for example, a semiconductor element illustrated in FIGS. 20A to 20C may be used. FIGS. 20A to 20C illustrate an example where a plurality of island-shaped semiconductor layers 101b are connected in parallel. The resistance of the semiconductor element can be decreased by connecting the semiconductor layers 101b to each other in parallel. In FIGS. 20A to 20C, the first transistor includes a region where the width of one of island-shaped semiconductor layers 101b is preferably greater than or equal to 100 nm, more preferably greater than or equal to 200 nm, still more preferably greater than or equal to 500 nm. When the widths of island-shaped semiconductor layers 101b are denoted by Ws, Ws is preferably greater than or equal to 10 μm, more preferably greater than or equal to 100 μm, still more preferably greater than or equal to 1000 μm. In addition, when the channel length of the first transistor is denoted by L, Ws/L is preferably greater than or equal to 10, more preferably greater than or equal to 100, still more preferably greater than or equal to 1000, for example. Furthermore, the transistor in FIGS. 20A to 20C may include opening portions 120a and 120b provided in the insulating films 112 and 113. Furthermore, plugs 242 and 243 embedded in the opening portions 120a and 120b are preferably included.

The second transistor preferably has high resistance when a gate voltage is not applied. Thus, the gate electric field is preferably strengthened.

For example, the second transistor includes a region where the channel width is preferably less than or equal to 80 nm, more preferably less than or equal to 60 nm, and still more preferably less than or equal to 40 nm. In addition, the channel width of the first transistor is preferably greater than or equal to 100 nm, more preferably greater than or equal to 200 nm, still more preferably greater than or equal to 500 nm. For example, the thickness of the gate insulating film is preferably greater than or equal to 1 nm and less than or equal to 40 nm, and more preferably greater than or equal to 3 nm and less than or equal to 20 nm.

The threshold voltage of the second transistor is preferably greater than or equal to 0.2V and less than or equal to 2V, and more preferably greater than or equal to 0.5V and less than or equal to 1V.

By application of voltage to the conductive layer 105, punch-through can be suppressed in some cases. Thus, for example, it is preferable that the conductive layer 105 be provided in the second transistor, and voltage be applied thereto so that the gate electric field is strengthened. Furthermore, both of the first transistor and the second transistor may have the conductive layer 105. In that case, for example, each of potentials applied to the first transistor and the second transistor is adjusted so that the electric field given to the second transistor by the conductive layer 105 in the second transistor is stronger than that given to the first transistor by the conductive layer 105 in the first transistor. Note that in each of the top views illustrated in FIGS. 16A to 20C, end portions of the conductive layer 105 are positioned on inner sides than those of the gate electrode 103, but the end portions of the conductive layer 105 may be positioned on the outer sides than those of the gate electrode 103.

[Layout Example of Transistors]

Figure 21:
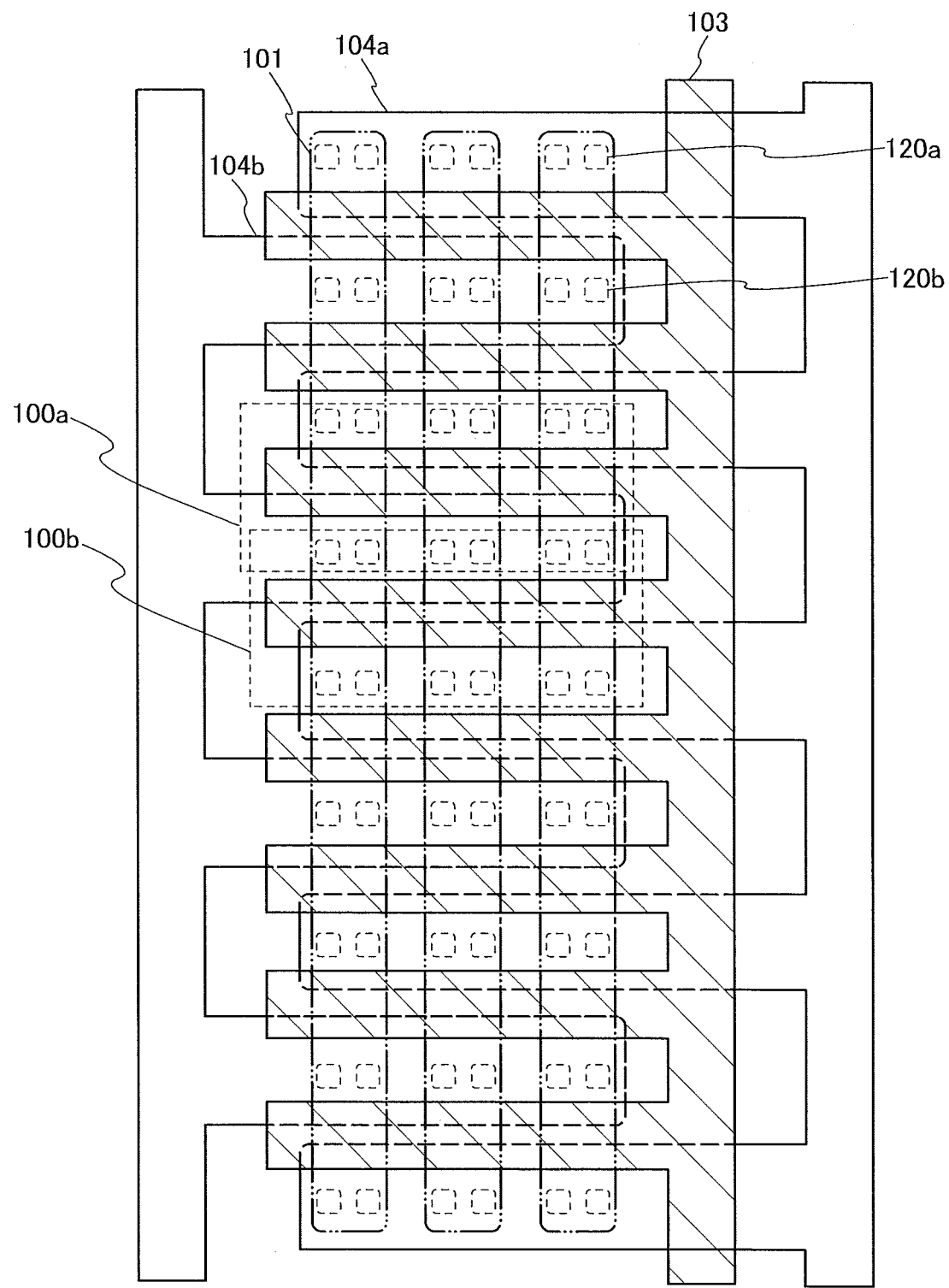
FIG. 21 illustrates transistors of one embodiment of the present invention.

FIG. 21 illustrates an example of a layout where a plurality of transistors are connected in parallel. In a layout of FIG. 21, the gate electrode 103 and the conductive layers 104a and 104b are formed in a comb shape. The conductive layers 104a and 104b serve as a source electrode and a drain electrode of the transistor. The plurality of transistors shown in FIG. 21 may have the opening portions 120a and 120b. For the details of the opening portions 120a and 120b, the description of FIGS. 18A to 18D can be referred to, for example.

In FIG. 21, for example, the transistor 100a and the transistor 100b are connected in parallel, and share the conductive layer 104b. In this manner, the transistors adjacent vertically share the conductive layer, whereby the area of the protection circuit 401 can be reduced. In addition, the length of the conductive layer can be shortened, wiring resistance of the conductive layers 104a and 104b can be reduced. The transistor 100a and the transistor 100b share the semiconductor layer 101. This embodiment can be combined with any of the other embodiments disclosed in this specification as appropriate.

Note that in this specification and the like, a transistor can be formed using any of a variety of substrates, for example. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. Specifically, when a transistor is formed using a semiconductor substrate, a single crystal substrate, an SOI substrate, or the like, the transistor can have few variations in characteristics, size, shape, or the like, high current supply capability, and a small size. By forming a circuit with the use of such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

In this specification and the like, for example, transistors with a variety of structures can be used as a transistor, without limitation to a certain type. For example, a transistor including a single crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned can be used. In the case of using the TFT, there are various advantages. For example, since the TFT can be formed at temperature lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Alternatively, transmission of light in a display element can be controlled by using the transistor formed using the light-transmitting substrate. Alternatively, part of a film included in the transistor can transmit light because of a small thickness of the transistor. Therefore, the aperture ratio can be improved.

Note that in this specification and the like, for example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (the reliability can be improved). Alternatively, with the multi-gate structure, drain-source current does not change much even if drain-source voltage changes when the transistor operates in a saturation region, so that a flat slope of voltage-current characteristics can be obtained. By utilizing the flat slope of the voltage-current characteristics, an ideal current source circuit or an active load having an extremely large resistance can be realized. Accordingly, a differential circuit, a current mirror circuit, or the like having excellent properties can be realized.

Note that a transistor with a structure where gate electrodes are formed above and below a channel can be used, for example. With the structure where the gate electrodes are formed above and below the channel, a circuit structure where a plurality of transistors are connected in parallel is provided. Thus, a channel region is increased, so that the amount of current can be increased. Alternatively, by using the structure where gate electrodes are formed above and below the channel, a depletion layer can be easily formed, so that subthreshold swing can be improved.

Note that as a transistor, for example, it is possible to use a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like. A transistor with any of a variety of structures such as a planar type, a FIN-type, a Tri-Gate type, a top-gate type, a bottom-gate type, a double-gate type (with gates above and below a channel), and the like can be used.

Note that for example, a transistor with a structure where a source electrode or a drain electrode overlaps with a channel region (or part of it) can be used as a transistor. By using the structure where the source electrode or the drain electrode overlaps with the channel region (or part of it), unstable operation due to accumulation of electric charge in part of the channel region can be prevented.

Note that for example, a transistor with a structure where an LDD region is provided can be used as a transistor. By providing the LDD region, the amount of off-state current can be reduced or the withstand voltage of the transistor can be increased (reliability can be improved). Alternatively, by providing the LDD region, drain-source current does not fluctuate very much even when drain-source voltage fluctuates when the transistor operates in the saturation region, so that a flat slope of voltage-current characteristics can be obtained.

Embodiment 3

In this embodiment, an example of a semiconductor device including the protection circuit and the integrated circuit in one embodiment of the present invention is described.

[Integrated Circuit 400]

FIG. 22 illustrates an example of a semiconductor device 300. The semiconductor device 300 includes the integrated circuit 400 and the protection circuit 401. The integrated circuit 400 includes a semiconductor element. Examples of the semiconductor element are preferably a semiconductor material such as silicon, germanium, gallium, and arsenic; compound semiconductor material containing silicon, germanium, gallium, arsenic, or aluminum; organic semiconductor material; and oxide semiconductor materials.

The integrated circuit 400 preferably includes a transistor. The transistor included in the integrated circuit 400 includes a region where a channel length is preferably less than or equal to 60 nm, more preferably less than or equal to 40 nm, and still more preferably less than or equal to 20 nm. The integrated circuit 400 preferably includes a transistor including silicon and a transistor including an oxide semiconductor film.

As the protection circuit 401, the protection circuit 401 in Embodiment 1 can be used. The protection circuit 401 preferably includes any of the semiconductor elements in Embodiment 1 and Embodiment 2. The protection circuit 401 preferably includes any of the transistors of one embodiment of the present invention shown in Embodiment 1 and Embodiment 2.

The protection circuit 401 preferably includes the transistor including an oxide semiconductor film.

[Example of Stacked Structure of Circuit]

Figure 23:
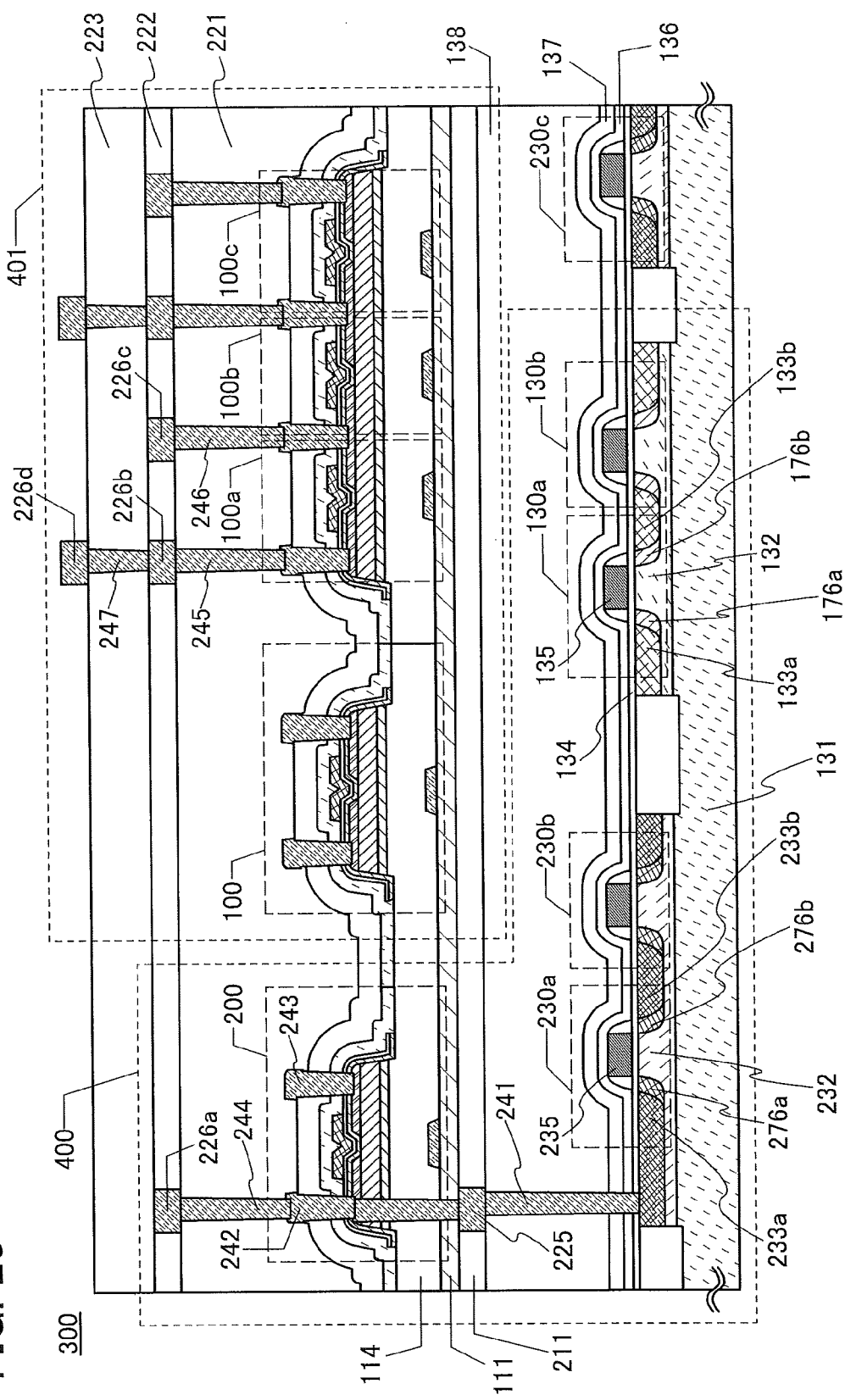
FIG. 23 is a cross-sectional view illustrating a semiconductor device of one embodiment of the present invention.

An example of a cross-sectional structure of the semiconductor device 300 illustrated in FIG. 22A is illustrated in FIG. 23. In an example illustrated in FIG. 23, the integrated circuit 400 includes n-channel transistors 130a and 130b which include silicon, and p-channel transistors 230a to 230c which include silicon. The integrated circuit 400 may include an n-channel transistor 200 including an oxide semiconductor film. The protection circuit 401 includes an n-channel transistors 100, and 100a to 100c including oxide semiconductor films. The transistors 100a to 100c are connected in parallel. For example, as illustrated in FIG. 23, in each of the adjacent transistors 100a and 100b and the adjacent transistors 100b and 100c, the source electrode and the drain electrode are preferably shared.

Furthermore, a p-channel transistor 230c including silicon is illustrated in FIG. 23. The transistor 230c may serve as part of the protection circuit 401, for example. That is, the protection circuit 401 may include the transistor 230c.

As illustrated in FIG. 23, the area of the semiconductor device 300 can be reduced by stacking the transistors including an oxide semiconductor film over the transistors including silicon.

The transistors 130a and 130b are provided over a semiconductor substrate 131 and includes a semiconductor layer 132, a gate insulating film 134, a gate electrode 135, and low-resistance layers 133a and 133b serving as source and drain regions. Furthermore, the transistors 130a and 130b preferably includes insulating films serving as sidewalls. The transistors 130a and 130b may include regions 176a and 176b serving as lightly doped drain (LDD) regions.

The transistors 230a to 230c are formed over the semiconductor substrate 131 and includes the semiconductor layer 232, the gate insulating film 134, the gate electrode 235, and low-resistance layers 233a and 233b serving as source and drain regions. The transistors 230a to 230c may have insulating films serving as sidewalls. The transistors 230a to 230c may include regions 276a and 276b serving as lightly doped drain (LDD) regions.

In FIG. 23, insulating films 136, 137 and 138 are provided to cover transistors 130a, 130b, and the transistors 230a to 230c. In addition, a plug 241 or the like may be embedded in the insulating films 136 to 138. In a manufacturing process of the semiconductor device, the insulating film 136 serves as a protective film when heat treatment is performed to activate an element imparting conductivity that is added to the low-resistance layers 133a and 133b. The insulating film 136 is not necessarily provided. In the case where a silicon-based semiconductor material is used for the semiconductor layer 132, the insulating film 137 preferably contains hydrogen. When the insulating film 137 containing hydrogen is provided over the transistor 130 and heat treatment is performed, dangling bonds in the semiconductor layer 132 are terminated by hydrogen contained in the insulating film 137, whereby the reliability of the transistor 130 can be improved. In addition, the insulating film 138 serves as a planarization film for eliminating a level difference caused by the transistor 130 or the like underlying the insulating film 138. The top surface of the insulating film 138 may be planarized by planarization treatment using a chemical mechanical polishing (CMP) method or the like in order to increase the planarity.

An insulating film 211 and a barrier film 111 are provided over the insulating film 138. A conductive layer 225 or the like may be embedded in the insulating film 211. The barrier film 111 has a function of inhibiting water and hydrogen of layers under the barrier film 111 from diffusing upward. The barrier film 111 preferably has low oxygen permeability.

The transistor 100, the transistors 100a to 100c, and the transistor 200 are provided over the barrier film 111. The description of the transistor 100 described in the above embodiments can be referred to for the transistor 100, the transistors 100a to 100c, and the transistor 200.

Insulating films 221, 222, and 223 may be provided to cover the transistor 100, the transistors 100a to 100c, and the transistor 200.

The insulating film 221 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. In the case where the insulating film 221 is formed using an organic insulating material such as an organic resin, a coating method such as a spin coating method may be used. After the insulating film 221 is formed, a top surface thereof is preferably subjected to planarization treatment.

The semiconductor device 300 may include the plugs 242, 243, and the like electrically connected to the source electrodes and the drain electrodes of the transistor 100, the transistors 100a to 100c, and the transistor 200. The semiconductor device 300 may include the plug 242, plugs 244, 245, 246, and 247 which are connected to the plugs 242, 243, or the like, and conductive layers 226a to 226d or the like. The semiconductor device 300 may include plugs 244, 245, and 246 connected to the plugs 242, 243, and the like; a plug 247; conductive layers 226a to 226d; or the like.

In addition, as described in Embodiment 2, the channel width of the transistor used for the protection circuit 401 is preferably large. Since the area of the transistor is increased when the channel width of the transistor is increased, the area of the protection circuit 401 is increased. For example, the protection circuit 401 is preferably stacked over the transistor including silicon, in which case increase in the area of the semiconductor device 300 might be suppressed even when the channel width of the transistor included in the protection circuit 401 is increased.

Since a large current flows in the protection circuit 401, a large amount of heat is generated in some cases. Here, for example, increase in width of a wiring connected to the protection circuit 401 suppresses generation of heat, and enhances heat dissipation in some cases. In addition, a wiring layer is preferably further stacked over the protection circuit, in which case increase in the area of the semiconductor device 300 is suppressed even when the wiring is widened, for example.

Since the transistor including an oxide semiconductor film has a high resistance to short-channel effects, favorable on-off characteristics can be obtained even when the gate insulating with a thickness of approximately 10 nm is used. Thus, the gate insulating film of the transistor 200 used in the integrated circuit which is required to operate at high speed and that of the transistor 100 used in the protection circuit portion which requires high withstand voltage may be formed in the same thickness. When the gate insulating films of the integrated circuit and the protection circuit portion have the same thickness, the process for manufacturing the gate insulating films can be simplified. Alternatively, the gate insulating film of the protection circuit portion that requires high withstand voltage may be formed to be thicker than that of the integrated circuit.

Here, various circuits can be used for the integrated circuit 400. The integrated circuit 400 may include a memory device, for example. In addition, the integrated circuit 400 may include a central processing unit (CPU), for example.

In addition, for example, the integrated circuit 400 and the protection circuit 401 may be mounted on an RF (radio frequency) tag. The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. In order that an RFID tag is used for such application, extremely high reliability is needed.

[Configuration Example of RF Tag]

Figure 24:
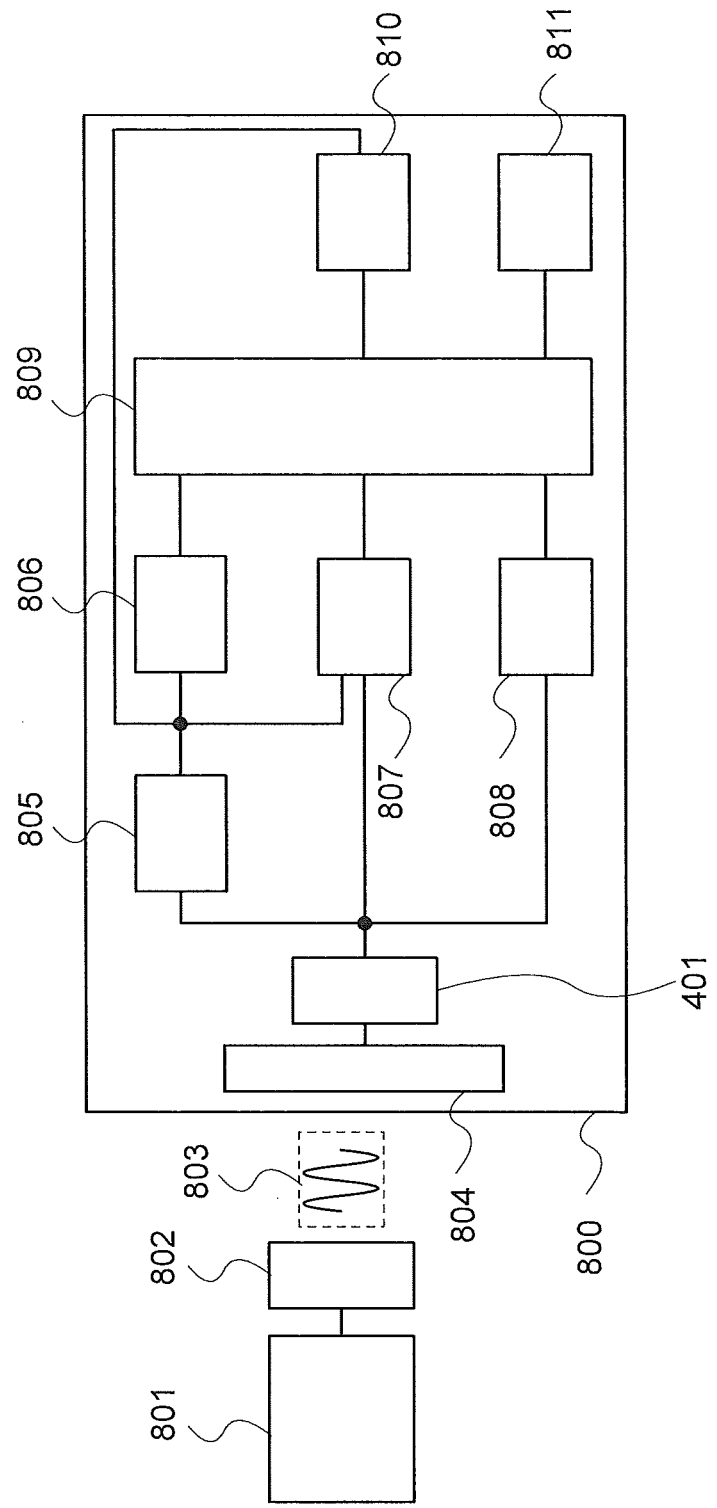
FIG. 24 illustrates a configuration example of an RF tag.

A configuration example of the RF tag is described with reference to FIG. 24. FIG. 24 is a block diagram illustrating a configuration example of an RF tag.

As shown in FIG. 24, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. The protection circuit 401 is provided between the antenna 804 and the rectifier circuit 805 and between the demodulation circuit 807 and the modulation circuit 808. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electric wave method by which communication is performed using an electric wave. Any of these methods can be used in the RF tag 800 described in this embodiment.

Note that a plurality of the protection circuits 401 may be provided in the RF tag 800. For example, the protection circuits 401 may be provided between blocks included in the RF tag. For example, the protection circuits 401 may be provided between the rectifier circuit 805 and the constant voltage circuit 806, or between the logic circuit 809 and other circuits connected to the logic circuit 809, i.e., the constant voltage circuit 806, the demodulation circuit 807, the modulation circuit 808, the memory circuit 810, and the ROM 811.

Next, a structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that decision whether each circuit described above is provided or not can be made as appropriate as needed.

This embodiment can be combined with any of the other embodiments disclosed in this specification as appropriate.

Embodiment 4

[Structure of Oxide Semiconductor Film]

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed with a transmission electron microscope (TEM), a plurality of crystal parts are seen. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution IBM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution IBM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, with a focus on lattice fringes in the high-resolution TEM image, lattice fringes in which the lattice spacing therebetween is greater than or equal to 0.28 nm and less than or equal to 0.30 nm each correspond to the a-b plane of the $InGaZnO_4$ crystal.

The density of an oxide semiconductor film might vary depending on its structure. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be combined with any of the other embodiments disclosed in this specification as appropriate.

Embodiment 5

In this embodiment, an example where a display device is used as the integrated circuit 400 described in the above embodiments is described.

Figure 25A:
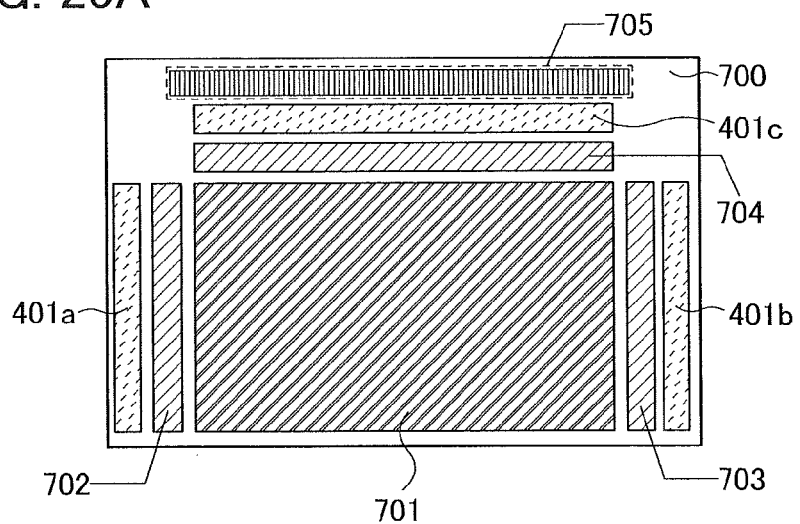
FIGS. 25A to 25C each illustrate an example of a display device.
Figure 25B:
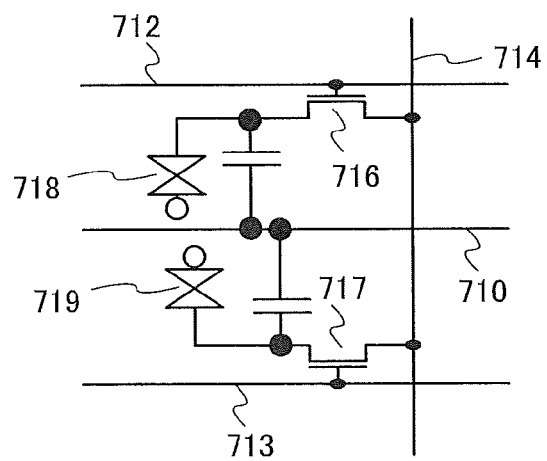
Figure 25C:
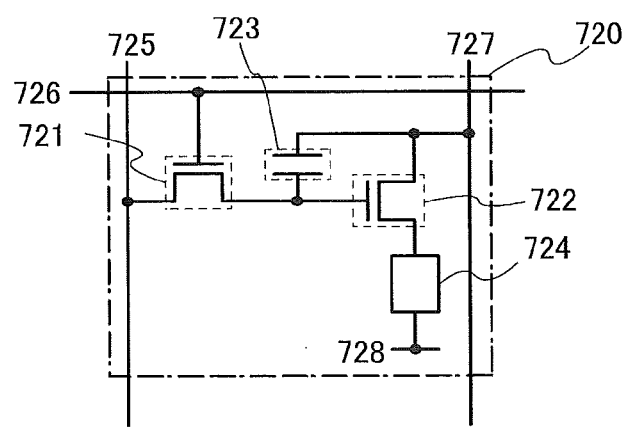

FIG. 25A is a top view of the display panel of one embodiment of the present invention. FIG. 25B is a circuit diagram illustrating a pixel circuit that can be used in the case where a liquid crystal element is used in a pixel in the display panel of one embodiment of the present invention. FIG. 25C is a circuit diagram illustrating a pixel circuit that can be used in the case where an organic EL element is used in a pixel in the display panel of one embodiment of the present invention.

As a transistor disposed in a pixel portion, a transistor including an oxide semiconductor film may be used, for example. In addition, the transistor including an oxide semiconductor film may be used for part of the driver circuit that can be formed using an n-channel transistor. By using the transistor including an oxide semiconductor film for the pixel portion or the driver circuit, a highly reliable display device can be provided.

FIG. 25A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels each including a display element are provided in matrix in respective regions in each of which the scan line and the signal line intersect with each other. The substrate 700 of the display device is connected to a timing control circuit (also referred to as a controller or a controller IC) or the like through a flexible printed circuit (FPC) terminal portion 705. The display device includes protection circuits 401a to 401c. The description of the protection circuit 401 described in the above embodiments can be referred to for the protection circuits 401a to 401c. Here, the protection circuits 401a to 401c may be connected to each of driver circuits, i.e., each of input portions of the first scan line driver circuit 702, the second scan line driver circuit 703, and the signal line driver circuit 704. Furthermore, the protection circuits 401a to 401c may be connected to the FPC terminal portion 705. That is, each of the protection circuits 401a to 401c may be provided between the FPC terminal portion 705 and each of the driver circuits. For example, each of the driver circuits are connected to the FPC terminal portion 705 through the protection circuits 401a to 401c.

In FIG. 25A, the first scan line driver circuit 702, the second scan line driver circuit 703, and the signal line driver circuit 704 can be formed by the same step as the transistor including an oxide semiconductor film included in each of the protection circuits 401a to 401c. Thus, the first scan line driver circuit 702, the second scan line driver circuit 703, and the signal line driver circuit 704, and the protection circuit 401 can be provided over the same substrate. Accordingly, the number of components such as a driver circuit which are provided outside are reduced, so that reduction in cost can be achieved. Furthermore, if the driver circuit and the protection circuit are provided outside the substrate 700, wirings would need to be extended and the number of wiring connections would increase. When the driver circuits are provided over the substrate 700, the number of wiring connections can be reduced. Consequently, an improvement in reliability or yield can be achieved.

[Liquid Crystal Panel]

FIG. 25B illustrates an example of a circuit configuration of the pixel. Here, a pixel circuit which is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that serves as a data line is shared by the transistors 716 and 717. The transistor including an oxide semiconductor film can be used as appropriate as each of the transistors 716 and 717. In the above manner, a highly reliable liquid crystal display panel can be provided.

A first pixel electrode layer is electrically connected to the transistor 716 and a second pixel electrode layer is electrically connected to the transistor 717. The first pixel electrode layer and the second pixel electrode layer are separated. There is no particular limitation on the shapes of the first pixel electrode layer and the second pixel electrode layer. For example, the first pixel electrode layer may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film serving as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 25B. For example, a switch, a resistor, a capacitor, a transistor, a sensor, a logic circuit, or the like may be added to the pixel illustrated in FIG. 25B.

<Organic EL Panel>

FIG. 25C illustrates another example of a circuit configuration of the pixel. Here, a pixel structure of a display panel using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 25C illustrates an applicable example of a pixel circuit. In this example, one pixel includes two n-channel transistors. Note that asn oxide semiconductor film is used for a channel formation region of an n-channel transistor. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistors including an oxide semiconductor film can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 25C. For example, a switch, a resistor, a capacitor, a sensor, a transistor, a logic circuit, or the like may be added to the pixel circuit illustrated in FIG. 25C.

In the case where the transistor including an oxide semiconductor film is used for the circuit shown in FIGS. 25A to 25C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light emitting element, or a light-emitting device include at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes serve reflective electrodes. For example, some or all of pixel electrodes are formed to contain aluminum, silver, or the like. In such a case, a memory circuit such as an SRAM can be provided under the reflective electrodes. Accordingly, power consumption can be further reduced.

At least part of this embodiment can be implemented in combination with any of the embodiments described in this specification as appropriate.

Embodiment 6

In this embodiment, as an example of the integrated circuit 400 in the above embodiments, the integrated circuit including an oxide semiconductor film is given.

Here, as described in the above embodiments, the semiconductor device 300 includes the integrated circuit 400 and the protection circuit 401. The protection circuit 401 includes the transistor including an oxide semiconductor film, e.g., the transistor 100.

Thus, the above structure is preferable because each of the integrated circuits described below can be formed in the same step as the transistor 100 and the like included in the protection circuit 401.

[CMOS Circuit]

Figure 26A:
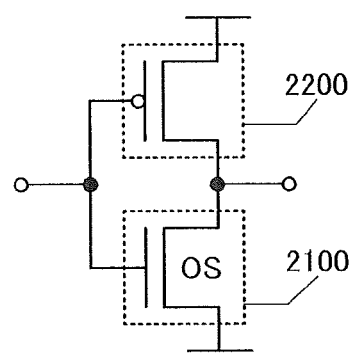
FIGS. 26A to 26D each illustrate an example of a circuit diagram.

A circuit diagram in FIG. 26A shows a configuration of a "CMOS circuit" in which the p-channel transistor 2200 and the n-channel transistor 2100 are connected in series and in which gates of them are connected to each other. The transistor including an oxide semiconductor film can be used for the transistor marked with a symbol "OS" in the drawing.

[Analog Switch]

Figure 26B:
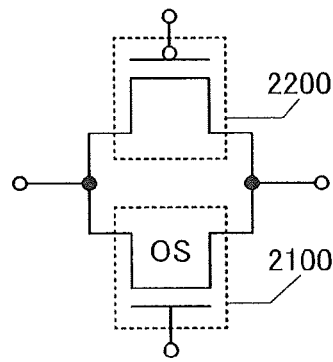

A circuit diagram in FIG. 26B shows a configuration in which sources of the transistors 2100 and 2200 are connected to each other and drains of the transistors 2100 and 2200 are connected to each other. With such a configuration, the transistors can serve as a so-called analog switch. The transistor including an oxide semiconductor film can be used for the transistor marked with a symbol "OS" in the drawing.

[Memory Device Example]

Next, an example where a memory device is used as the integrated circuit 400 is shown. Here, by using the transistor including an oxide semiconductor film in the memory device, excellent retention characteristics can be obtained.

Here, as described in the above embodiments, the semiconductor device 300 includes the integrated circuit 400 and the protection circuit 401. The protection circuit 401 includes the transistor including an oxide semiconductor film, e.g., the transistor 100.

Thus, the above structure is preferable because the transistor including an oxide semiconductor film can be formed in the same step as the transistor 100 included in the protection circuit 401 or the like can be formed through the same step.

An example of the memory device is illustrated in FIGS. 26A to 26D. The memory device illustrated in FIG. 26C includes a transistor 3200 using a first semiconductor material, a transistor 3300 including a second semiconductor material, and a capacitor 3400. Here, the first semiconductor material and the second semiconductor material can be selected as appropriate from a compound semiconductor material containing silicon, germanium, gallium, arsenic, or aluminum; organic semiconductor material; an oxide semiconductor material and the like. Here, an example where an oxide semiconductor is used as the second semiconductor material is shown.

Using an oxide semiconductor in the transistor 3300 can reduce the off-state current, so that stored data can be retained for a long time. In other words, a memory device in which refresh operation is not needed or the frequency of refresh operation is extremely low can be provided, which results in a sufficient reduction in power consumption.

Figure 26C:
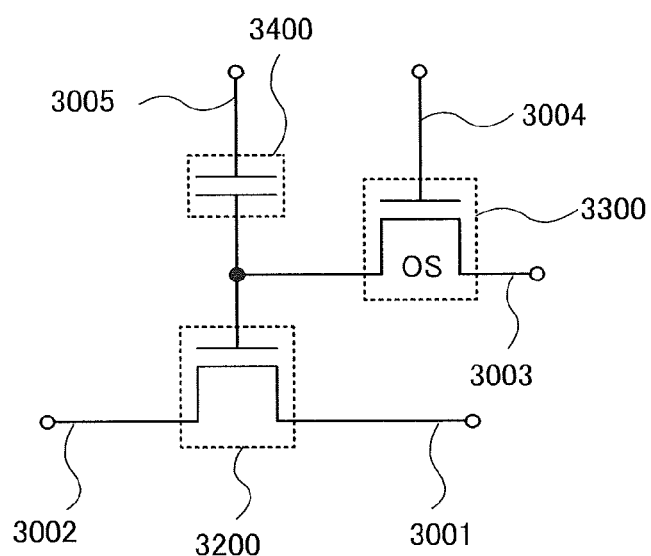

In FIG. 26C, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The memory device in FIG. 26C has a feature that the potential of the gate electrode of the transistor 3200 can be retained, and thus enables writing, retaining, and reading of data as follows Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$, at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$, may be applied to the fifth wiring 3005.

Figure 26D:
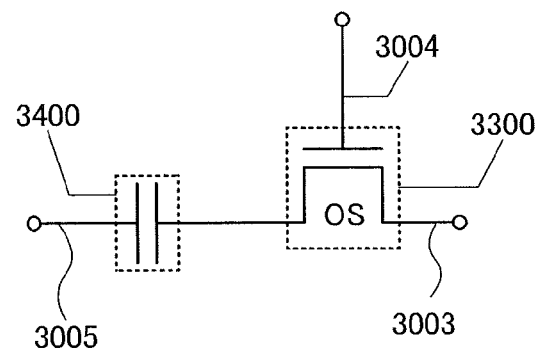

FIG. 26D illustrates a modification example of the structure in FIG. 26C. FIG. 26D is mainly different from FIG. 26C in that the transistor 3200 is not provided.

When including a transistor having a channel formation region formed using an oxide semiconductor and having extremely small off-state current, the memory device described in this embodiment can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the memory device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

At least part of this embodiment can be implemented in combination with any of the embodiments described in this specification as appropriate.

Embodiment 7

In this embodiment, an example where a CPU is used for the integrated circuit 400 as described in the above embodiments is shown.
[CPU]

Figure 27:
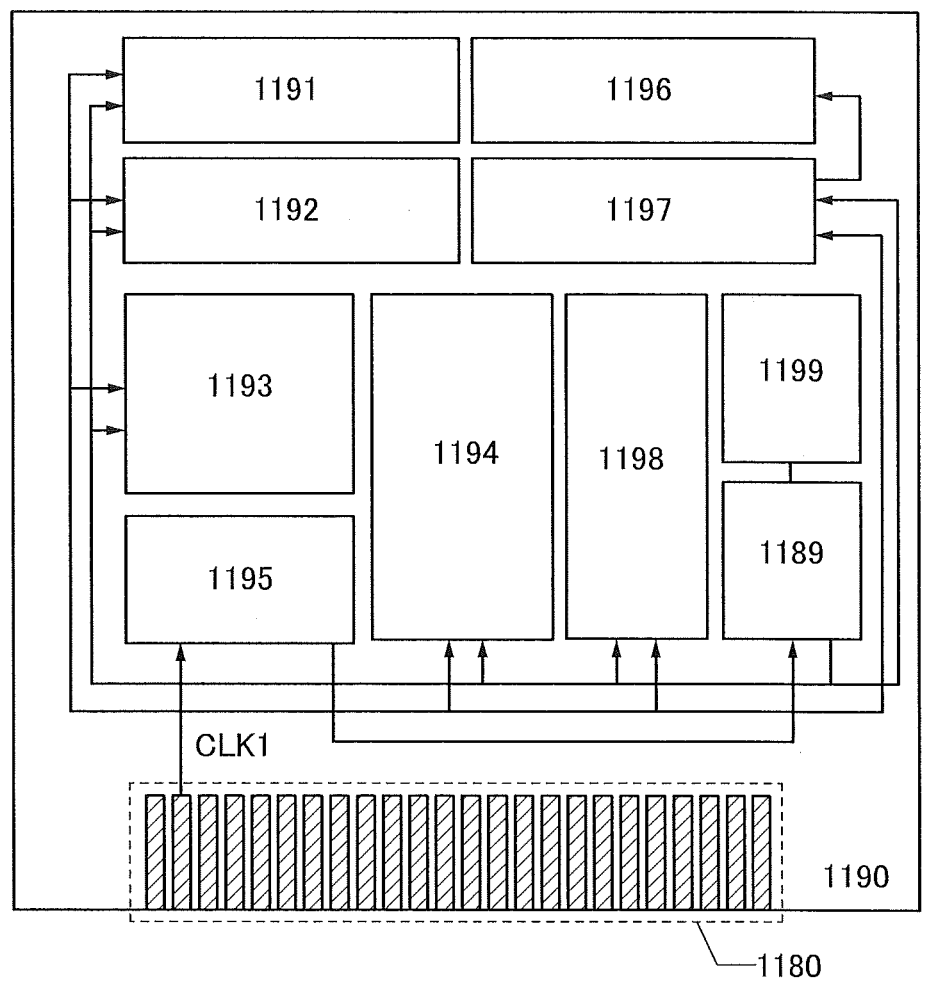
FIG. 27 illustrates a structure example of a CPU.

FIG. 27 is a block diagram illustrating a configuration example of a CPU.

The CPU illustrated in FIG. 27 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example of a simplified structure, and an actual CPU may have a variety of structures depending on the application. For example, the CPU may have the following configuration: a structure including the CPU illustrated in FIG. 27 or an arithmetic circuit is considered as one core; a plurality of the cores is included; and the cores operate in parallel. The number of bits that the CPU can process in an internal arithmetic circuit or in a data bus can be 8, 16, 32, or 64, for example.

FIG. 27 illustrates an example where an input signal from an external input/output device or peripheral circuits are input through an FPC 1180 is shown. The protection circuit 401 is preferably provided between the FPC 1180 and each of the circuits included in the CPU. In addition, although the description of the input path is not shown, a signal input to the FPC 1180 is input as appropriate to each of the circuits included in the CPU.

In addition, the protection circuit 401 may be provided between the circuits included in the CPU.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 27, a memory device is provided in the register 1196. The memory device in the above embodiments is used as the memory device of the register 1196.

In the CPU illustrated in FIG. 27, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

This embodiment can be combined with any of the other embodiments disclosed in this specification as appropriate.

Embodiment 8

In this embodiment, examples of an electronic device in which a semiconductor device of one embodiment of the present invention can be used will be described. Note that the semiconductor device of one embodiment of the present invention includes the protection circuit and the integrated circuit of one embodiment of the present invention.
[Example of Electronic Device]

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such electronic devices are shown in FIGS. 28A to 28F.

Figure 28A:
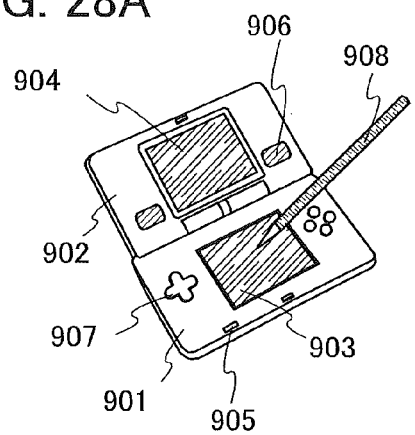
FIGS. 28A to 28F each illustrate an example of electronic devices.

FIG. 28A illustrates a portable game machine, which includes a housing 901, a housing 902, a display portion 903, a display portion 904, a microphone 905, a speaker 906, an operation key 907, a stylus 908, and the like. Although the portable game machine in FIG. 28A has the two display portions 903 and 904, the number of display portions included in a portable game machine is not limited to this.

Figure 28B:
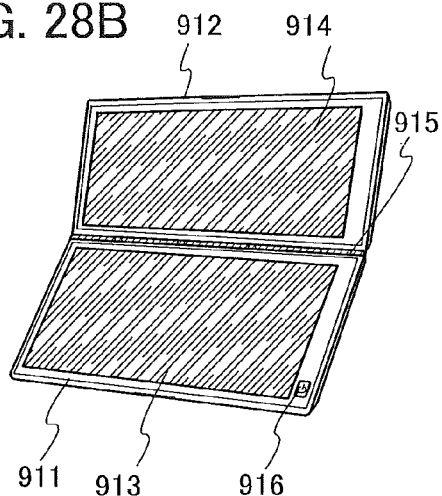

FIG. 28B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel area of a display device.

Figure 28C:
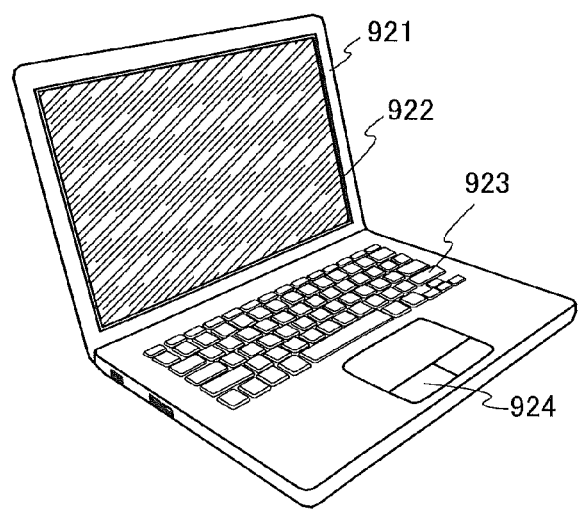

FIG. 28C illustrates a laptop personal computer, which includes a housing 921, a display portion 922, a keyboard 923, a pointing device 924, and the like.

Figure 28D:
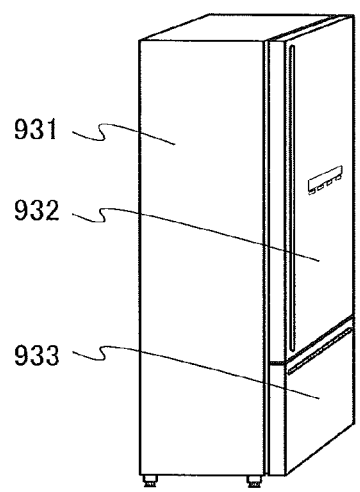

FIG. 28D illustrates an electric refrigerator-freezer, which includes a housing 931, a refrigerator door 932, a freezer door 933, and the like.

Figure 28E:
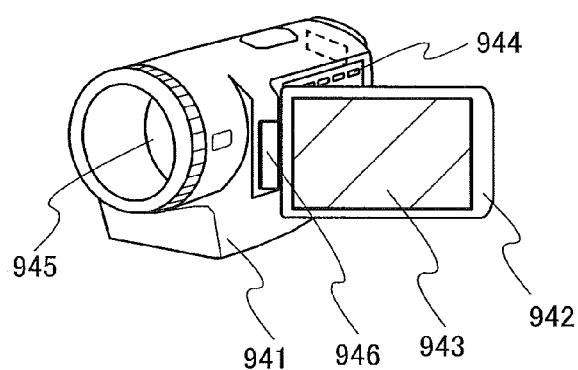

FIG. 28E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 28F:
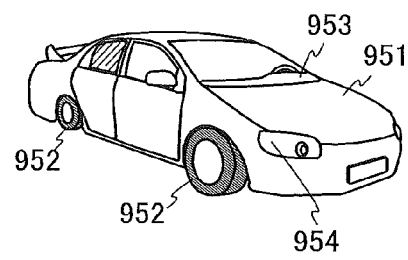

FIG. 28F illustrates a passenger car, which includes a car body 951, wheels 952, a dashboard 953, lights 954, and the like.

At least part of this embodiment can be implemented in combination with any of the embodiments described in this specification as appropriate.

Embodiment 9

In this embodiment, application examples of an RF tag of one embodiment of the present invention are described with reference to FIGS. 29A to 29F.

[Application Examples of RF Tag]

Figure 29A:
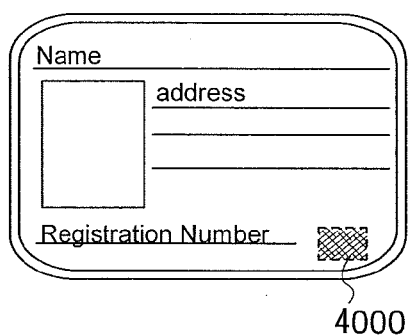
FIGS. 29A to 29F each illustrate usage examples of an RFID tag.
Figure 29B:
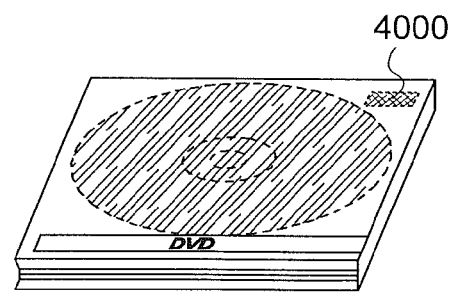
Figure 29C:
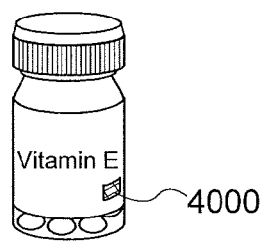
Figure 29D:
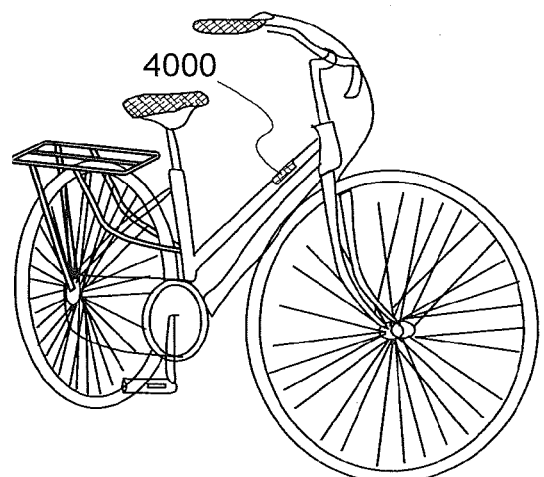
Figure 29E:
Figure 29F:
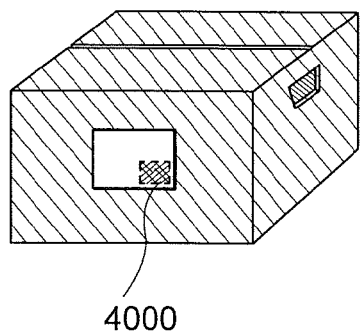

The RF tag is widely used and can be provided for, for example, products such as bills, coins, securities, bearer bonds, documents (e.g., driver's licenses or resident's cards, see FIG. 29A), packaging containers (e.g., wrapping paper or bottles, see FIG. 29C), recording media (e.g., DVD software or video tapes, see FIG. 29B), vehicles (e.g., bicycles, see FIG. 29D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 29E and 29F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 can be reduced in size, thickness, and weight, it can be fixed to a product without spoiling the design of the product. Further, bills, coins, securities, bearer bonds, documents, or the like can have an identification function by being provided with the RF tag 4000, and the identification function can be utilized to prevent counterfeiting. Moreover, the efficiency of a system such as an inspection system can be improved by providing the RF tag for packaging containers, recording media, personal belongings, foods, clothing, household goods, electronic appliances, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

At least part of this embodiment can be implemented in combination with any of the embodiments described in this specification as appropriate.

Example 1

In this example, transistors of one embodiment of the present invention were fabricated and the electrical characteristics thereof were evaluated. As the transistor, a transistor having cross-sectional structure illustrated in FIGS. 18A to 18D is used. Note that the transistor did not include the conductive layer 105.

[Formation of Transistor]

A method for fabricating the transistor is described below.

A silicon wafer was prepared as the substrate 50. Next, the insulating film 51 was formed on a silicon wafer. The insulating film 51 had a stacked-layer structure of a silicon oxide film and a silicon oxynitride film. The silicon oxide film was formed to a thickness of 100 nm by thermal oxidation, and the silicon oxynitride film was formed to a thickness of 300 nm by a PECVD method. The detail of the deposition condition of the silicon oxynitride film is shown in (1) of Table 1. After formation of the insulating film 51, planarization treatment was performed by a CMP method. After that, heat treatment was performed at 450° C. for 1 hour.

TABLE 1

| | | |
|---|---|---|
| (1) | Insulating film 51 (Silicon Oxynitride) | Substrate temperature = 100° C. Gas flow rate = silane (2 sccm), nitrous oxide (800 sccm) Pressure = 40 Pa Electric power (RF) = 50 W (27 MHz) |
| (2) | Implantation of oxygen ions | Acceleration voltage = 60 kV Dose = $2.0 \times 10^{16}$ ions/cm$^2$ Tilt angle = 7°, Twist angles = 72° |
| (3) | First semiconductor film | In:Ga:Zn = 1:3:4 target Gas flow rate = argon 40 (sccm), oxygen 5 (sccm) |

TABLE 1-continued

| | | |
|---|---|---|
| (4) | Second semiconductor film | Pressure = 0.4 Pa<br>Electric power(DC) = 0.5 kW<br>Distance between substrate and target = 60 mm<br>Substrate temperature = 200° C.<br>In:Ga:Zn = 1:1:1 target<br>Gas flow rate = argon (30 sccm), oxygen (15 sccm)<br>Pressure = 0.4 Pa<br>Electric power(DC) = 0.5 kW<br>Distance between substrate and target = 60 mm<br>Substrate temperature = 300° C. |

Next, oxygen ions ($^{16}O^+$) were implanted by an ion implantation method. The implantation conditions are shown in (2) of Table 1.

Next, a first semiconductor film to be the semiconductor layer 101a was Ruined over the insulating film 51. As the first semiconductor film, a 10-nm-thick In—Ga—Zn oxide film was formed by a sputtering method using a polycrystalline In—Ga—Zn oxide target having an atomic ratio of In:Ga:Zn=1:3:4. The detail of the deposition conditions is shown in (3) of Table 1.

Subsequently, a second semiconductor film to be the semiconductor layer 101b was formed. As the second semiconductor film, a 40-nm-thick In—Ga—Zn oxide film was formed by a sputtering method using a polycrystalline In—Ga—Zn oxide target having an atomic ratio of In:Ga:Zn=1:1:1. The detail of the deposition conditions is shown in (4) of Table 1.

Next, the heat treatment was performed at 450° C. for 1 hour in a nitrogen atmosphere and heat treatment was subsequently performed at 450° C. for 1 hour in an oxygen atmosphere in the same treatment chamber.

Next, a tungsten film is formed to a thickness of 15 nm over the semiconductor layer 101b. The tungsten film was formed by a sputtering method. The detail of the deposition conditions is shown in (5) of Table 2.

TABLE 2

| | | |
|---|---|---|
| (5) | Hard mask | Target: tungsten<br>Gas flow: argon (flow rate: 80 sccm)<br>Pressure = 0.8 Pa<br>Electric power (DC) = 1 kW<br>Distance between substrate and target = 60 mm<br>Substrate temperature = approximately 130° C. |
| (6) | Third semiconductor film | In:Ga:Zn = 1:3:2 target<br>Gas flow: argon (30 sccm), oxygen (15 sccm)<br>Pressure = 0.4 Pa<br>Electric power (DC) = 0.5 kW<br>Distance between substrate and target = 60 mm<br>Substrate temperature = 200° C. |
| (7) | Gate insulating film 102 | Substrate temperature: 450° C.<br>Gas flow: silane (2 sccm), nitrous oxide (800 sccm)<br>Pressure = 200 Pa<br>Electric power (RF) = 150 W (60 MHz) |

Next, an organic coating film was applied to have a thickness of 20 nm over the tungsten film.

Next, a resist was formed to have a thickness of 100 nm over the organic coating film. Next, a resist mask was formed through light exposure and development. Note that an electron beam exposure apparatus is used for the light exposure.

Next, the organic coating film and the tungsten film were etched using the resist mask as a mask, whereby a hard mask was formed. Then, the resist mask and the organic coating film were removed by ashing using oxygen plasma.

Next, the semiconductor layer 101b and the semiconductor layer 101a were etched using the hard mask as a mask. Etching was performed under the conditions where the substrate temperature was 70° C., $CF_4$ (16 sccm) and Ar (32 sccm) were used as the etching gas; the bias power was 50 W; the ICP power source was 600 W, the pressure was 3.0 Pa, and the etching treatment time was 3 seconds; then the pressure was reduced to 1.0 Pa.

Next, the tungsten film was processed to form the conductive layer 104a and the conductive layer 104b.

Next, a third semiconductor film to be the semiconductor layer 101c was formed over the conductive layer 104a and the conductive layer 104b. As the third semiconductor film, a 5-nm-thick In—Ga—Zn oxide film was formed by a sputtering method using a polycrystalline In—Ga—Zn based oxide target having an atomic ratio of In:Ga:Zn=1:3:2. The detail of the deposition conditions is shown in (6) of Table 2.

Next, a 10-nm-thick silicon oxynitride film was deposited as the gate insulating film 102 by a PECVD method. The detail of the deposition condition is shown in (7) of Table 2. Next, as a conductive film to be the gate electrode 103, a 10-nm-thick titanium nitride film and a 30-nm-thick tungsten film were formed in this order. As the detail of the deposition conditions, (8) of Table 3 shows the condition of titanium nitride, and (9) of the Table 3 shows the condition of tungsten. Next, the conductive film was processed to form the gate electrode 103.

TABLE 3

| | | |
|---|---|---|
| (8) | Gate electrode 103 (titanium nitride) | Gas flow: nitrogen (50 sccm)<br>Pressure = 0.2 Pa<br>Electric power (DC) = 12 kW<br>Distance between substrate and target = 400 mm<br>Substrate temperature = room temperature |
| (9) | Gate electrode 103 (tungsten) | Gas flow: argon (100 sccm)<br>Pressure = 2.0 Pa<br>Electric power (DC) = 1 kW<br>Distance between substrate and target = 60 mm<br>Substrate temperature = approx. 130° C. |

Next, a resist mask was formed, and the gate insulating film 102 and the semiconductor layer 101c were processed by etching. The etching conditions were as follows. First etching was performed under the conditions where $CH_3$ at a flow rate of 56 sccm and He at a flow rate of 144 sccm were used as the etching gas, the bias power was 425 W, the power of ICP power source was 25 W, and the pressure was 7.5 Pa. Then, second etching was performed under the conditions where $CH_4$ at a flow rate of 16 sccm and Ar at a flow rate of 32 sccm were used as the etching gas, the bias power was 50 W, and the power of ICP power source was 600 W. Subsequently, third etching was performed under the conditions where $CH_4$ at a flow rate of 16 sccm and Ar at a flow rate of 32 sccm were used as the etching gas, the bias power was 50 W, the power of ICP power source was 600 W, and the pressure was 1.0 Pa.

Then, a 40-nm-thick aluminum oxide film was formed as the insulating film 112. The aluminum oxide film was formed by a sputtering method. As the insulating film 113, a 150-nm-thick silicon oxynitride film was formed.

Next, a resist mask was formed, and the insulating film 112 and the insulating film 113 were processed by etching to form opening portions reaching the conductive layer 104a and the conductive layer 104b.

Next, in the opening portions and over the insulating film 113, a conductive film in which a 50-nm-thick titanium film, a 200-nm-thick aluminum film, and a 50-nm-thick titanium film were stacked in this order was formed by a sputtering method. Next, the shapes of the conductive film in the opening portions and over the insulating film 113 was processed by etching to form wirings.

Then, a 1.6-μm-thick polyimide film was formed by a coating method, and then heat treatment was performed at 300° C. under an air atmosphere for approximately one hour.

Through the above steps, the transistor was fabricated.

[Transistor Characteristics]

Characteristics of the fabricated transistor are described below.

Figure 30A:
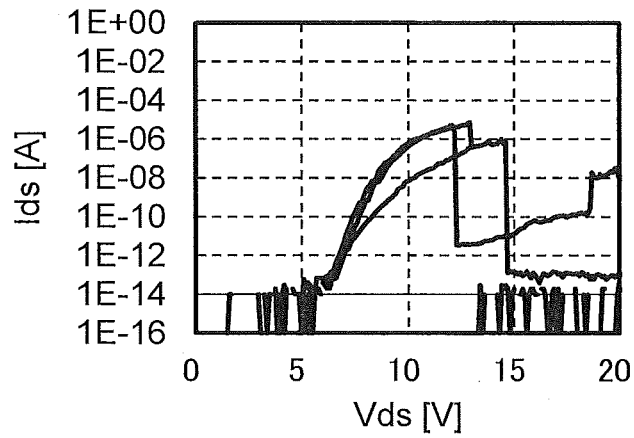
FIGS. 30A to 30C show transistor characteristics.
Figure 30B:
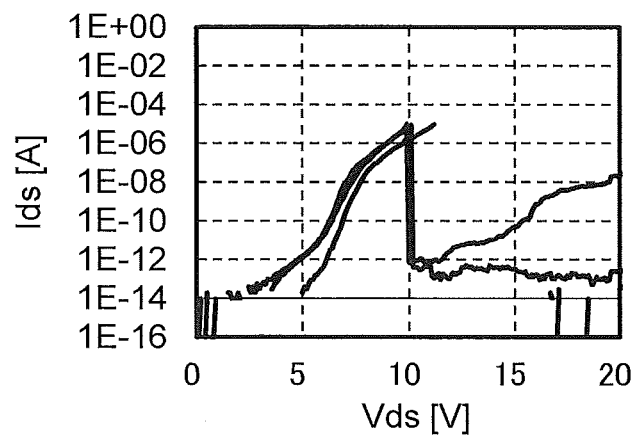
Figure 30C:
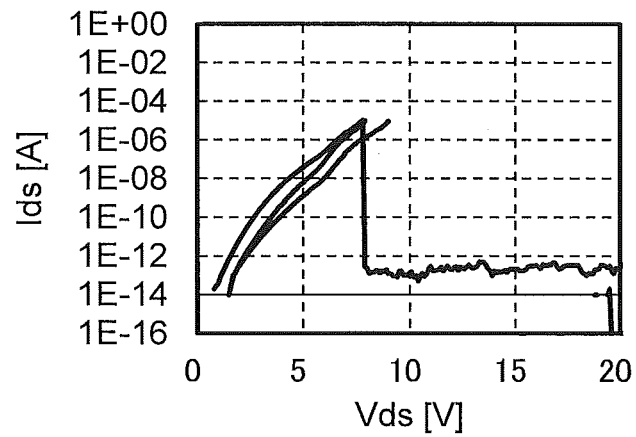
Figure 31A:
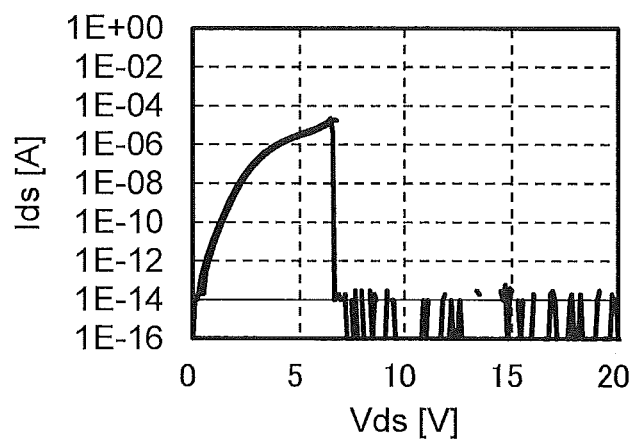
FIGS. 31A and 31B show transistor characteristics.
Figure 31B:
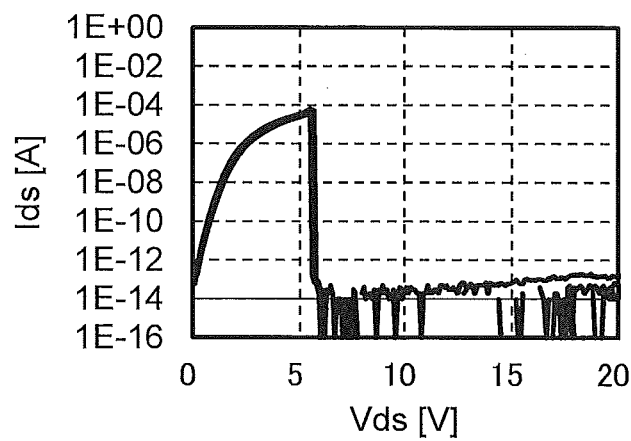

FIGS. 30A to 30C and FIGS. 31A and 31B show Id-Vd characteristics of transistors each having a channel length L of 58 nm. A gate-source voltage (hereinafter referred to as $V_{gs}$) was 0 V. FIGS. 30A, 30B and 30C show the characteristics of the transistors having a channel width W of 45 nm, those of the transistors each having a channel width W of 65 nm, and those of the transistors each having a channel width W of 105 nm, respectively. FIGS. 31A and 31B show the characteristics of the transistor having a channel width W of 205 nm, and those of the transistor having a channel width W of 505 nm, respectively. The transistor having a small channel width W such as the transistor having a channel width W of less than or equal to 65 nm has a high resistance. For example, when $V_{ds}$ was less than or equal to 6 V in the transistor of the channel width W of 65 nm, current between the drain and the source (hereinafter referred to as Ids) was $1.70 \times 10^{-11}$ A and a resistance value R×W normalized on the channel width was $6 \div \{(1.7 \times 10^{-11}) \div (60 \times 10^{-9})\} = 2.12 \times 10^4 \Omega \cdot m$ when $V_{ds}$ was 6V. In contrast, the transistor having a large channel width W such as the transistor having a channel width W of greater than or equal to 105 nm has a low resistance. For example, in the transistor having the channel width 205 nm, $I_{ds}$ was $1.51 \times 10^{-7}$ A, and R×W was $3 \div \{(1.51 \times 10^{-7}) \div (200 \times 10^{-9})\} = 3.97 \Omega \cdot m$ when $V_{ds}$ was 3V.

Figure 32A:
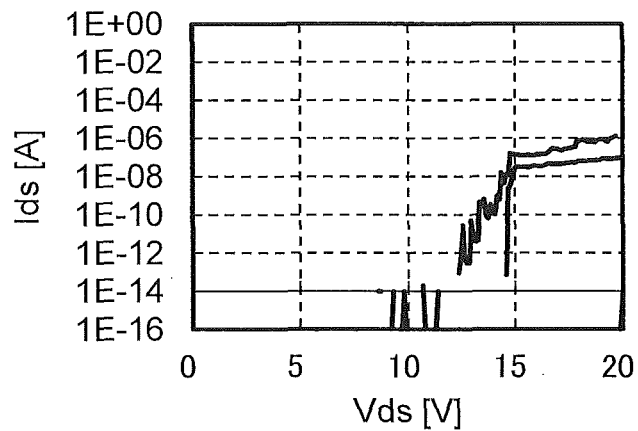
FIGS. 32A to 32C show transistor characteristics.
Figure 32B:
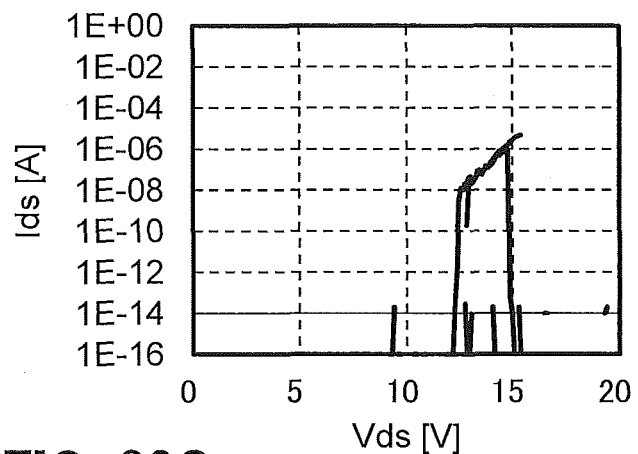
Figure 32C:
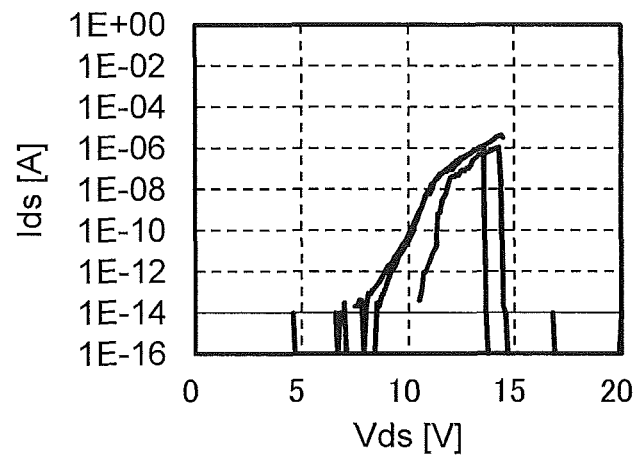
Figure 33A:
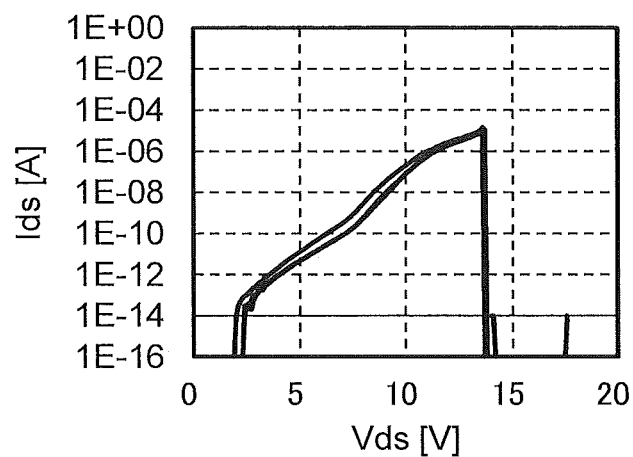
FIGS. 33A and 33B show transistor characteristics.
Figure 33B:
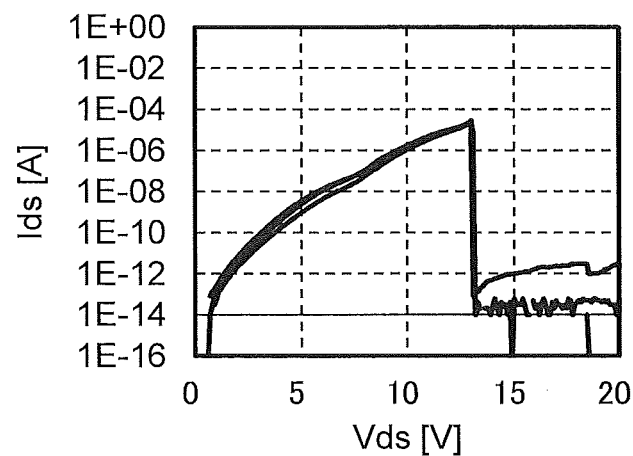

FIGS. 32A to 32C and FIGS. 33A and 33B show $I_d$-$V_d$ characteristics of transistors each having a channel length L of 118 nm. $V_{gs}$ was set to 0V. FIGS. 32A, 32B and 32C show the characteristics of the transistors each having a channel width W of 45 nm, those of the transistors each having a channel width W of 65 nm, and those of the transistors each having a channel width W of 105 nm, respectively. FIGS. 33A and 33B show the characteristics of the transistors each having a channel width W of 204 nm, and those of the transistors each having a channel width W of 505 nm, respectively. As illustrated in FIGS. 32A to 32C, the transistors each having a channel width W of less than or equal to 105 nm has a high resistance when $V_{ds}$ was less than or equal to 10V. For example, when $V_{ds}$ was 10V in the transistor of the channel width 105 nm, $I_{ds}$ was 3.38×10−11 A, and a resistance value R×W normalized on the channel width is $10 \div \{(3.38 \times 10^{-11}) \div (100 \times 10^{-9})\} = 2.96 \times 10^4 \Omega \cdot m$. In a region where $V_{ds}$ was less than or equal to 3V in the transistor having a channel width W of greater than or equal to 505 nm, the value of R×W was $10^3$ times to $10^5$ times as high as that of the transistor of L=40 nm. For example, when $V_{ds}$ was 3 V in the transistor having a channel width of 505 nm, $I_{ds}$ is $2.17 \times 10^{-11}$ A, and R×W was $3 \div \{(2.17 \times 10^{-11}) \div (500 \times 10^{-9})\} = 6.91 \times 10^4 \Omega \cdot m$. In addition, when $V_{ds}$ was 6V, a low resistance value such as $I_{ds}$ of $4.31 \times 10^{-9}$ A, and R×W of $6.96 \times 10^2 \Omega \cdot m$ was obtained.

Figure 34A:
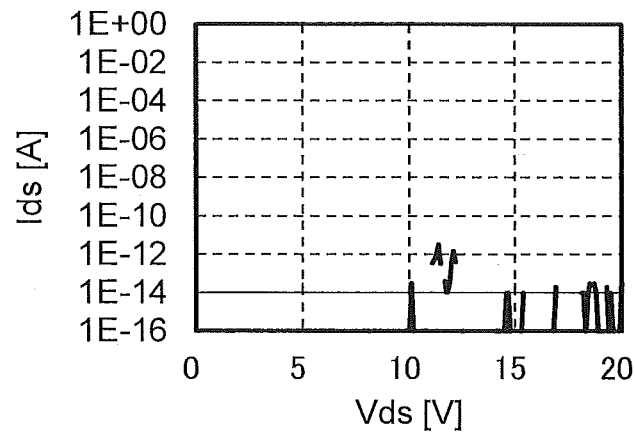
FIGS. 34A to 34C show transistor characteristics.
Figure 34B:
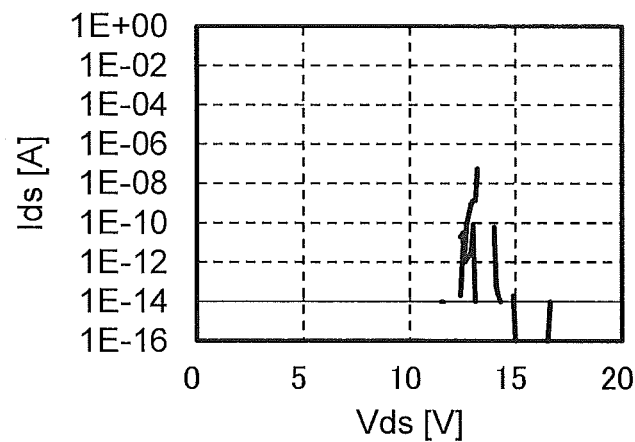
Figure 34C:
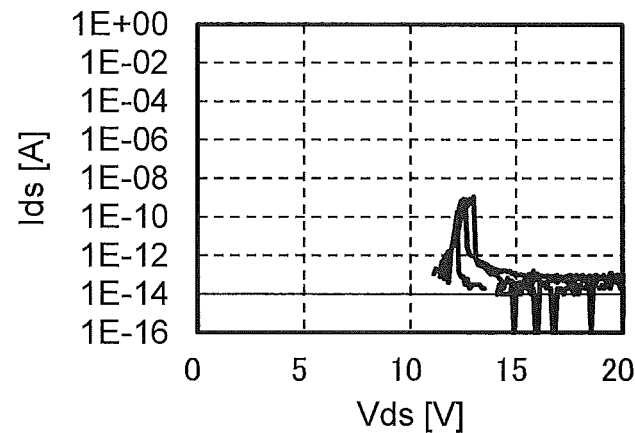

FIGS. 34A to 34C show $I_d$-$V_d$ characteristics of a transistor having a channel length L of 518 nm. $V_{gs}$ was set to 0 V. FIGS. 34A, 34B, and 34C show characteristics of the transistors each having a channel width W of 45 nm, those of the transistors each having a channel width W of 65 nm, and those of the transistors each having a channel width W of 505 nm, respectively. It is found that $I_{ds}$ obtained in each of the channel widths is small, and a region of $V_{ds} \leq 20$ V has a high resistance.

Figure 35A:
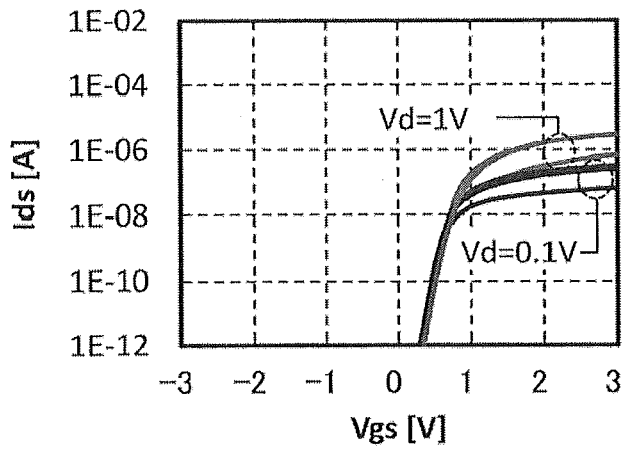
FIGS. 35A to 35C show transistor characteristics.
Figure 35B:
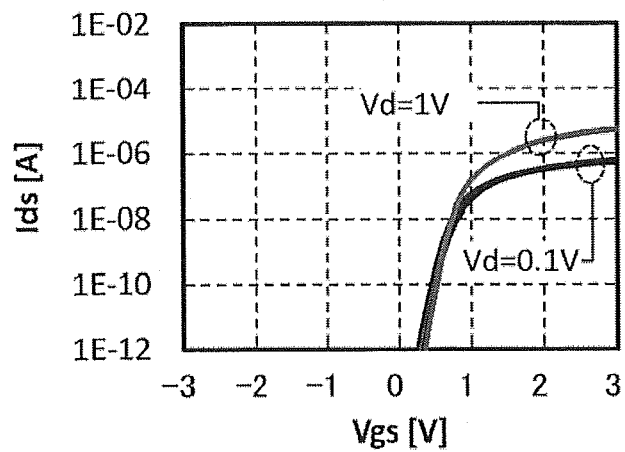
Figure 35C:
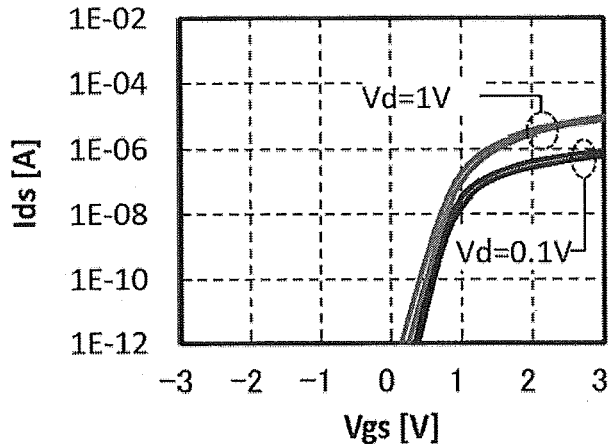
Figure 36A:
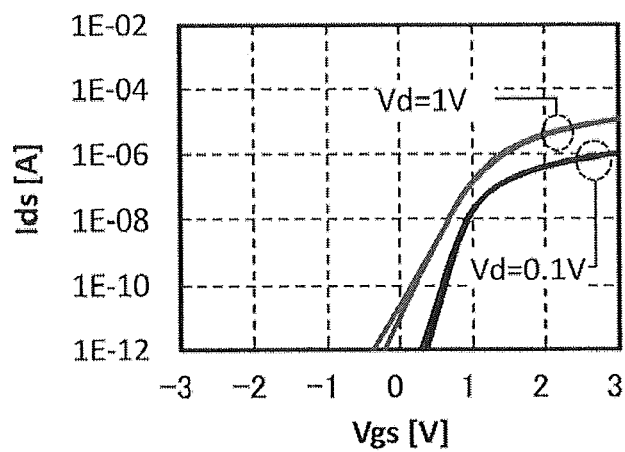
FIGS. 36A and 36B show transistor characteristics.
Figure 36B:
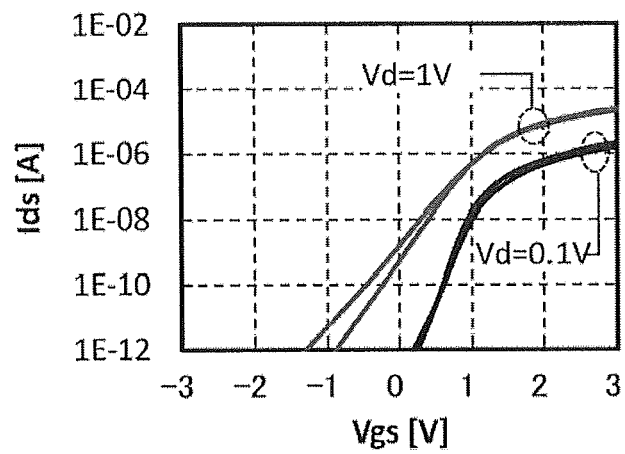

FIGS. 35A to 35C and FIGS. 36A and 36B show Id-Vg characteristics of transistors each having a channel length L of 58 inn. A drain-source voltage (hereinafter referred to as $V_{ds}$) was set to 0.1 V and 1 V. FIGS. 35A, 35B and 35C show the characteristics of the transistors each having a channel width W of 45 nm, those of the transistors each having a channel width W of 65 nm, and those of the transistors each having a channel width W of 105 nm, respectively. FIGS. 36A and 36B show the characteristics of the transistor having a channel width W of 205 nm, and those of the transistor having a channel width W of 505 nm, respectively. It is found that $I_{ds}$ is low when $V_{gs}$ is less than or equal to 0V in the transistor having a channel width W of less than or equal to 65 nm, so that favorable transistor characteristics are obtained. In a transistor having a channel width W of greater than or equal to 200 nm, $I_{ds}$ was relatively high when $V_{ds}$ was 1 V and $V_{gs}$ was 0 V. Note that three transistors were measured with respective conditions in FIGS. 30A to 36B.

As described in Embodiment 2, the protection circuit 401 includes the first transistor and the second transistor. In addition, in the first transistor, the gate electric field is preferably weakened appropriately, so that the first transistor can be used for the discharge path when a high voltage accompanied with ESD is applied. In the second transistor, the gate electric field is preferably strengthened, whereby the second transistor serves as an element which has a high resistance when a high voltage accompanied with ESD is applied, and thus prevents current from flowing into the integrated circuit 400.

In view of the above, as the first transistor included in the protection circuit 401 described in Embodiment 2, e.g., a transistor having a cross-sectional structure illustrated in FIGS. 18A to 18D where a channel length L is 58 nm and a channel width W is 205 nm, may be used. Alternatively, for example, a transistor where a channel length L is 118 nm, and a channel width W is greater than or equal to 505 nm may be used. Alternatively, for example, a transistor whose W/L, i.e., a value obtained by dividing the channel length by the channel width is three or more may be used.

In view of the above, as the second transistor included in the protection circuit 401 described in Embodiment 2, e.g., a transistor having a cross-sectional structure illustrated in FIGS. 18A to 18D where a channel length L is 58 nm and a channel width W is 65 nm, may be used. Alternatively, for example, a transistor where a channel length L is 118 nm, and a channel width W is less than or equal to 105 nm may be used. Alternatively, it is preferable to use a transistor where a channel length L is 518 nm, and a channel width W is 1 μm. Alternatively, for example, a transistor whose W/L, a value obtained by dividing the channel length by the channel width is two or less, preferably 1.5 or less may be used.

This application is based on Japanese Patent Application serial no. 2014-113036 filed with Japan Patent Office on May 30, 2014, the entire contents of which are hereby incorporated by reference.

What is claimed is:

1. A semiconductor device comprising:
   a first circuit;
   a second circuit;
   a first wiring;

a second wiring;
a third wiring; and
a fourth wiring;
wherein the first circuit includes a plurality of transistors,
wherein the second circuit has a function of protecting the first circuit,
wherein the second circuit comprises:
  a first transistor,
  a first diode,
  a second diode, and
  a fourth transistor,
wherein the first wiring is electrically connected to the first circuit via the second circuit,
wherein the first wiring is has a function of inputting a signal,
wherein the second wiring is electrically connected to the first circuit,
wherein the second wiring is electrically connected to one of a source electrode and a drain electrode of the first transistor,
wherein the third wiring is electrically connected to a gate electrode of the first transistor,
wherein the fourth wiring is electrically connected to the other of the source electrode and the drain electrode of the first transistor,
wherein the first transistor includes an oxide semiconductor film, and
wherein the fourth transistor has a lower off current than the first transistor.

2. A semiconductor device according to claim 1,
wherein the first wiring is electrically connected to the first circuit via the fourth transistor,
wherein the first wiring is electrically connected to the second wiring via the first diode, and
wherein the first wiring is connected to the fourth wiring via the second diode.

3. A semiconductor device according to claim 1,
wherein the semiconductor device is configured so that the fourth transistor is turned on when the first circuit is operated and off when the first circuit is not operated.

4. A semiconductor device according to claim 1,
wherein the semiconductor device is configured so that the fourth transistor is turned on when the first circuit is operated and off when the first circuit is not operated, and
wherein the semiconductor device is configured so that the first transistor is turned off when the first circuit is operated and on when the first circuit is not operated.

5. A semiconductor device according to claim 1,
wherein the semiconductor device is configured so that the fourth transistor is turned on when the first circuit is operated and off when the first circuit is not operated, and
wherein the fourth transistor has higher resistance than the first transistor when no signal is input to the gate electrode of the first transistor and to a gate electrode of the fourth transistor.

6. A semiconductor device according to claim 1,
wherein the semiconductor device is configured so that the fourth transistor is turned on when the first circuit is operated and off when the first circuit is not operated, and
wherein a channel width of the fourth transistor is smaller than a channel width of the first transistor.

7. A semiconductor device comprising:
a first circuit;
a second circuit;
a first wiring;
a second wiring;
a third wiring; and
a fourth wiring,
wherein the first circuit includes a plurality of transistors,
wherein the second circuit has a function of protecting the first circuit,
wherein the second circuit includes a first transistor, a second transistor, a third transistor, and a fourth transistor,
wherein the first wiring is electrically connected to the first circuit through the second circuit,
wherein the first wiring has a function of inputting a signal,
wherein the second wiring is electrically connected to the first circuit,
wherein the third wiring is electrically connected to a gate electrode of the first transistor included in the second circuit,
wherein one of a source electrode and a drain electrode of the first transistor is electrically connected to the second wiring,
wherein the other of the source electrode and the drain electrode of the first transistor is electrically connected to the fourth wiring,
wherein one of a source electrode and a drain electrode of the second transistor is electrically connected to the second wiring,
wherein the other of the source electrode and the drain electrode of the second transistor is electrically connected to the first wiring,
wherein one of a source electrode and a drain electrode of the third transistor is electrically connected to the first wiring,
wherein the other of the source electrode and the drain electrode of the third transistor is electrically connected to the fourth wiring,
wherein one of a source electrode and a drain electrode of the fourth transistor is electrically connected to the first wiring,
wherein the other of the source electrode and the drain electrode of the fourth transistor is electrically connected to the first circuit,
wherein the first to the fourth transistors each include an oxide semiconductor film, and
wherein the fourth transistor has a lower off current than the first to the third transistors.

8. A semiconductor device according to claim 7,
wherein the fourth transistor has higher resistance than the first to the third transistors when a signal is not input to a gate electrode of each of the first to fourth transistors.

9. A semiconductor device according to claim 7,
wherein the first wiring is a signal line for inputting a signal into the first circuit,
wherein the second wiring is a high potential power supply line,
wherein the fourth wiring is a low-potential power supply line or a ground potential line.

10. A semiconductor device according to claim 7,
wherein the first to the third transistors each comprise:
  a plurality of island-shaped oxide semiconductor regions;
  a first gate insulating film; and
  a first gate electrode;
wherein, for each of the first to the third transistors, side surfaces and top surfaces of the plurality of island-shaped oxide semiconductor layers are covered with the first gate insulating film, wherein, for each of the first to the third transistors, the first gate electrode faces each of the side surfaces and the top surfaces of the plurality of island-shaped oxide semiconductor layers.

11. A semiconductor device according to claim 10, wherein the island-shaped semiconductor layers included in the first to the third transistors comprise:
  a first oxide layer;
  a second oxide layer in contact with at least part of a top surface of the first oxide layer; and
  a third oxide layer in contact with at least part of a top surface of the second oxide layer, wherein electron affinity of the second oxide layer is larger than electron affinities of the first oxide layer and the third oxide layer.

12. An electronic device comprising the semiconductor device according to claim 7, and further comprising a housing, a microphone, a speaker, an operation key, or a lens.

13. A semiconductor device according to claim 7, wherein the fourth wiring is electrically connected to the first circuit.

14. A semiconductor device according to claim 7, wherein a gate electrode of the second transistor and a gate electrode of the third transistor are electrically connected to the gate electrode of the first transistor.

15. A semiconductor device according to claim 7, wherein the semiconductor device is configured so that the first transistor is turned off when the first circuit is operated.

16. A semiconductor device according to claim 7, wherein the semiconductor device is configured so that the first transistor is turned off when the first circuit is operated, and wherein the semiconductor device is configured so that the fourth transistor is turned on when the first circuit is operated.

* * * * *